US012657500B2

(12) United States Patent
Bonderson et al.

(10) Patent No.: US 12,657,500 B2
(45) Date of Patent: Jun. 16, 2026

(54) JOINT PARITY MEASUREMENTS OF MAJORANA ZERO MODES IN THE PRESENCE OF QUASIPARTICLE POISONING

(71) Applicant: Microsoft Technology Licensing, LLC, Redmond, WA (US)

(72) Inventors: Parsa Bonderson, Santa Barbara, CA (US); David Alexander Aasen, Santa Barbara, CA (US); Christina Paulsen Knapp, Goleta, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 521 days.

(21) Appl. No.: 18/313,229

(22) Filed: May 5, 2023

(65) Prior Publication Data

US 2024/0378477 A1    Nov. 14, 2024

(51) Int. Cl.
*G06N 10/40* (2022.01)
*G01R 27/26* (2006.01)

(52) U.S. Cl.
CPC ......... *G06N 10/40* (2022.01); *G01R 27/2605* (2013.01)

(58) Field of Classification Search
CPC ............................ G06N 10/40; G01R 27/2605
See application file for complete search history.

(56) References Cited

U.S. PATENT DOCUMENTS

2017/0091649 A1* 3/2017 Clarke ..................... G06F 15/82

FOREIGN PATENT DOCUMENTS

WO    WO-2018035361 A1 * 2/2018 ............. G06N 10/70

OTHER PUBLICATIONS

Khindanov, et al., "Visibility of noisy quantum dot-based measurements of Majorana qubits", SciPost Physics, vol. 10, Issue No. 06, Jun. 2, 2021, 25 Pages (Year: 2021).*
International Search Report and Written Opinion, received for PCT Application No. PCT/US2024/027808, mailed on Sep. 26, 2025, 20 pages.

(Continued)

*Primary Examiner* — Catherine T. Rastovski
*Assistant Examiner* — Nyla Gavia
(74) *Attorney, Agent, or Firm* — Alleman Hall LLP

(57) ABSTRACT

A computing system including a quantum computing device. The quantum computing device includes Majorana islands, quantum dots, and capacitance sensors. The computing system further includes a controller configured to, for an island-dot system including one or more Majorana islands and one or more quantum dots, control the quantum computing device to perform a joint parity measurement of two or more MZMs. Performing the joint parity measurement includes, at each of a plurality of candidate resonance regions corresponding to values of a change in a fermion number, setting Majorana island gate voltages and quantum dot gate voltages to respective candidate resonance values. The joint parity measurement further includes, at each of the candidate resonance regions, via a capacitance sensor, detecting a microwave response signal measured at the island-dot system. The joint parity measurement further includes outputting a joint parity value based at least in part on the microwave response signal.

18 Claims, 33 Drawing Sheets

(56)     References Cited

OTHER PUBLICATIONS

Khindanov, et al., "Visibility of noisy quantum dot-based measurements of Majorana qubits", SciPost Physics, vol. 10, Issue No. 06, Jun. 2, 2021, 25 Pages.
Karzig, et al., "Scalable Designs for Quasiparticle-Poisoning-Protected Topological Quantum Computation with Majorana Zero Modes", In Repository of arXiv:1610.05289v4, Jun. 21, 2017, 34 Pages.

* cited by examiner

JOINT PARITY MEASUREMENT 32: COUPLE MZMS VIA QDS
AND MEASURE CAPACITANCE

DECOUPLE MZMS FROM QDS

TO FIG. 4B

FROM FIG. 4A

QPP DETECTION 36: COUPLE MZMS VIA QDS AND MEASURE
CAPACITANCE

DECOUPLE MZMS FROM QDS

TO FIG. 13C

FROM FIG. 13B

TO FIG. 13D

FROM FIG. 13C

Figure 14A:
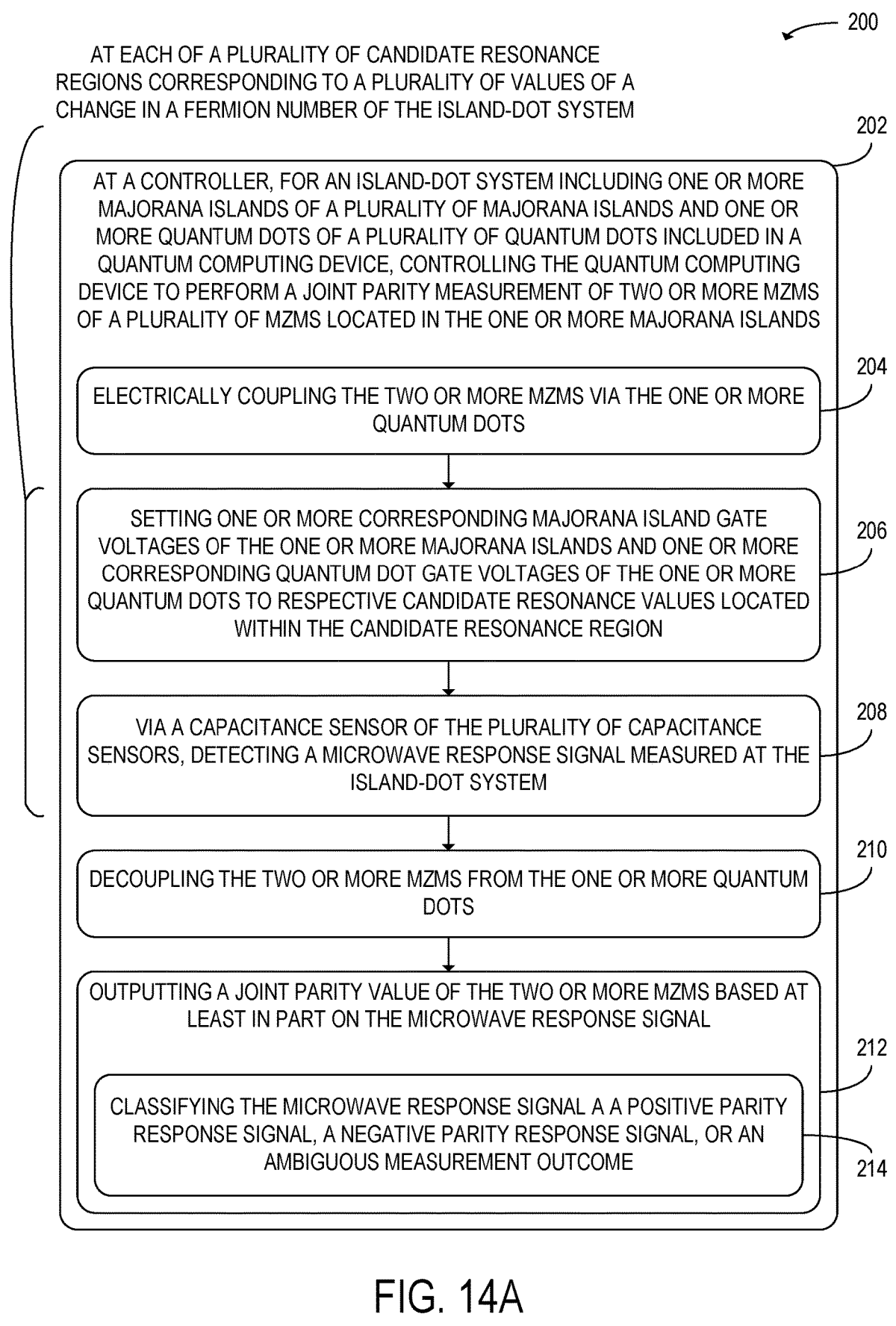

200

AT EACH OF A PLURALITY OF CANDIDATE RESONANCE
REGIONS CORRESPONDING TO A PLURALITY OF VALUES OF A
CHANGE IN A FERMION NUMBER OF THE ISLAND-DOT SYSTEM

202

AT A CONTROLLER, FOR AN ISLAND-DOT SYSTEM INCLUDING ONE OR MORE
MAJORANA ISLANDS OF A PLURALITY OF MAJORANA ISLANDS AND ONE OR
MORE QUANTUM DOTS OF A PLURALITY OF QUANTUM DOTS INCLUDED IN A
QUANTUM COMPUTING DEVICE, CONTROLLING THE QUANTUM COMPUTING
DEVICE TO PERFORM A JOINT PARITY MEASUREMENT OF TWO OR MORE MZMS
OF A PLURALITY OF MZMS LOCATED IN THE ONE OR MORE MAJORANA ISLANDS

204

ELECTRICALLY COUPLING THE TWO OR MORE MZMS VIA THE ONE OR MORE
QUANTUM DOTS

206

SETTING ONE OR MORE CORRESPONDING MAJORANA ISLAND GATE
VOLTAGES OF THE ONE OR MORE MAJORANA ISLANDS AND ONE OR MORE
CORRESPONDING QUANTUM DOT GATE VOLTAGES OF THE ONE OR MORE
QUANTUM DOTS TO RESPECTIVE CANDIDATE RESONANCE VALUES LOCATED
WITHIN THE CANDIDATE RESONANCE REGION

208

VIA A CAPACITANCE SENSOR OF THE PLURALITY OF CAPACITANCE
SENSORS, DETECTING A MICROWAVE RESPONSE SIGNAL MEASURED AT THE
ISLAND-DOT SYSTEM

210

DECOUPLING THE TWO OR MORE MZMS FROM THE ONE OR MORE QUANTUM
DOTS

OUTPUTTING A JOINT PARITY VALUE OF THE TWO OR MORE MZMS BASED AT
LEAST IN PART ON THE MICROWAVE RESPONSE SIGNAL

212

CLASSIFYING THE MICROWAVE RESPONSE SIGNAL A A POSITIVE PARITY
RESPONSE SIGNAL, A NEGATIVE PARITY RESPONSE SIGNAL, OR AN
AMBIGUOUS MEASUREMENT OUTCOME

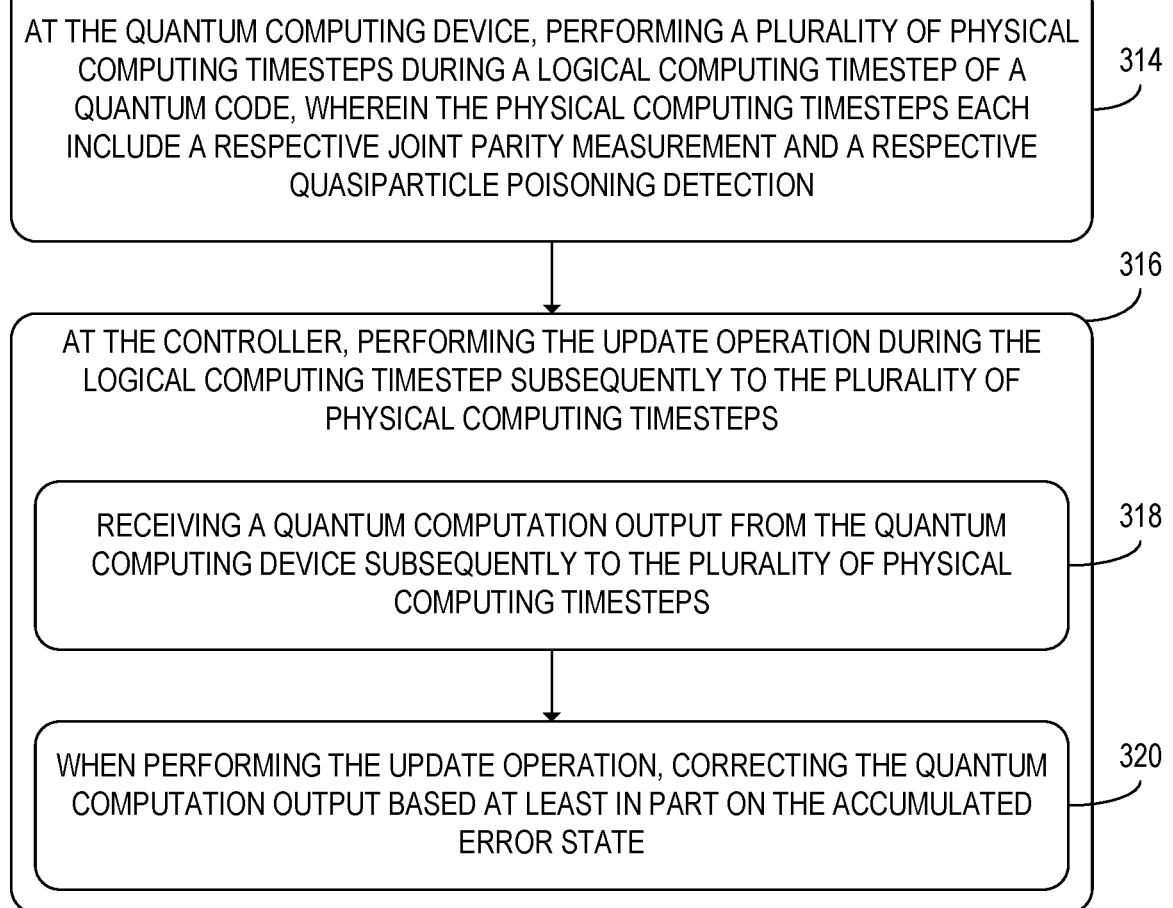

AT THE QUANTUM COMPUTING DEVICE, PERFORMING A PLURALITY OF PHYSICAL COMPUTING TIMESTEPS DURING A LOGICAL COMPUTING TIMESTEP OF A QUANTUM CODE, WHEREIN THE PHYSICAL COMPUTING TIMESTEPS EACH INCLUDE A RESPECTIVE JOINT PARITY MEASUREMENT AND A RESPECTIVE QUASIPARTICLE POISONING DETECTION
314

AT THE CONTROLLER, PERFORMING THE UPDATE OPERATION DURING THE LOGICAL COMPUTING TIMESTEP SUBSEQUENTLY TO THE PLURALITY OF PHYSICAL COMPUTING TIMESTEPS
316

RECEIVING A QUANTUM COMPUTATION OUTPUT FROM THE QUANTUM COMPUTING DEVICE SUBSEQUENTLY TO THE PLURALITY OF PHYSICAL COMPUTING TIMESTEPS
318

WHEN PERFORMING THE UPDATE OPERATION, CORRECTING THE QUANTUM COMPUTATION OUTPUT BASED AT LEAST IN PART ON THE ACCUMULATED ERROR STATE
320

FIG. 15B

AT THE CONTROLLER

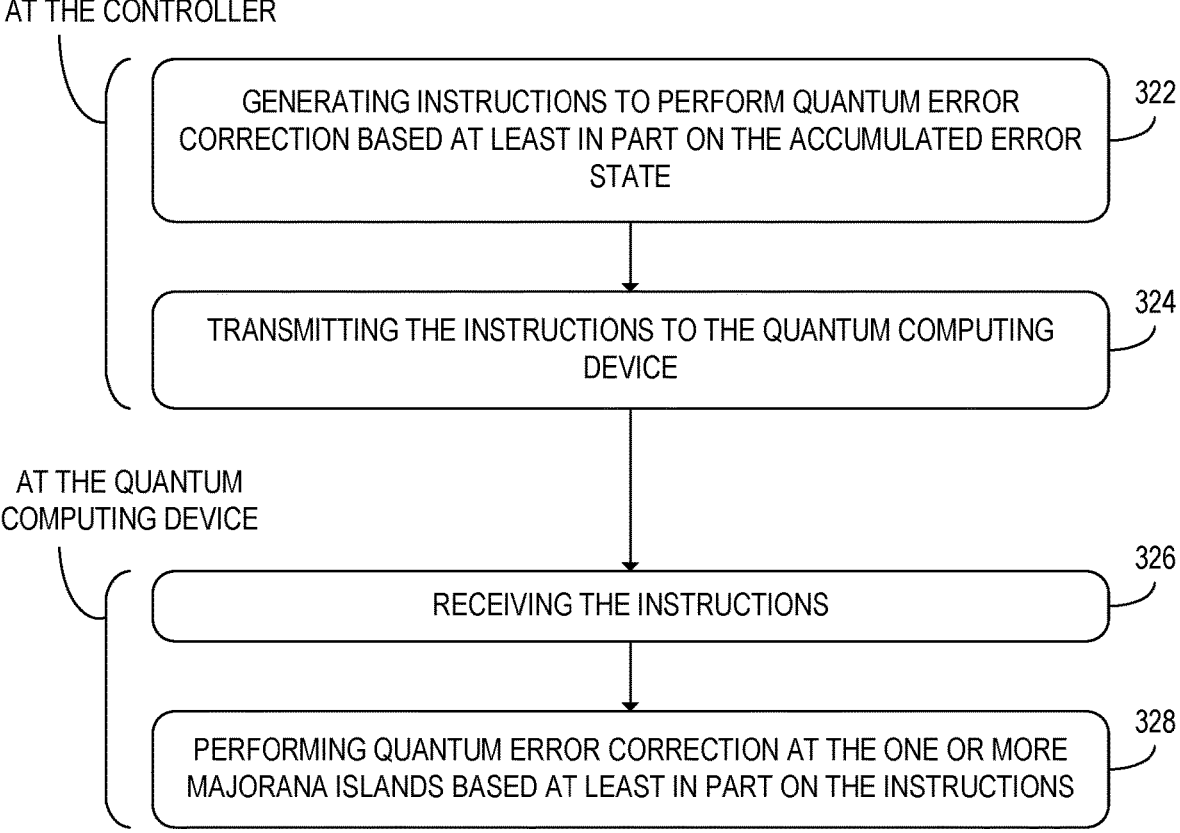

GENERATING INSTRUCTIONS TO PERFORM QUANTUM ERROR CORRECTION BASED AT LEAST IN PART ON THE ACCUMULATED ERROR STATE — 322

TRANSMITTING THE INSTRUCTIONS TO THE QUANTUM COMPUTING DEVICE — 324

AT THE QUANTUM COMPUTING DEVICE

RECEIVING THE INSTRUCTIONS — 326

PERFORMING QUANTUM ERROR CORRECTION AT THE ONE OR MORE MAJORANA ISLANDS BASED AT LEAST IN PART ON THE INSTRUCTIONS — 328

FIG. 15C

JOINT PARITY MEASUREMENTS OF MAJORANA ZERO MODES IN THE PRESENCE OF QUASIPARTICLE POISONING

BACKGROUND

Majorana-based quantum computing is an approach to quantum computing that utilizes Majorana zero modes (MZMs). The MZMs are instantiated at floating superconducting regions of a quantum computing device. When two or more MZMs are formed at a floating superconducting region, that superconducting region is known as a Majorana island. The parities of the MZMs included in the Majorana island may be used to store qubits and classical bits that are used in quantum computations.

SUMMARY

According to one aspect of the present disclosure, a computing system is provided, including a quantum computing device. The quantum computing device includes a plurality of Majorana islands at which a plurality of Majorana zero modes (MZMs) are instantiated. The quantum computing device further includes a plurality of quantum dots located proximate to the plurality of Majorana islands. The quantum computing device further includes a plurality of capacitance sensors. The computing system further includes a controller configured to, for an island-dot system including one or more Majorana islands of the plurality of Majorana islands and one or more quantum dots of the plurality of quantum dots, control the quantum computing device to perform a joint parity measurement of two or more MZMs of the plurality of MZMs located in the one or more Majorana islands. Performing the joint parity measurement includes, at each of a plurality of candidate resonance regions corresponding to a plurality of values of a change in a fermion number of the island-dot system, setting one or more corresponding Majorana island gate voltages of the one or more Majorana islands and one or more corresponding quantum dot gate voltages of the one or more quantum dots to respective candidate resonance values located within the candidate resonance region. Performing the joint parity measurement further includes, at each of the plurality of candidate resonance regions, via a capacitance sensor of the plurality of capacitance sensors, detecting a microwave response signal measured at the island-dot system. Performing the joint parity measurement further includes outputting a joint parity value of the two or more MZMs based at least in part on the microwave response signal.

According to another aspect of the present disclosure, a computing system is provided, including a quantum computing device. The quantum computing device includes a plurality of Majorana islands at which a plurality of Majorana zero modes (MZMs) are instantiated. The computing system further includes a controller configured to control the quantum computing device to perform a joint parity measurement at two or more MZMs of the plurality of MZMs. The two or more MZMs are located in one or more Majorana islands of the plurality of Majorana islands. The controller is further configured to control the quantum computing device to perform quasiparticle poisoning (QPP) detection at the one or more Majorana islands to thereby generate error data. The error data includes one or more QPP indications associated with the one or more Majorana islands. The controller is further configured to receive the error data from the quantum computing device. The controller is further configured to update an accumulated error state of the one or more Majorana islands based at least in part on the error data. The controller is further configured to perform an update operation based at least in part on the accumulated error state.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 14A shows a flowchart of a method for use with a computing system that includes a quantum computing device and a controller in order to perform a joint parity measurement, according to the example of FIG. 1.

FIG. 15B shows additional steps of the method of FIG. 15A that may be performed in examples in which a plurality of physical computing timesteps are performed during a logical computing timestep.

FIG. 15C shows additional steps of the method of FIG. 15A that may be performed in examples in which a quantum-computing-device-side update operation is performed.

DETAILED DESCRIPTION

Figure 1:
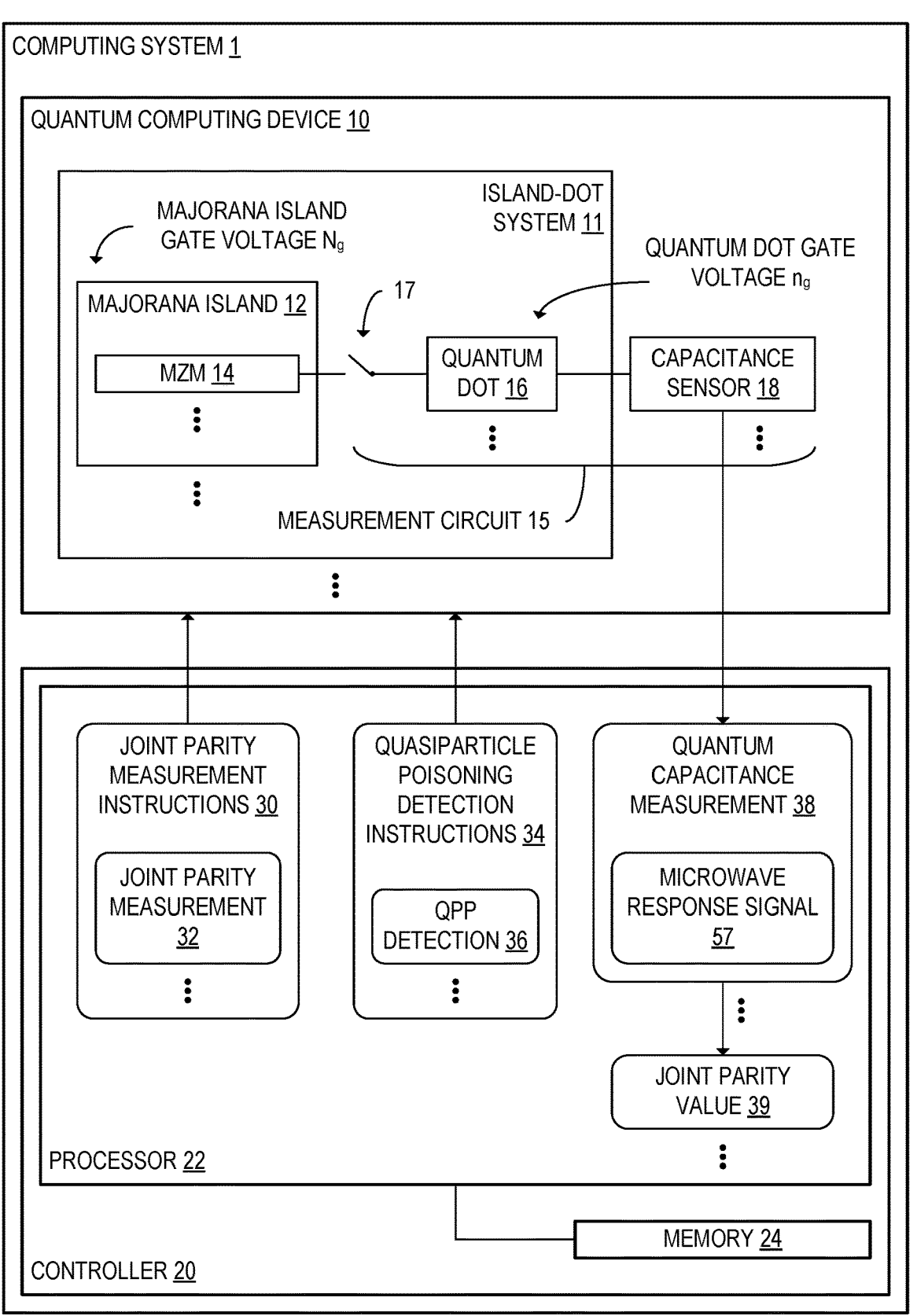
FIG. 1 schematically shows a computing system including a quantum computing device that includes a plurality of island-dot systems and a controller that includes a processor and memory, according to one example embodiment.

Each Majorana island included in a Majorana-based quantum computing device may be a coherent link that includes two MZMs, a tetron that includes four MZMs, or a hexon that includes six MZMs. A classical bit may be encoded at a coherent link, and a qubit may be encoded at a tetron or a hexon. The ground states of a Majorana island that includes 2n MZMs exhibits $2^{n-1}$-fold degeneracy, which allows quantum information to be stored in the ground states of the Majorana island. Measurement-based operations may be performed on a qubit instantiated at a Majorana-based quantum computing device to perform quantum computations. The measurement-based operations may be performed by coupling pairs of MZMs included in the same or different Majorana islands using quantum dots (QDs) adjacent to the Majorana islands. The pairs of MZMs, when coupled, define non-self-intersecting loops that allow coherent single-electron transport between the pairs. The total energy of the linked system of MZMs depends upon the collective fermion parity of the MZMs. This parity may be measured by connecting an MZM or a QD to a readout circuit.

Topological protection is a property of Majorana-based qubits that has prompted interest in using Majorana-based qubits in quantum computing platforms. Topological protection refers to the exponential suppression of errors as a function of the macroscopic energy ratios of a Majorana-based qubit system. This exponential suppression applies to three sources of errors that may occur at the Majorana island: residual energy splitting between MZMs; intrinsic quasiparticle poisoning of the Majorana island; and addition or removal of electrons to or from a Majorana island tuned to a Coulomb valley. The suppression of residual energy splitting is given by a factor of $e^{-L/\xi}$, where L is a distance separating the MZMs and $\xi$ is a topological correlation length. Intrinsic quasiparticle poisoning occurs when quasiparticles are excited above a superconducting gap $\Delta$ of the superconductor. The suppression of intrinsic quasiparticle poisoning is given by a factor of $e^{-\Delta/k_B T}$, where $k_B$ is the Boltzmann constant and T is temperature. The suppression of addition or removal of electrons is given by a factor of $e^{-E_c/k_B T}$, where $E_c$ is a charging energy. Thus, errors may be less likely to occur at Majorana-based qubits than at other types of qubits.

Quasiparticle poisoning (QPP) is discussed in additional detail below. QPP is a type of error that changes the fermion parity of the MZMs used to encode information in a Majorana island and may thereby produce errors in a quantum computation. There are three types of QPP that occur at Majorana-based quantum computing devices: intrinsic QPP, extrinsic QPP, and intercomponent QPP.

Intrinsic QPP is QPP that occurs when the fermion number of a Majorana island remains constant, but the state of the Majorana island is thermally excited above the superconducting gap. In a hard gap superconductor, intrinsic QPP occurs when an above-gap quasiparticle is excited from an MZM. This quasiparticle is typically absorbed by an MZM, resulting in a relaxation of the Majorana island back to the ground state subspace. The emitter MZM and the absorber MZM may be different MZMs. Thus, the ground state of the Majorana island may change when the quasiparticle is emitted and absorbed. This change in the ground state may lead to an error in a quantum computation due to the transfer of fermions between the emitter and absorber MZMs.

Extrinsic QPP is QPP that occurs when the Majorana island exchanges fermions with a fermion source outside the system of Majorana qubits and qubit-measurement components (QDs and coherent links). Extrinsic QPP may, for example, occur as a result of quasiparticle leakage from neighboring electrostatic gates or transport leads included in the quantum computing device. The lowest-energy process that changes the fermion number on the Majorana island is the absorption or emission of a fermion at the island via an MZM. Thus, quasiparticle leakage from components outside the system of Majorana qubits and measurement components typically affects the information encoded in a qubit, thereby resulting in an error in a quantum computation.

Intercomponent QPP occurs when a Majorana island exchanges one or more fermions with another component of the qubit system, which may be another Majorana island or a QD. Similar to extrinsic QPP, intercomponent QPP typically occurs when a fermion enters or leaves the Majorana island via an MZM. Accordingly, intercomponent QPP also typically results in an error. Intercomponent QPP may, for example, occur during a decoupling step of a measurement when a Majorana island is disconnected from one or more other components of the qubit system.

As discussed above, intercomponent QPP may be suppressed by increasing the charging energy $E_c$ of the Majorana island or lowering the temperature T. However, high ratios of $E_c/T$ may be difficult to reach. In addition, subsequently to intercomponent QPP occurring, the poisoning quasiparticle may have a high probability of moving to other Majorana islands during subsequent measurements, thereby resulting in correlated errors. This probability approaches $(n-1)/n$ for a measurement performed on n Majorana islands that have the same dimensions. In such an n-island measurement, the additional fermion has the same energy cost to move to each of the Majorana islands that are linked during the measurement. When the distribution of fermions across the linked Majorana islands is imbalanced, the fermions have a high probability of moving into a state that equalizes the fermion numbers of the Majorana islands. The charging energies of the QDs included in the qubit system are typically much higher than the charging energies of the Majorana islands. Thus, intercomponent QPP between Majorana islands is typically the highest-probability form of intercomponent QPP.

Using the devices and methods discussed below, correction for intercomponent QPP may be performed at a Majorana-based quantum computing device. FIG. 1 schematically shows a computing system 1 including a quantum computing device 10 and a controller 20. The quantum computing device 10 and the controller 20 are communicatively coupled such that the controller 20 is configured to receive inputs from, and transmit output instructions to, the quantum computing device 10. The controller 20 may, for example, be a classical computing device that includes a processor 22 and memory 24, as shown in the example of FIG. 1.

The quantum computing device 10 includes one or more island-dot systems 11. Each of the island-dot systems 11 includes a Majorana island 12 at which a plurality of Majorana zero modes (MZMs) 14 are instantiated. The Majorana island 12 may be a coherent link, a Majorana tetron, or a Majorana hexon. The island-dot system 11 further includes a measurement circuit 15, which includes a quantum dot 16 electrically connectable to an MZM 14 of the plurality of MZMs 14. In addition, the QD 16 is configured to be electrically connectable to another MZM 14 located in the same Majorana island 12 or another Majorana island 12. The Majorana island 12 and a QD 16 located proximate to the Majorana island 12 form the island-dot system 11. The quantum dot 16 may be coupled to and decoupled from the MZM 14 by closing and opening a switch 17 included in the measurement circuit 15.

The measurement circuit 15 further includes a capacitance sensor 18 capacitively coupled to the quantum dot 16. At the island-dot system 11, a Majorana island gate voltage $N_g$ and a quantum dot gate voltage $n_g$ are respectively applied to the Majorana island 12 and the quantum dot 16. Depending upon the values of the Majorana island gate voltage $N_g$ and the quantum dot gate voltage $n_g$, the capacitance sensor 18 measures different capacitance values for the island-dot system 11. The values obtained during capacitance measurements are used to detect QPP at the Majorana island 12, as discussed below. In addition, as discussed in further detail below, the capacitance sensor 18 is used to perform joint parity measurements when the corresponding QD 16 is electrically coupled to a plurality of MZMs 14.

The term "island-dot system," as used herein, refers to a system of one or more Majorana islands 12 and one or more QDs 16 at which a joint parity measurement 32 or a QPP detection 36 is performed, as discussed in further detail below. Island-dot systems 11 are formed by electrically coupling the one or more QDs 16 to the one or more Majorana islands 12. The one or more QDs 16 included in the island-dot system 11 may differ from one or more QDs 16 used to perform the joint fermion parity measurement in some examples. During different joint parity measurements 32 and QPP detections 36 performed at the quantum computing device 10, different combinations of Majorana islands 12 and QDs 16 selected from among the sets of Majorana islands 12 and QDs 16 included in the quantum computing device 10 may be used to form different island-dot systems 11 depending on the specific measurements that the controller 20 instructs the quantum computing device 10 to perform.

Figure 2:
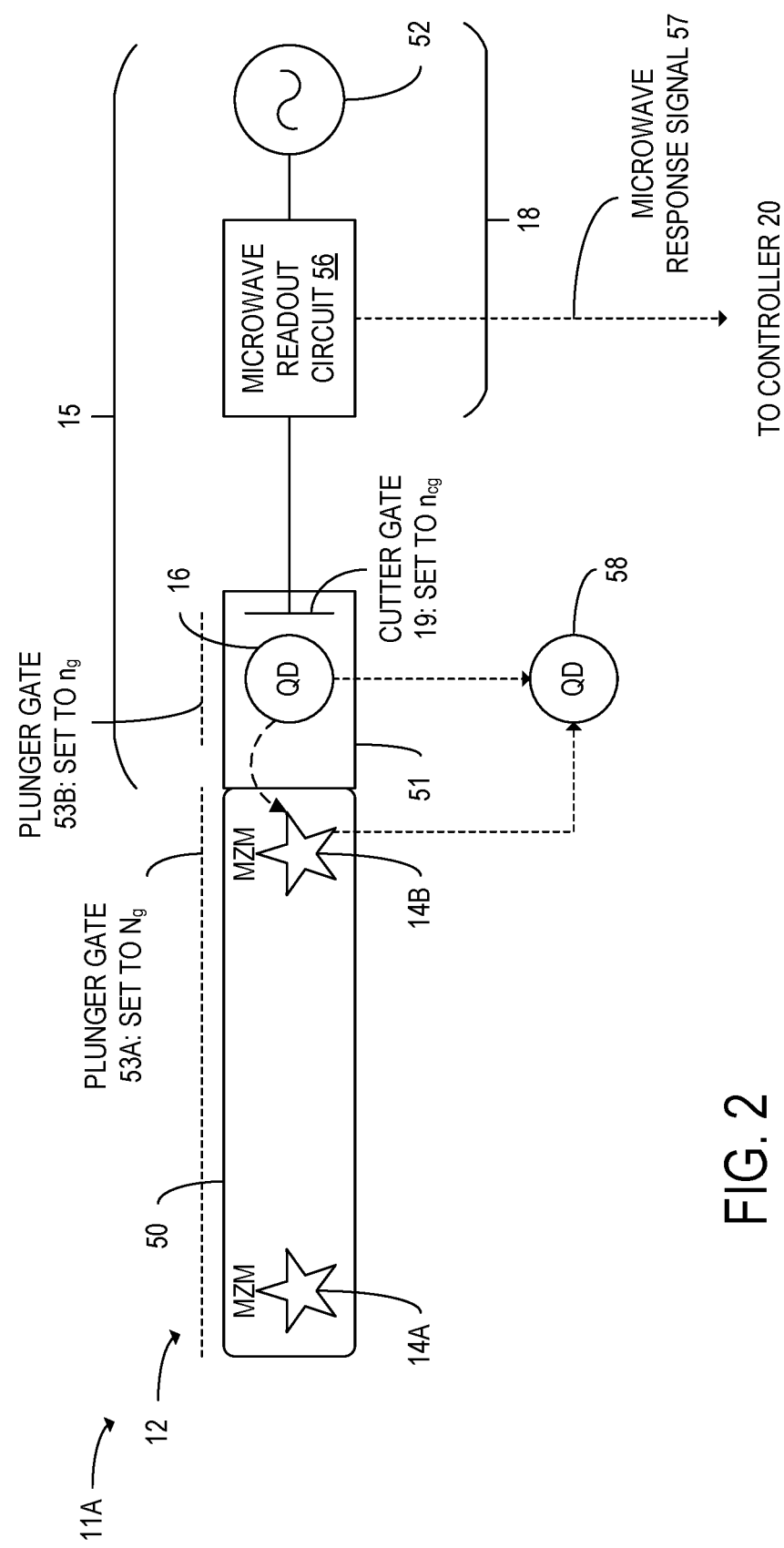
FIG. 2 shows an example configuration of the island-dot system in which a Majorana island included in the island-dot system is a coherent link, according to the example of FIG. 1.

FIG. 2 shows an example island-dot system 11A in which the Majorana island 12 is a coherent link. The coherent link includes a first MZM 14A and a second MZM 14B that form at respective ends of a topological superconducting nanowire 50. In the example of FIG. 2, the QD 16 is electrically connectable to the second MZM 14B. The QD 16 is located within a semiconductor 51. The capacitance sensor 18 in the example of FIG. 2 is configured to measure the quantum capacitance between the QD 16 and a cutter gate 19 coupled to an alternating current (AC) voltage source 52. When the QD 16 is electrically coupled to the Majorana island 12, the quantum capacitance changes.

In the example of FIG. 2, the Majorana island gate voltage $N_g$ and the quantum dot gate voltage $n_g$ may be set via respective plunger gates 53A and 53B. The plunger gates 53A and 53B may be located proximate to the Majorana island 12 and the QD 16 above a surface of the island-dot system 11 in a thickness direction. In other examples, the plunger gates 53A and 53B may be located below the Majorana island 12 and the QD 16 or in a plane of the island-dot system 11. The plunger gates 53A and 53B may be electrostatic gates.

In the example of FIG. 2, the capacitance sensor 18 includes a microwave readout circuit 56 that is electrically coupled to the AC voltage source 52 and capacitively coupled to the QD 16. The microwave readout circuit 56 is configured to generate a microwave response signal 57 based at least in part on a quantum capacitance of the island-dot system 11A. For example, the microwave readout circuit 56 may be an LC circuit at which the quantum capacitance of the QD 16 and the Majorana island 12 affect a resonant frequency of the microwave readout circuit 56. Thus, a value of the quantum capacitance may be determined from the microwave response signal 57. The microwave response signal 57, in the example of FIG. 2, is output to the controller 20 as a quantum capacitance measurement.

In the example of FIG. 2, the quantum dot 16 that is used to perform QPP detection measurements is also used to perform joint parity measurements 32 included in quantum computations. Via the quantum dot 16, the quantum computing device 10 is further configured to perform a joint parity measurement 32 of a plurality of MZMs 14 that includes the MZM 14B to which the quantum dot 16 is electrically coupled. Since each joint parity measurement 32 is of an even number of MZMs 14, the joint parity measurement 32 is also performed on at least one other MZM 14. The QD 16 may accordingly serve a dual purpose, thereby allowing QPP to be detected without increasing the number of QDs 16 used in the island-dot system 11. Increases in the size and manufacturing complexity of the quantum computing device 10 may consequently be avoided by using the same QD 16 for QPP detection 36 and joint parity measurements 32.

FIG. 2 further shows a fermion reservoir 58 that is electrically connectable to the Majorana island 12 and the QD 16. The Majorana island 12 or the QD 16 may be electrically coupled to the fermion reservoir 58 in order to set the fermion number of Majorana island 12 or the QD 16, for example, to reset the fermion number to zero. As depicted in the example of FIG. 2, the fermion reservoir 58 may be an additional QD. The fermion reservoir 58 may be coupled to the MZM 14B, as shown in FIG. 2, and may additionally or alternatively be coupled to the MZM 14A.

Returning to the example of FIG. 1, the controller 20 is configured to transmit joint parity measurement instructions 30 to the quantum computing device 10. The joint parity measurement instructions 30 include one or more joint parity measurements 32 encoding a quantum computation that the controller 20 instructs the quantum computing device 10 to perform. Each joint parity measurement 32 indicated in the joint parity measurement instructions 30 is an instruction to measure a parity operator of an even number of MZMs 14. The MZMs 14 may be included in the same Majorana island 12 or in different Majorana islands 12. For example, a single-qubit Pauli measurement of a Majorana-based qubit may correspond to measuring the fermion parity associated with a pair of MZMs 14. The map between MZMs 14 and Pauli operators depends on a choice of encoding.

As shown in the example of FIG. 1, the controller 20 is further configured to transmit QPP detection instructions 34 to the quantum computing device 10. The QPP detection instructions 34 specify one or more QPP detections 36 configured to be performed at respective island-dot systems 11.

The controller 20 is configured to receive a plurality of quantum capacitance measurements 38 from the capacitance sensors 18 subsequently to transmitting the joint parity measurement instructions 30 and the QPP detection instructions 34 to the quantum computing device 10. When the controller 20 performs a quantum capacitance measurement 38, the controller 20 receives a microwave response signal 57 measured at the island-dot system 11. The controller 20 is further configured to determine, based at least in part on the microwave response signal 57, a joint parity value 39 of the two or more MZMs 14. The joint parity value 39 is an indication of positive parity, negative parity, or an ambiguous parity value.

As discussed in further detail below, when performing the joint parity measurement 32, the controller 20 is configured to perform quantum capacitance measurement 38 for different values of the Majorana island gate voltage $N_g$ and the quantum dot gate voltage $n_g$. The controller 20 may, in some examples, be further configured to adjust one or more cutter gate voltages $n_{cg}$ applied to one or more of the cutter gates 19 in order to increase measurement visibility for different values of the Majorana island gate voltage $N_g$ and the quantum dot gate voltage $n_g$. The difference in response signal for positive parity and negative parity is approximately maximized when the island-dot system 11 is tuned to resonance. Away from the resonance region, the visibility of the measurement signal that distinguishes between parities is significantly reduced, which may lead to ambiguous or faulty measurement outcomes. The quantum capacitance measurements 38 are also used when performing both joint parity measurement 32 and QPP detection 36.

Figure 3:
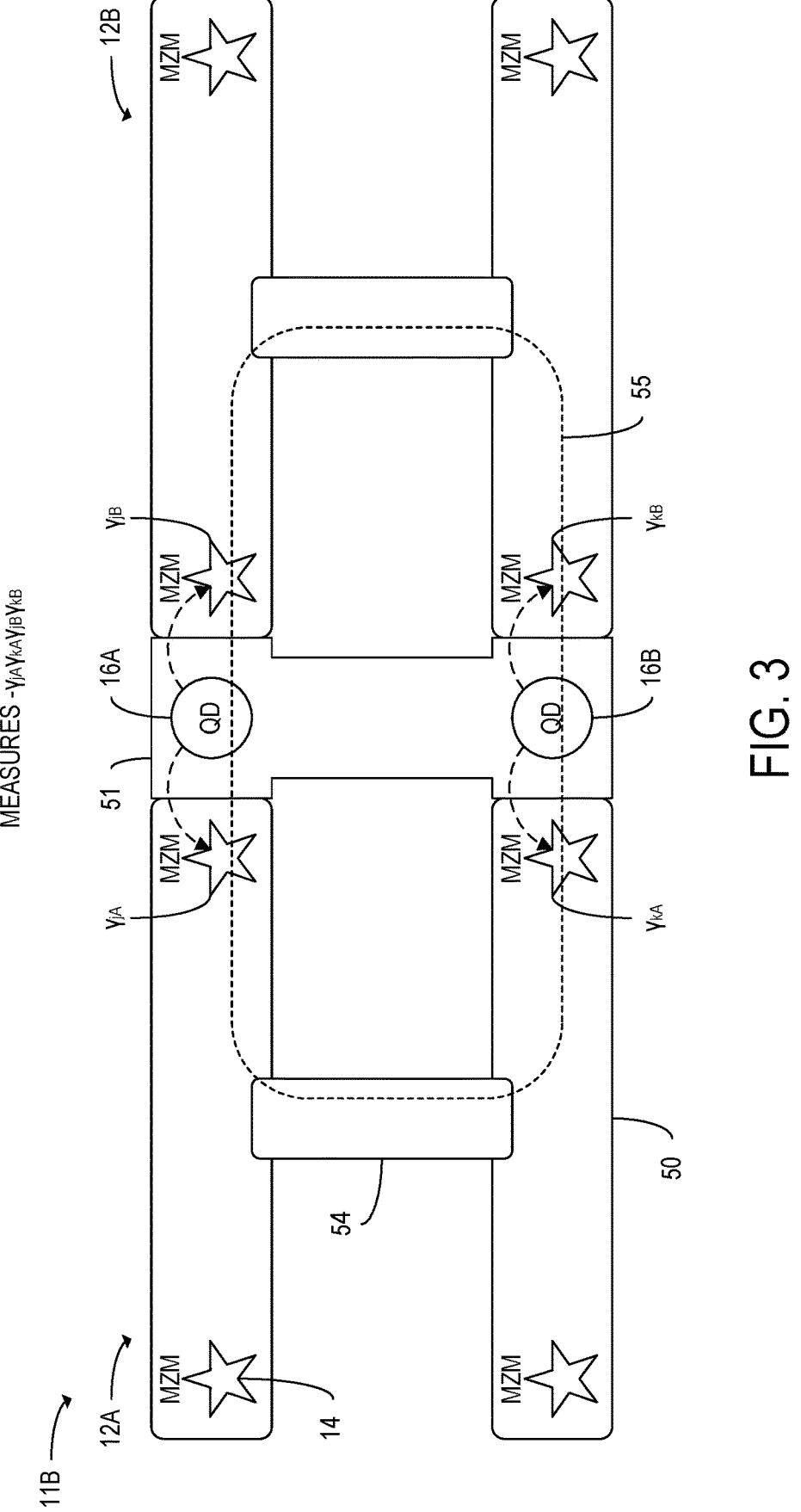
FIG. 3 schematically shows an island-dot system including a first Majorana island and a second Majorana island provided as Majorana tetrons, according to the example of FIG. 1.

The quantum computing device 10 is configured to perform two-qubit joint parity measurements in addition to one-qubit joint parity measurements. As shown in the example of FIG. 3, a two-qubit measurement is configured to be performed at an island-dot system 11B including a first Majorana island 12A and a second Majorana island 12B. In the example island-dot system 11B of FIG. 3, the first Majorana island 12A and the second Majorana island 12B are Majorana tetrons. At each of the Majorana tetrons, four MZMs 14 are instantiated. The four MZMs 14 instantiated at each Majorana tetron are formed at respective ends of a pair of topological superconducting nanowires 50. The topological superconducting nanowires 50 included in each Majorana tetron are coupled by a trivial superconducting nanowire 54. The measurement circuits 15 and fermion reservoirs 58 of the Majorana tetrons are omitted from FIG. 3 in the interest of clarity.

The island-dot system 11B of FIG. 3 further includes a first QD 16A and a second QD 16B positioned between respective ends of the topological superconducting nanowires 50 included in the first Majorana island 12A and the second Majorana island 12B. Accordingly, via the first QD 16A and the second QD 16B, two of the MZMs 14 included in the first Majorana island 12A are configured to be electrically coupled to two of the MZMs 14 included in the second Majorana island 12B. This electrical coupling forms an interference loop 55 that passes through the QDs 16A and 16B, the trivial superconducting nanowires 54 of the Majorana islands 12A and 12B, and the MZMs labeled $\gamma_{j_A}$, $\gamma_{j_B}$, $\gamma_{k_A}$, and $\gamma_{k_B}$.

Figure 4A:
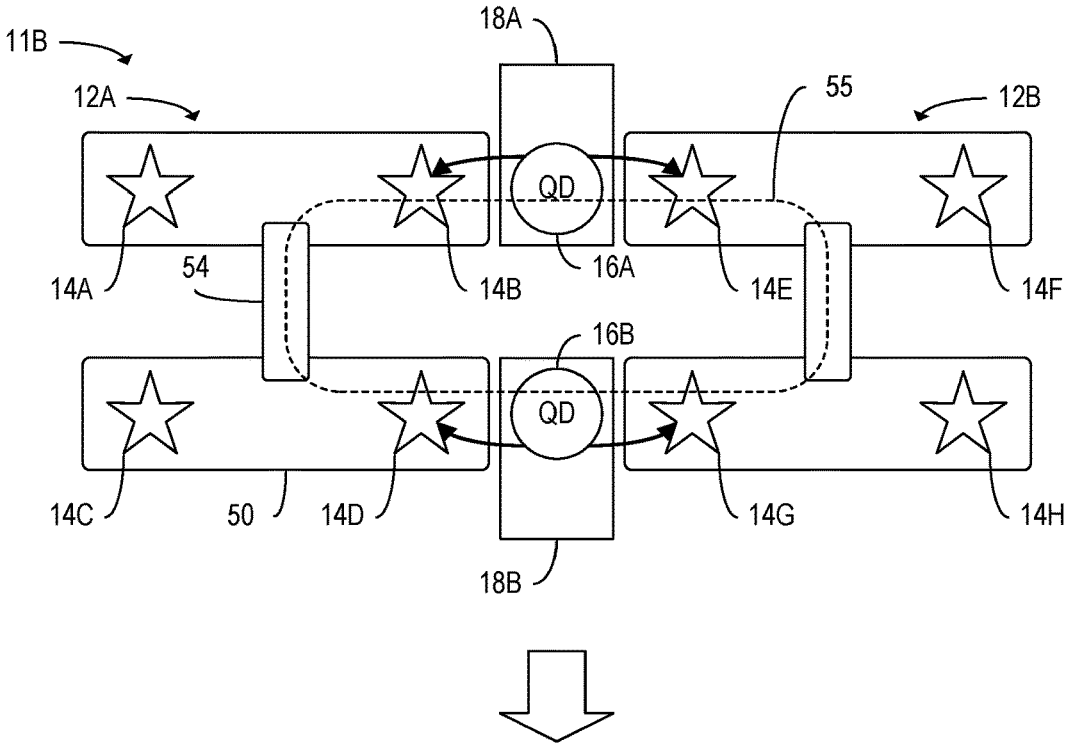
FIGS. 4A-4B show the island-dot system of FIG. 3 when the controller controls the quantum computing device to perform a joint parity measurement and to perform quasiparticle poisoning detection.
Figure 4A:
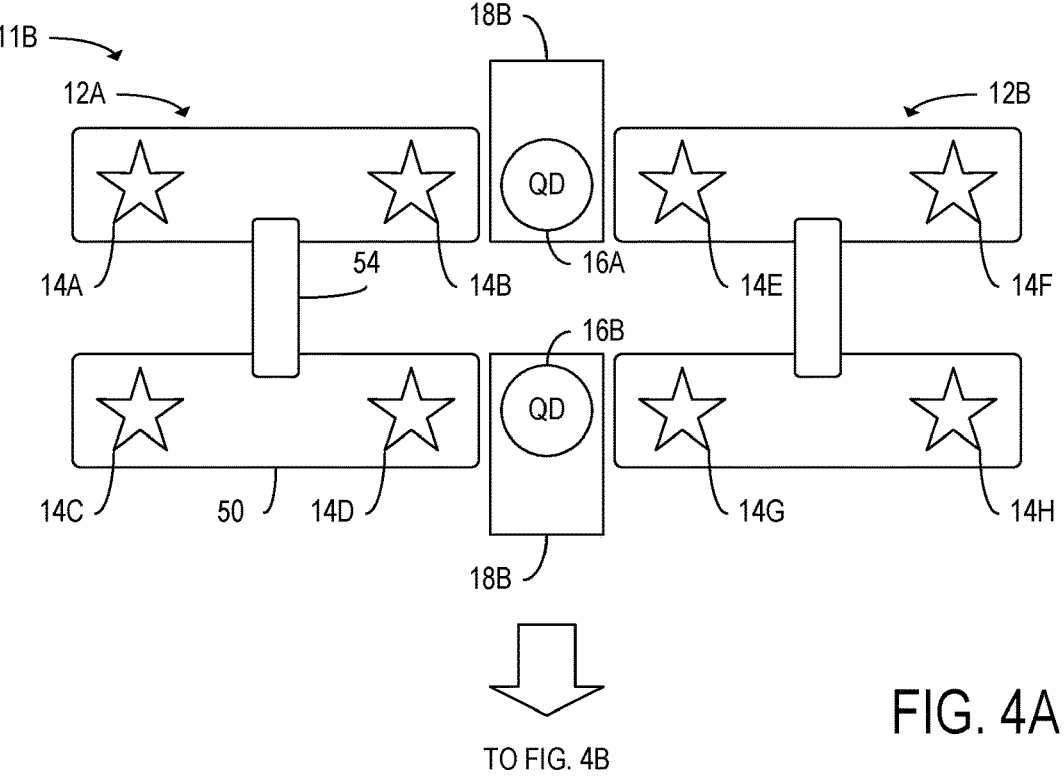
Figure 4B:
Figure 4B:
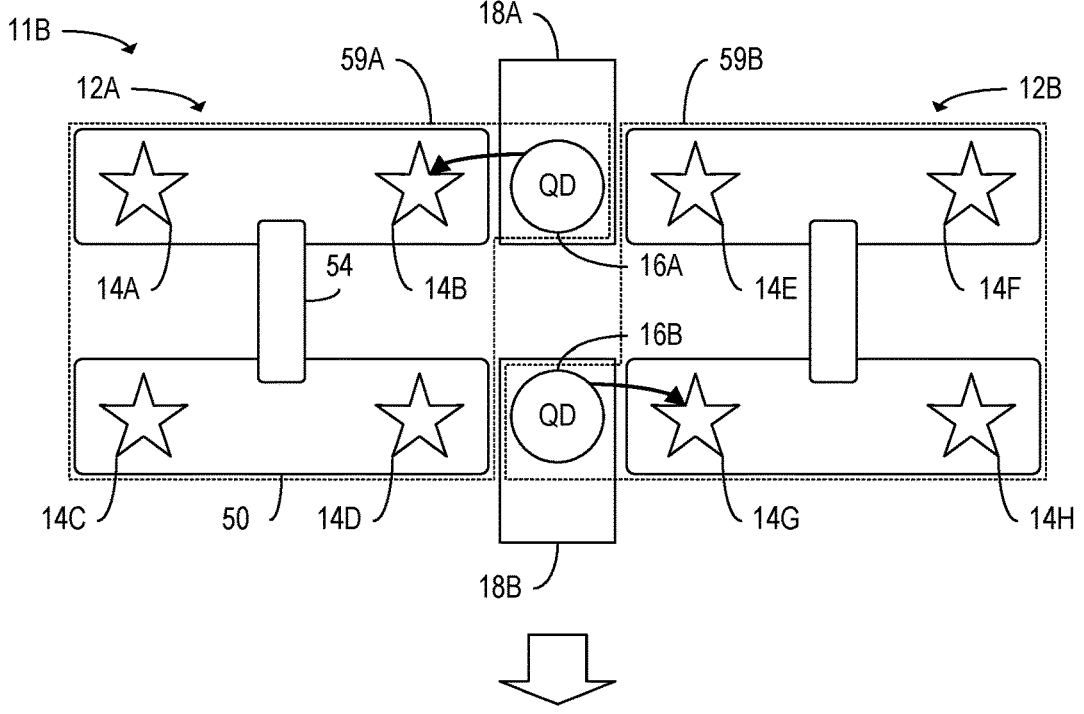
Figure 4B:
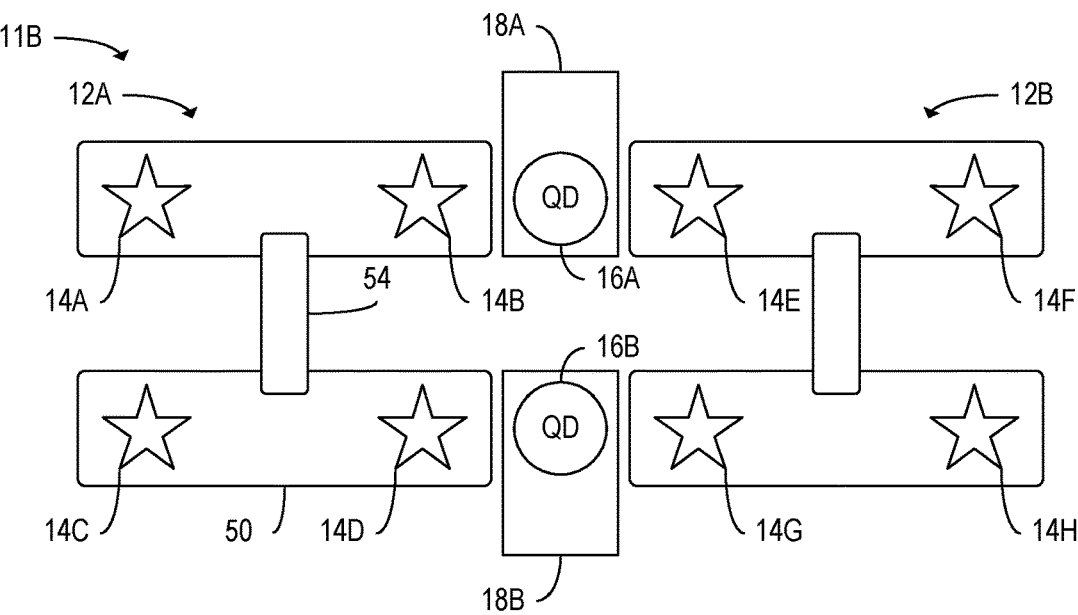

FIGS. 4A-4B show the island-dot system 11B of FIG. 3 when the controller 20 controls the quantum computing device 10 to perform a joint parity measurement 32 and perform quasiparticle poisoning detection 36. In the example of FIGS. 4A-4B, the first Majorana island 12A and the second Majorana island 12B are Majorana tetrons. The first Majorana island 12A includes a first MZM 14A, a second MZM 14B, a third MZM 14C, and a fourth MZM 14D. The second Majorana island 12B includes a fifth MZM 14E, a sixth MZM 14F, a seventh MZM 14G, and an eighth MZM 14H. The first step shown in FIG. 4A may sample over the plurality of candidate resonance regions during a joint parity measurement 32. The first step shown in FIG. 4B may sample over the plurality of candidate resonance regions for a QPP detection 36.

The joint parity measurement 32 is performed on two or more MZMs 14 of the plurality of MZMs 14. As shown in the example of FIG. 4A, when the controller 20 controls the quantum computing device 10 to perform the joint parity measurement 32, the quantum computing device 10 is configured to electrically couple two or more MZMs 14 via one or more quantum dots 16 of the plurality of quantum dots 16. In the example of FIG. 4A, the joint parity measurement 32 is a four-MZM measurement in which two MZMs 14 included in each of the first Majorana island 12A and the second Majorana island 12B are coupled via a first quantum dot 16A and a second quantum dot 16B. In this example, the second MZM 14B is coupled to the fifth MZM 14E via the first quantum dot 16A, and the fourth MZM 14D is coupled to the seventh MZM 14G via the second quantum dot 16B. Thus, an interference loop 55 is formed between the first Majorana island 12A, the first QD 16A, the second Majorana island 12B, and the second QD 16B.

When the joint parity measurement 32 is performed in the example of FIG. 4A, the controller 20 may be configured to tune the voltages of the plunger gates 53A and 53B to set the Majorana island gate voltage $N_g$ and the quantum dot gate voltage $n_g$. The controller 20 may be configured to iteratively set the Majorana island gate voltage $N_g$ and the quantum dot gate voltage $n_g$ to values within each of a plurality of candidate resonance regions, as discussed in further detail below.

Subsequently to performing the joint parity measurement 32, the controller 20 is further configured to control the quantum computing device 10 to decouple the two or more MZMs 14 from the one or more quantum dots 16. Decoupling the MZMs 14 from the quantum dots 16 electrically isolates the Majorana islands 12 from the quantum dots 16 and from each other.

Subsequently to decoupling the two or more MZMs 14 from the one or more quantum dots 16, the controller 20 is further configured to control the quantum computing device 10 to perform quasiparticle poisoning detection 36 at each of the Majorana islands 12 in which the two or more MZMs 14 are located. The quasiparticle poisoning detection is performed via respective capacitance sensors 18 of the plurality of capacitance sensors 18 located proximate to the MZMs 14. When performing the quasiparticle poisoning detection, each capacitance sensor 18 of the plurality of capacitance sensors 18 measures a quantum capacitance of a respective island-dot system 11 that includes a Majorana island 12 of the plurality of Majorana islands 12 and a quantum dot 16 of the plurality of quantum dots 16.

In the example of FIGS. 4A-4B, the first quantum dot 16A and the second quantum dot 16B are respectively included in a first capacitance sensor 18A and a second capacitance sensor 18B. The first capacitance sensor 18A and the second capacitance sensor 18B may each be structured as shown in FIG. 2. In this example, each QD 16 used in the QPP detection 36 is also included among the one or more QDs 16 via which the two or more MZMs 14 are electrically coupled during the joint parity measurement 32. Accordingly, the same QDs 16 are used for both the joint parity measurement 32 and the quasiparticle poisoning detection 36, thereby reducing the size and complexity of the quantum computing device 10. In other examples, separate QDs 16 may be used to perform the joint parity measurements 32 and the QPP detection 36.

In the example of FIG. 4B, when the QPP detection 36 is performed, the controller 20 is configured to control the quantum computing device 10 to electrically couple the first QD 16A to the second MZM 14B and to electrically couple the second QD 16B to the seventh MZM 14G. The first Majorana island 12A and the first QD 16A form a first island-dot pair 59A, and the second Majorana island 12B and the second QD 16B form a second island-dot pair 59B. Accordingly, quantum capacitance is measured for each of the Majorana islands 12. In other examples, the first QD 16A may instead be electrically coupled to the fifth MZM 14E, and the second QD 16B may instead be electrically coupled to the fourth MZM 14D.

The controller 20 may be further configured to control the quantum computing device 10 to electrically decouple the QDs 16 from the Majorana islands 12 subsequently to measuring the quantum capacitance. Thus, the island-dot system 11B may be prepared for a later joint parity measurement 32.

Figure 5:
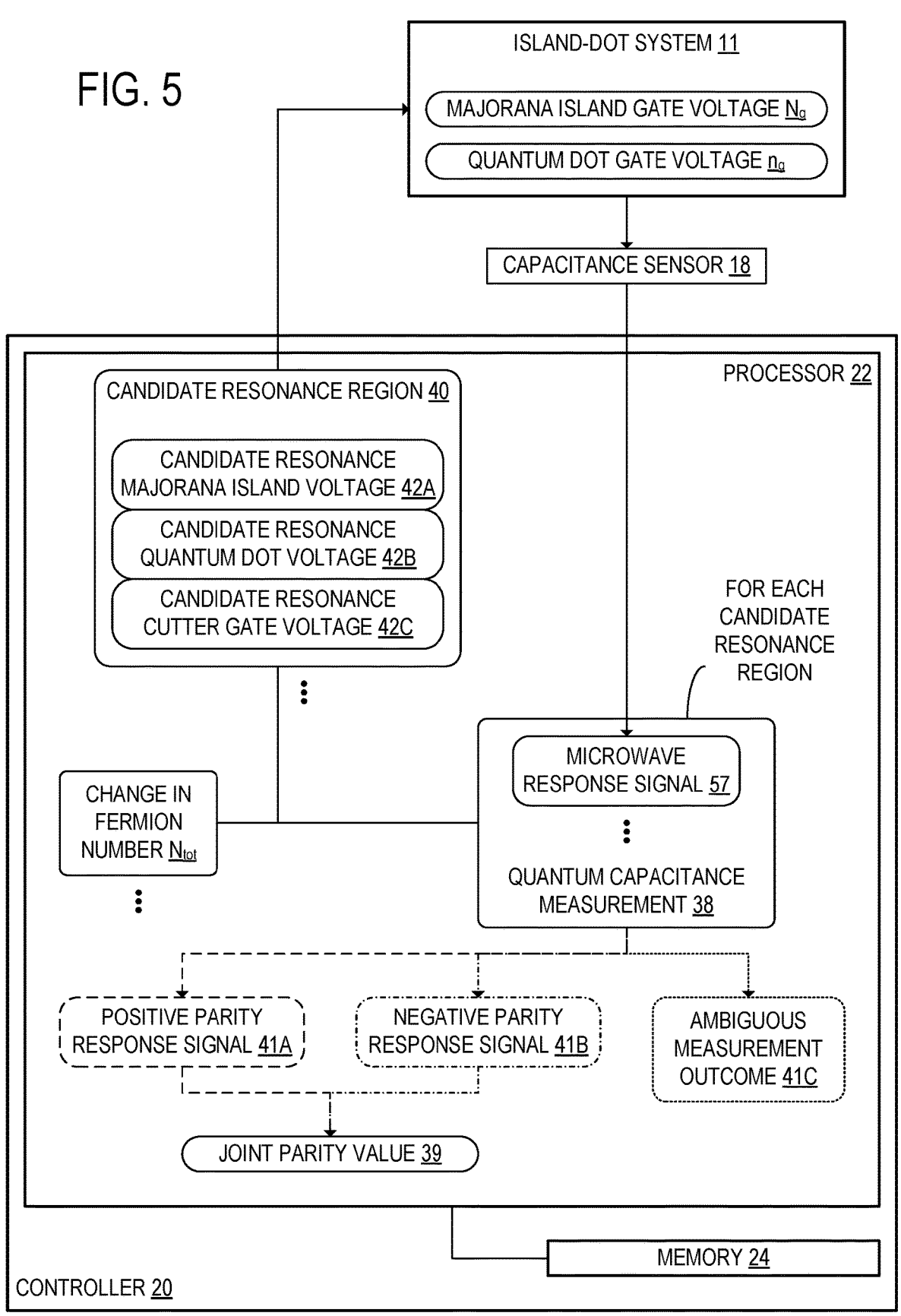
FIG. 5 schematically shows the island-dot system and the controller when a joint parity measurement is performed at a plurality of candidate resonance regions, according to the example of FIG. 1.

FIG. 5 schematically shows an island-dot system 11 and the controller 20 when the joint parity measurement 32 is performed. For each of a plurality of candidate resonance regions 40, the Majorana island gate voltage $N_g$ and the quantum dot gate voltage $n_g$ are respectively set to a candidate resonance Majorana island gate voltage 42A and a candidate resonance quantum dot gate voltage 42B located within that candidate resonance region 40. In some examples, a cutter gate voltage $n_{cg}$ on one or more cutter gates 19 may also be set to a candidate resonance cutter gate voltage 42C. Each candidate resonance region 40 is a region of a parameter space of values of the Majorana island gate voltage $N_g$ and the quantum dot gate voltage $n_g$. The controller 20 may be configured to set each of the Majorana island gate voltages $N_g$ of the one or more Majorana islands 12 included in the island-dot system 11 to the candidate resonance Majorana island gate voltage 42A and set each of the quantum dot gate voltages $n_g$ of the one or more quantum dots 16 included in the island-dot system 11 to the candidate resonance quantum dot gate voltage 42B. The respective cutter gate voltages $n_{cg}$ of each cutter gate 19 included in the island-dot system 11 may also each be set to the candidate resonance cutter gate voltage 42C.

As discussed above, the controller 20 is further configured to receive quantum capacitance measurements 38 from the capacitance sensor 18 located proximate to the Majorana island 12. The quantum capacitance measurements 38 include respective microwave response signals 57 measured at the candidate resonance regions 40. When the controller 20 controls the quantum computing device 10 perform a quantum capacitance measurement 38 at a candidate resonance region 40, the capacitance sensor 18 measures the quantum capacitance at respective ranges of values of the Majorana island gate voltage $N_g$ and the quantum dot gate voltage $n_g$ located within the candidate resonance region 40, proximate to the candidate resonance Majorana island gate voltage 42A, the candidate resonance quantum dot gate voltage 42B, and the candidate resonance cutter gate voltage 42C.

The candidate resonance regions 40 each correspond to a respective value of a total fermion number $N_{tot}$ of the island-dot system 11. The total fermion number $N_{tot}$ is the number of fermions located at the island-dot system 11 relative to a reference value. The change in the fermion number $N_{tot}$ for a single Majorana island 12 coupled to a single quantum dot 16 is given by N+n, where N is the change in the fermion number of the Majorana island 12 and n is the change in the fermion number of the QD 16. By measuring the capacitance at a plurality of different candidate resonance regions 40, the capacitance sensor 18 is configured to measure the joint parity of a plurality of MZMs 14 even under conditions in which QPP has occurred at the one or more Majorana islands 12. In some examples, the one or more candidate resonance regions 40 may correspond to a set of values of the change in the fermion number $N_{tot}$ of the island-dot system 11 given by $\{-3, -2, -1, 0, 1, 2, 3\}$. In other examples, the candidate resonance regions 40 may correspond to values of the change in the fermion number $N_{tot}$ given by $\{-2, -1, 0, 1, 2\}$ or $\{-1, 0, 1\}$.

When the controller 20 performs the joint parity measurement 32, the controller 20 is further configured to determine the joint parity value 39 of the two or more MZMs 14 at least in part by classifying the microwave response signal 57 as a positive parity response signal 41A, a negative parity response signal 41B, or an ambiguous measurement outcome 41C. The difference between the positive parity response signal 41A and the negative parity response signal 41B depends on the Majorana island gate voltage $N_g$, the quantum dot gate voltage $n_g$, and the change in fermion number $N_{tot}$. The measurement visibility is increased when the island-dot system exhibits resonance. Some candidate resonance regions 40 may have low measurement visibility for certain values of the change in fermion number $N_{tot}$, thereby resulting in ambiguous measurement outcomes 41C.

The controller 20 may be configured to control the quantum computing device 10 to measure the microwave response signal 57 at ranges of values of the Majorana island gate voltage $N_g$ and the quantum dot gate voltage $n_g$ in a candidate resonance region 40. The controller 20 may be further configured to classify the measured microwave response signal 57 as a positive parity response signal 41A, a negative parity response signal 41B, or an ambiguous measurement outcome 41C determined for that value of $N_{tot}$ during a calibration phase to thereby distinguish between positive and negative joint parity values 39 for the two or more MZMs 14. The controller 20 is further configured to output the joint parity value 39 of the two or more MZMs 14.

As shown in the example of FIG. 1, the controller 20 is further configured to control the quantum computing device 10 to perform a QPP detection 36 subsequently to the joint parity measurement 32. The QPP detection 36, similarly to the joint parity measurement 32, may be performed using the capacitance sensor 18 by performing a plurality of quantum capacitance measurements 38.

Formalism describing a one-qubit joint parity measurement 32 followed by a QPP detection 36 is provided below. A single-island measurement of MZMs j and k included in the same Majorana island 12 may be modeled using the following Hamiltonian:

$$H^{(jk)} = H_C + H_t^{(jk)}$$

In the above Hamiltonian, $H_C$ is a charging energy Hamiltonian of the island-dot system 11 when decoupled from other Majorana islands 12 and quantum dots 16. $H_C$ may be expressed as:

$$H_C = E_C(\hat{N} - N_g)^2 + \varepsilon_C(\hat{n} - n_g)^2$$

In the above equation, $E_C$ and $\varepsilon_C$ are respective geometric charging energies of the Majorana island 12 and the QD 16, $\hat{N}$ and $\hat{n} = f^\dagger f$ are the respective number operators of the Majorana island 12 and the QD 16, and $N_g$ and $n_g$ are respective dimensionless gate voltages of the Majorana island 12 and the QD 16.

$$H_t^{(jk)}$$

is a tunnel coupling of the island-dot system 11 and may be expressed as:

$$H_t^{(jk)} = t_j e^{i\phi/2}\gamma_j f_d + t_k e^{i\phi/2}\gamma_k f_d + \text{h.c.}$$

In the above equation, $t_j$ and $t_k$ are tunnel coupling strengths associated with the MZMs j and k, $\hat{\phi}$ is a phase operator of the topological superconducting nanowire 50, $\gamma_j$ and $\gamma_k$ are MZM operators, and $f_d$ is a fermionic annihilation operator of the quantum dot 16. The single-qubit Pauli measurement is a measurement of the operator $i\gamma_j\gamma_k$.

When $E_C \neq \varepsilon_C$, for any fixed charge sector (the value of the change in the fermion number of the island-dot system 11), there are values of the Majorana island gate voltage $N_g$ and the quantum dot gate voltage $n_g$ at which the low-energy sector may be described by the following Hamiltonian:

$$H^{(jk)} = \frac{\delta_{N_{tot}}}{2}\sigma_z + t_{C,p_{jk}}\sigma_x$$

In the above equation, $\sigma_z$ and $\sigma_x$ are the Pauli Z operator and the Pauli X operator. $\delta_{N_{tot}}$ is the difference in decoupled charging energy between the two lowest-energy configurations, where the energy sector is expressed as $N_{tot} = N + n$. $\delta_{N_{tot}}$ is given by the following:

$$\delta_{N_{tot}} = -2E_C\left(N_g - \frac{1}{2}\right) + 2\varepsilon_C\left(n_g + \frac{1}{2}\right) + 2E_C N_{tot}$$

In addition, $t_{C,p_{jk}}$ is given by the following:

$$t_{C,p_{jk}} = \sqrt{|t_j|^2 + |t_k|^2 + 2p_{jk}\text{Im}(t_j t_k^*)} = \sqrt{|t_j|^2 + |t_k|^2 + 2p_{jk}|t_j t_k| \sin\theta}$$

In the above equation, the joint parity values $p_{jk} = \pm 1$ are the eigenvalues corresponding to the two eigenspaces of $i\gamma_j\gamma_k$. A baseline energy has been subtracted from the diagonal terms of $H^{(jk)}$ in the expression of $H^{(jk)}$ in terms of the Pauli matrices. The basis of $H^{(jk)}$ is chosen such that the off-diagonal terms of $H^{(jk)}$ are represented as proportional to $\sigma_x$. A total flux of the interference loop 55 formed by the QD 16 and the MZMs 14 contributes to relative phase between $t_j$ and $t_k$, such that the factor $\text{Im}(t_j t_k^*) = |t_j t_k| \sin\theta$ depends on the flux as a function of $\theta$. Thus, the size of the interference term in the equation for $t_{C,p_{jk}}$ may be modulated by controlling the enclosed flux of the corresponding interference loop 55.

The energy and capacitance measured at the quantum dot 16 are respectively given by:

$$\varepsilon_\pm(p_{jk}) = \pm\frac{1}{2}\sqrt{\delta_{N_{tot}}^2 + 4t_{C,p_{jk}}^2}$$

and $$C_Q(E) \equiv -\left(\frac{C_g}{e}\right)^2 \frac{\partial^2 E}{\partial n_g^2} \Rightarrow C_Q(\varepsilon_-(p_{jk})) = \frac{2e^2\alpha^2 t_{C,p_{jk}}^2}{\left(\delta_{N_{tot}}^2 + 4t_{C,p_{jk}}^2\right)^{3/2}}$$

In the above equations, $\alpha = C_g/C_\Sigma$ is a lever arm position of the plunger gate 53B, where $C_g$ is a capacitance between the plunger gate 53B and the QD 16 and where $C_\Sigma$ is a total capacitance of the QD 16 and all the gates located proximate to the QD 16. In addition, $\varepsilon_C \equiv e^2/2C_\Sigma$ in the above equation. The above equations for $\varepsilon_\pm(p_{jk})$ and $C_Q(E)$ utilize the equation for $\delta_{N_{tot}}$ with lowest-energy configurations $|N_{tot}+1, -1\rangle$ and $|N_{tot}, 0\rangle$, such that $\delta_{N_{tot}}(n_g) = 2\varepsilon_C n_g + \text{const}$. The measurement visibility of the single-qubit measurement is accordingly given by the following, where $C_Q(p_{jk})$ is the quantum capacitance of the ground state energy:

$$\Delta C_Q = C_Q(p_{jk} = +1) - C_Q(p_{jk} = -1) =$$

$$2e^2\alpha^2\left(\frac{|t_j|^2 + |t_k|^2 + 2|t_j t_k| \sin\theta}{\left[\delta_{N_{tot}}^2 + 4(|t_j|^2 + |t_k|^2 + 2|t_j t_k| \sin\theta)\right]^{3/2}} - \right.$$

-continued $$\frac{|t_j|^2 + |t_k|^2 - 2|t_jt_k|\sin\theta}{\left[\delta_{N_{tot}}^2 + 4\left(|t_j|^2 + |t_k|^2 - 2|t_jt_k|\sin\theta\right)\right]^{3/2}}$$

The measurement visibility $\Delta C_Q$ is maximized when the capacitance sensor 18 exhibits resonance, such that $\delta_{N_{tot}}=0$. The measurement visibility at the resonance point is given by:

$$\Delta C_Q^{(0)} = \frac{e^2\alpha^2}{4}\left(\frac{1}{t_{C+1}} - \frac{1}{t_{C-1}}\right)$$

In examples in which the tunnel coupling strengths are equal, $|t_j|=|t_k|=t$. In such examples, the maximum measurement visibility is given by:

$$\Delta C_Q^{(0)} = \frac{e^2\alpha^2}{4\sqrt{2}\,t}\,\frac{\sqrt{1-\sin\theta}-\sqrt{1+\sin\theta}}{|\cos\theta|}$$

The location of the resonance point depends on the charge sector of the island-dot system 11. In the $N_{tot}=N+n=0$ sector, the lowest-energy states are $|0,0\rangle$ and $|-1,1\rangle$, and resonance occurs at $N_g=\frac{1}{2}$, $n_g=-\frac{1}{2}$, corresponding to $\delta_{N_{tot}}=0$. In the $N_{tot}=1$ sector, the lowest-energy states are $|1,0\rangle$ and $|2,-1\rangle$, and setting the gate voltages to $N_g=\frac{1}{2}$ and $n_g=-\frac{1}{2}$ instead results in a decoupled charging energy difference of $\delta_{N_{tot}}=2E_C$. The measurement visibility at such a point is given by:

$$\Delta C_Q^{(1)} = 2e^2\alpha^2\left(\frac{t_{C,+1}^2}{\left(4E_C^2 + 4t_{C,+1}^2\right)^{3/2}} - \frac{t_{C,-1}^2}{\left(4E_C^2 + 4t_{C,-1}^2\right)^{3/2}}\right)$$

When $t_{C,p_{jk}} \sim k_B T$ and $\beta E_C \in [3,10]$, the above equation for $$\Delta C_Q^{(1)}$$

implies that the measurement visibility drops significantly when QPP has occurred, compared to the unpoisoned state, when $N_g=\frac{1}{2}$ and $n_g=-\frac{1}{2}$.

When the measurement circuit 15 achieves a sufficient signal-to-noise ratio to distinguish between the two parity states of an unpoisoned qubit, measuring the quantum capacitance of a poisoned qubit results in an ambiguous quantum capacitance measurement 38. The ambiguity of the measurement in the poisoned state occurs as a result of the quantum capacitance relationship $$\left|C_Q^{(0)}(\pm 1)\right| \gg \left|C_Q^{(1)}(\pm 1)\right| \approx 0.$$

Since $$C_Q^{(1)}$$

is close to zero, as shown in the above inequality, positive and negative parity measurements may result in approximately equal quantum capacitance values when QPP occurs, thereby preventing reliable differentiation between positive and negative parity response signals 41A and 41B. When an ambiguous measurement occurs, the state of the qubit after the joint parity measurement 32 may be decohered or partially projected onto an eigenstate of $i\gamma_j\gamma_k$ rather than fully projected.

Quasiparticle poisoning during a two-qubit measurement is discussed below. A two-qubit measurement performed at the first Majorana island 12A and the second Majorana island 12B of FIG. 3 may be modeled using the following Hamiltonian:

$$H^{(j_Ak_A;j_Bk_B)} = H_c + H_t^{(j_Ak_A;j_Bk_B)}$$

In this equation, the charging energy Hamiltonian $H_C$ is given by:

$$H_C = E_C\left(\hat{N}_A - N_{g,A}\right)^2 + E_C\left(\hat{N}_B - N_{g,B}\right)^2 + \varepsilon_C(\hat{n}_1 - n_{g,1})^2 + \varepsilon_C(\hat{n}_2 - n_{g,2})^2$$

The tunnel coupling is given by:

$$H_t^{(j_Ak_A;j_Bk_B)} = t_{j_A}e^{-i\hat{\phi}_A/2}\gamma_{j_A}f_1^\dagger + t_{k_A}e^{-i\hat{\phi}_A/2}\gamma_{k_A}f_2^\dagger +$$
$$t_{j_B}e^{-i\hat{\phi}_B/2}\gamma_{j_B}f_1^\dagger + t_{k_B}e^{-i\hat{\phi}_B/2}\gamma_{k_B}f_2^\dagger + h.c.$$

The two-qubit operator $-\gamma_{j_A}\gamma_{k_A}\gamma_{j_B}\gamma_{k_B}$ is measured in the example of FIG. 3.

The ground state degeneracy of the charging energy Hamiltonian at the point $N_{g,A}=N_{g,B}=\frac{1}{2}$, $n_{g,1}=n_{g,2}=-\frac{1}{2}$ in parameter space is discussed below. The total charge sector in this example is $N_{tot}=N_A+N_B+n_1+n_2$, and the charge configuration states are written as $|N_A, N_B; n_1, n_2\rangle$. The two qubits have the following ground states for values of $N_{tot}\in\{-2,-1,0,1,2\}$:

$N_{tot}=-2$: unique ground state $|0,0;-1,-1\rangle$.

$N_{tot}=-1$: four degenerate ground states $|0,0;-1,0\rangle$, $|0,0;0,-1\rangle$, $|1,0;-1,-1\rangle$, and $|0,1;-1,-1\rangle$.

$N_{tot}=0$: six degenerate ground states $|0,0;0,0\rangle$, $|1,0;-1,0\rangle$, $|1,0;0,-1\rangle$, $|0,1;-1,0\rangle$, $|0,1;0,-1\rangle$, and $|1,1;-1,-1\rangle$.

$N_{tot}=1$: four degenerate ground states $|1,0;0,0\rangle$, $|0,1;0,0\rangle$, $|1,1;-1,0\rangle$, and $|1,1;0,-1\rangle$.

$N_{tot}=2$: unique ground state $|1,1;0,0\mathbb{Z}$.

The curvature of the ground state energy with respect to $N_{g,A}$, $N_{g,B}$, $n_{g,1}$, and $n_{g,2}$ changes between the different charge sectors. However, since the charge sectors $N_{tot}\in\{-1,0,1\}$ still have degeneracies at the point $N_{g,A}=N_{g,B}=\frac{1}{2}$, $n_{g,1}=n_{g,2}=-\frac{1}{2}$ in the state space of gate voltages, these charge sectors may also exhibit resonance during the quantum capacitance measurement. This resonance may provide visibility and distinguishability between positive and negative joint parity values 39.

In the charge sector $N_{tot}=0$, the effective Hamiltonian in the low-energy state space (with basis states ordered as listed above) may be written as follows:

$$H_{N_{tot}=0}^{(j_A k_A; j_B k_B)} = \begin{pmatrix} \varepsilon_0 & t_{j_A} & ip_{j_A k_A} t_{k_A} & t_{j_B} & ip_{j_B k_B} t_{k_B} & 0 \\ t_{j_A}^* & \varepsilon_{A1} & 0 & 0 & 0 & ip_{j_B k_B} t_{k_B} \\ -ip_{j_A k_A} t_{k_A}^* & 0 & \varepsilon_{A2} & 0 & 0 & t_{j_B} \\ t_{k_B}^* & 0 & 0 & \varepsilon_{B1} & 0 & ip_{j_A k_A} t_{k_A} \\ -ip_{j_B k_B} t_{k_B}^* & 0 & 0 & 0 & \varepsilon_{B2} & t_{j_A} \\ 0 & -ip_{j_B k_B} t_{k_B}^* & t_{j_B}^* & -ip_{j_A k_A} t_{k_A}^* & t_{j_A}^* & \varepsilon_{AB12} \end{pmatrix}$$

where $$\varepsilon_0 = 0$$

$$\varepsilon_{A1} = -2E_{C,A}\left(N_{g,A} - \frac{1}{2}\right) + 2\varepsilon_{C,1}\left(n_{g,1} + \frac{1}{2}\right)$$

$$\varepsilon_{A2} = -2E_{C,A}\left(N_{g,A} - \frac{1}{2}\right) + 2\varepsilon_{C,2}\left(n_{g,1} + \frac{1}{2}\right)$$

$$\varepsilon_{B1} = -2E_{C,B}\left(N_{g,B} - \frac{1}{2}\right) + 2\varepsilon_{C,1}\left(n_{g,1} + \frac{1}{2}\right)$$

$$\varepsilon_{B2} = -2E_{C,B}\left(N_{g,B} - \frac{1}{2}\right) + 2\varepsilon_{C,2}\left(n_{g,2} + \frac{1}{2}\right)$$

$$\varepsilon_{AB12} = -2E_{C,A}\left(N_{g,A} - \frac{1}{2}\right) - 2E_{C,B}\left(N_{g,B} - \frac{1}{2}\right) + 2\varepsilon_{C,1}\left(n_{g,1} + \frac{1}{2}\right) + 2\varepsilon_{C,2}\left(n_{g,2} + \frac{1}{2}\right)$$

A baseline energy of $$E_0 = E_{C,A} N_{g,A}^2 + E_{C,B} N_{g,B}^2 + \varepsilon_{C,1} n_{g,1}^2 + \varepsilon_{C,2} n_{g,2}^2$$

has been subtracted from the diagonal of $$H_{N_{tot}=0}^{(j_A k_A; j_B k_B)}.$$

The above Hamiltonian may be derived using the following relationship for a Majorana island J:

$$e^{i\phi_J/2}\gamma_{j_J}\left|N_J = 0, p_{j_J k_J}\right) = -ie^{i\phi_J/2}\left(i\gamma_{j_J}\gamma_{k_J}\right)\gamma_{k_J}\left|N_J, p_{j_J k_J}\right) =$$

$$ip_{j_J k_J}e^{i\phi_J/2}\gamma_{k_J}\left|N_J, p_{j_J k_J}\right)$$

In the above equation, $p_{j_J k_J}$ is an eigenvalue of $i\gamma_{j_J}\gamma_{k_J}$.

Analytic expressions for energy bands in the two-qubit measurement example may be written by setting $E_{C,A} = E_{C,B} = E_C$, $\varepsilon_{C,1} = \varepsilon_{C,2} = \varepsilon_C$, $N_{g,A} = N_{g,B} = N_g$, and $n_{g,1} = n_{g,2} = n_g$. A detuning energy $$\delta_0 = -2E_C\left(N_g - \frac{1}{2}\right) + 2\varepsilon_C\left(n_g + \frac{1}{2}\right)$$

of the island-dot system 11 may also be subtracted from the diagonal. The resulting energies are given by:

$$E = -\sqrt{\frac{B + \sqrt{B^2 - 4C}}{2}}, -\sqrt{\frac{B - \sqrt{B^2 - 4C}}{2}}, 0, 0, \sqrt{\frac{B - \sqrt{B^2 - 4C}}{2}},$$

$$\sqrt{\frac{B + \sqrt{B^2 - 4C}}{2}}$$

In the above equation, $$B = \delta_0^2 + 2\left(|t_{j_A}|^2 + |t_{k_A}|^2 + |t_{j_B}|^2 + |t_{k_B}|^2\right)$$

and $$C = |t_{j_A}|^4 + |t_{k_A}|^4 + |t_{j_B}|^4 + |t_{k_B}|^4 + 2|t_{j_A}|^2|t_{k_A}|^2 + 2|t_{j_A}|^2|t_{j_B}|^2 +$$

$$2|t_{k_A}|^2|t_{k_B}|^2 + 2|t_{j_B}|^2|t_{k_B}|^2 - 2|t_{j_A}|^2|t_{k_B}|^2 - 2|t_{k_A}|^2|t_{j_B}|^2 -$$

$$8p_{j_A k_A; j_B k_B}|t_{j_A} t_{k_A} t_{j_B} t_{k_B}|\cos\theta$$

In the equation for C, $p_{j_A k_A; j_B k_B} = p_{j_A k_A j_B k_B} = \pm 1$ is an eigenvalue of the operator $-\gamma_{j_A}\gamma_{k_A}\gamma_{j_B}\gamma_{k_B}$ that is measured for the two-tetron system in the decoupled state. In addition, $\theta$ is the phase of $t_{j_A} t_{k_A}^* t_{j_B}^* t_{k_B} = |t_{j_A} t_{k_A} t_{j_B} t_{k_B}|e^{i\theta}$. By modifying the flux enclosed in the interference loop 55, $\theta$ may be modulated to adjust the interference term $-8p_{j_A k_A; j_B k_B}|t_{j_A} t_{k_A} t_{j_B} t_{k_B}|\cos\theta$.

Figure 6A:
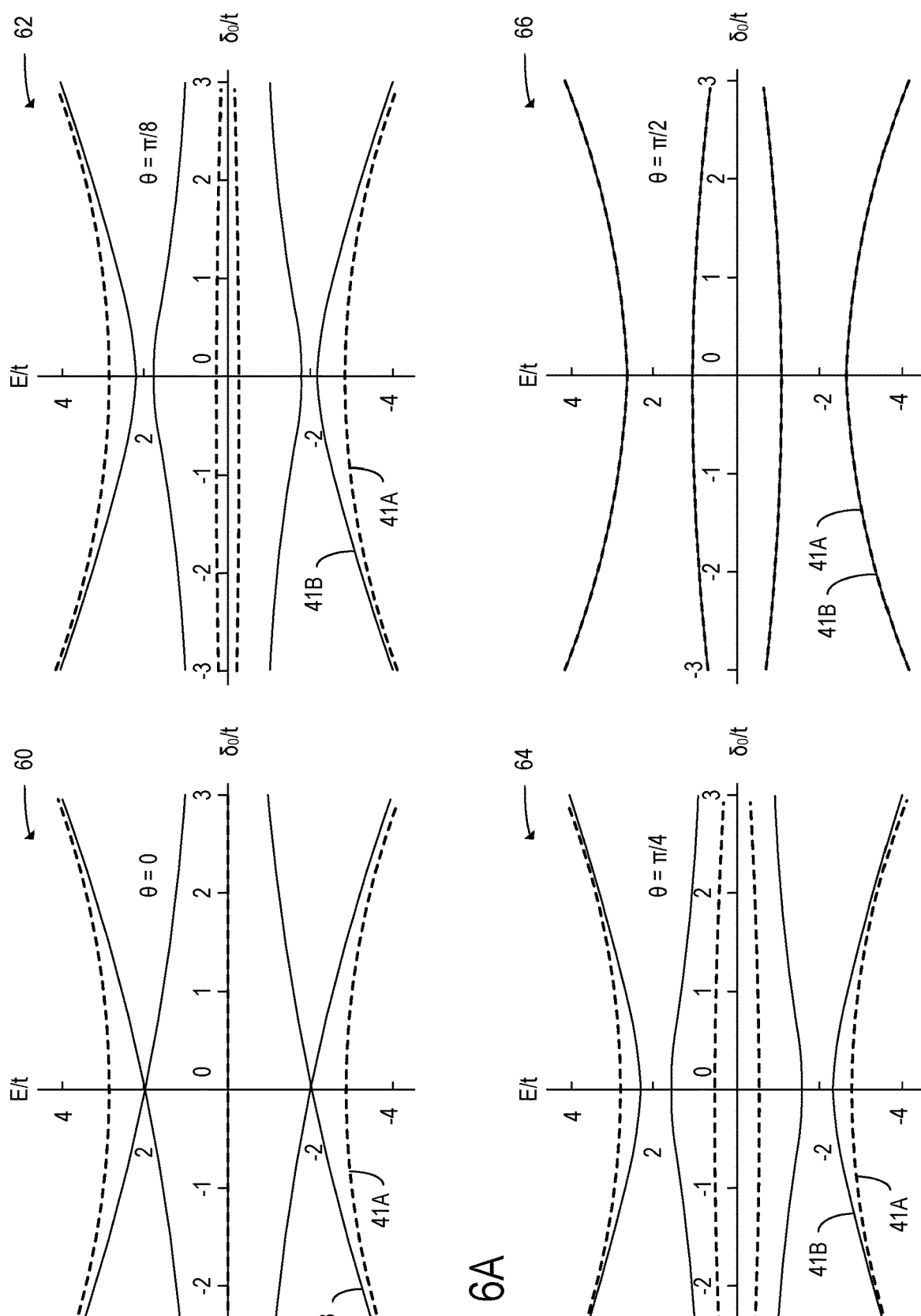
FIG. 6A schematically shows plots of the energy of the island-dot system as a function of a detuning energy for a plurality of different interference phase values when the change in the fermion number equals zero, according to the example of FIG. 3.

FIG. 6A shows plots of the energy E of the island-dot system 11 of FIG. 3 as a function of the detuning energy $\delta_0$ for different values of $\theta$ when $N_{tot} = 0$. In the plots shown in FIG. 6A, $|t_{j_A}| = |t_{k_A}| = |t_{j_B}| = |t_{k_B}| = t$, which simplifies the expressions for B and C to $$B = \delta_0^2 + 8t^2 \quad \text{and} \quad C = 8t^4\left(1 - p_{j_A k_A; j_B k_B}\cos\theta\right).$$

The energy E and the detuning energy $\delta_0$ are both divided by t in the plots shown in FIG. 6A. A first plot 60 shows the energy bands when $\theta = 0$, a second plot 62 shows the energy bands when $\theta = \pi/8$, a third plot 64 shows the energy bands when $\theta = \pi/4$, and a fourth plot 66 shows the energy bands when $\theta = \pi/2$. The plots 60, 62, 64, and 66 each show a plurality of positive parity response signals 41A and a plurality of negative parity response signals 41B. The positive parity response signals 41A correspond to the parity $p_{j_A k_A; j_B k_B} = +1$ and the negative parity response signals 41B correspond to the parity $p_{j_A k_A; j_B k_B} = -1$. In each of the plots shown in FIG. 6A, two additional energy bands at E=0 are omitted in order to avoid congestion.

Since the value of the detuning energy $\delta_0$ is determined by the Majorana island gate voltage $N_g$ and the quantum dot gate voltage $n_g$, the controller 20 may be configured to change the measured location on a curve by modifying the values of the Majorana island gate voltage $N_g$ and the quantum dot gate voltage $n_g$. When a quantum capacitance measurement 38 is performed, the microwave response signal 57 is obtained from a thermally averaged combination of the different energy levels associated with positive parity or negative parity.

In examples in which $N_{g,A}=N_{g,B}=\frac{1}{2}$, $n_{g,1}=n_{g,2}=-\frac{1}{2}$, and $N_{tot}=1$, the first Majorana island 12A and the second Majorana island 12B have the following effective Hamiltonian:

$$H^{(j_Ak_A;j_Bk_B)}_{N_{tot}=1} = \begin{pmatrix} \varepsilon_A & 0 & t_{j_B} & ip_{j_Bk_B}t_{k_B} \\ 0 & \varepsilon_B & t_{j_A} & ip_{j_Ak_A}t_{k_A} \\ t^*_{j_B} & t^*_{j_A} & \varepsilon_{AB1} & 0 \\ -ip_{j_Bk_B}t^*_{k_B} & -ip_{j_Ak_A}t^*_{k_A} & 0 & \varepsilon_{AB2} \end{pmatrix}$$

In this effective Hamiltonian, the baseline energy $E_0$ discussed above is subtracted from the diagonal entries. The diagonal entries have the following values:

$$\varepsilon_A = -2E_{C,A}\left(N_{g,A} - \frac{1}{2}\right)$$

$$\varepsilon_B = -2E_{C,B}\left(N_{g,B} - \frac{1}{2}\right)$$

$$\varepsilon_{AB1} = -2E_{C,A}\left(N_{g,A} - \frac{1}{2}\right) - 2E_{C,B}\left(N_{g,B} - \frac{1}{2}\right) + 2\varepsilon_{C,1}\left(n_{g,1} + \frac{1}{2}\right)$$

$$\varepsilon_{AB2} = -2E_{C,A}\left(N_{g,A} - \frac{1}{2}\right) - 2E_{C,B}\left(N_{g,B} - \frac{1}{2}\right) + 2\varepsilon_{C,2}\left(n_{g,2} + \frac{1}{2}\right) -$$

$$3E_C\left(N_g - \frac{1}{2}\right) + \varepsilon_C\left(n_g + \frac{1}{2}\right)$$

When the parameter symmetrization $E_{C,A}=E_{C,B}=E_C$, $\varepsilon_{C,1}=\varepsilon_{C,2}=\varepsilon_C$, $N_{g,A}=N_{g,B}=N_g$, and $n_{g,1}=n_{g,2}=n_g$ is applied in the $N_{tot}=1$, as was applied above in the $N_{tot}=0$ case, the following energies are obtained:

$$E = -\sqrt{\left(\frac{\delta_0}{2}\right)^2 + \frac{b + \sqrt{b^2 - 4c}}{2}}, \; -\sqrt{\left(\frac{\delta_0}{2}\right)^2 + \frac{b - \sqrt{b^2 - 4c}}{2}},$$

$$\sqrt{\left(\frac{\delta_0}{2}\right)^2 + \frac{b - \sqrt{b^2 - 4c}}{2}}, \; \sqrt{\left(\frac{\delta_0}{2}\right)^2 + \frac{b + \sqrt{b^2 - 4c}}{2}}$$

where $$b = |t_{j_A}|^2 + |t_{k_A}|^2 + |t_{j_B}|^2 + |t_{k_B}|^2$$

$$c = |t_{j_A}|^2|t_{k_B}|^2 + |t_{k_A}|^2|t_{j_B}|^2 - 2p_{j_Ak_A;j_Bk_B}|t_{j_A}t_{k_A}t_{j_B}t_{k_B}|\cos\theta$$

$$\delta_0 = -2E_C\left(N_g - \frac{1}{2}\right) + 2\varepsilon_C\left(n_g + \frac{1}{2}\right)$$

Figure 6B:
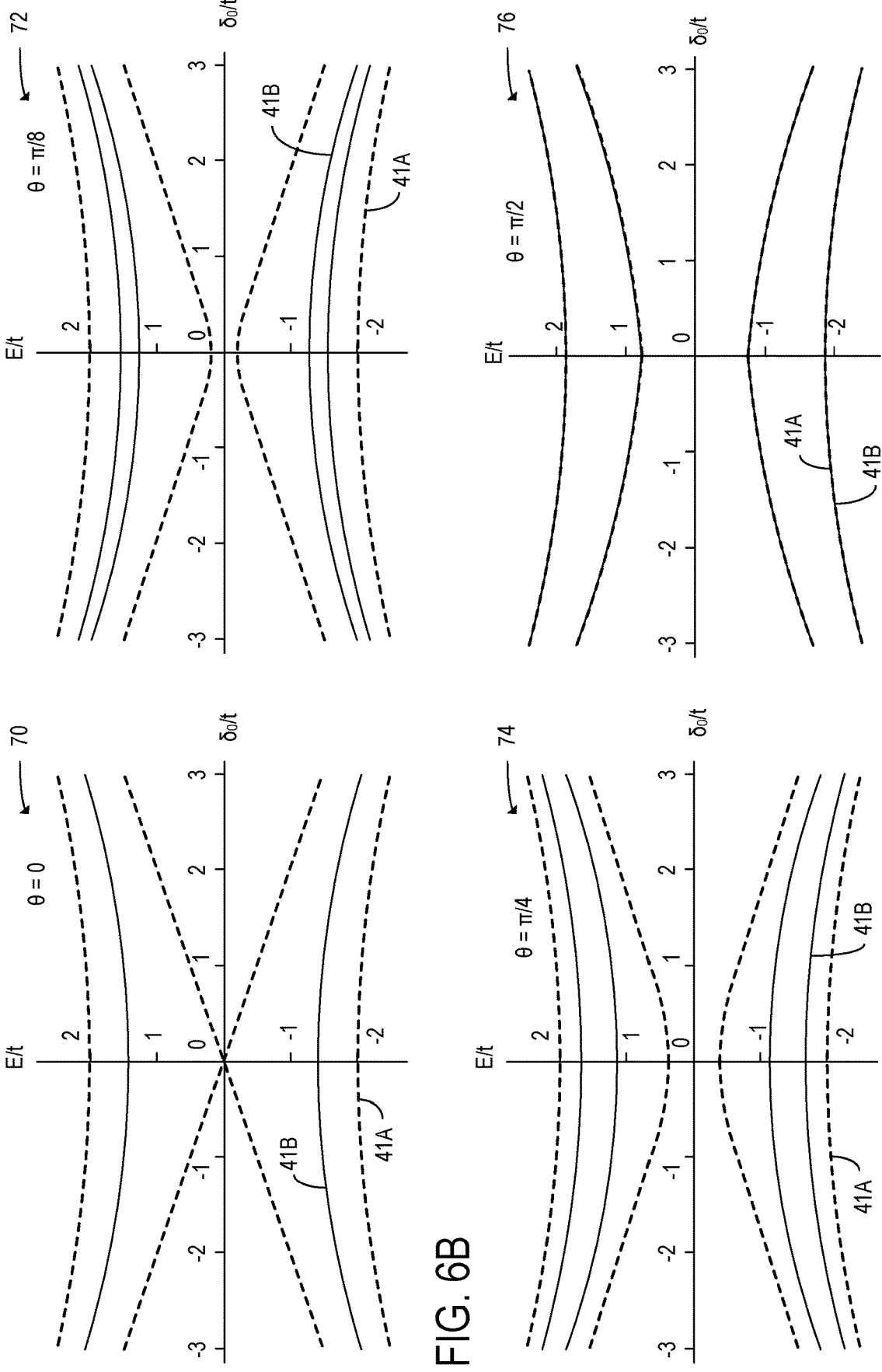
FIG. 6B schematically shows plots of the energy of the island-dot system as a function of a detuning energy for a plurality of different interference phase values when the change in the fermion number equals one, according to the example of FIG. 3.

FIG. 6B shows plots of the energy E of the island-dot system 11B of FIG. 3 as a function of the detuning energy $\delta_0$ for different values of $\theta$ when $N_{tot}=1$. In the plots shown in FIG. 6B, $|t_{j_A}|=|t_{k_A}|=|t_{j_B}|=|t_{k_B}|=t$, which simplifies the expressions for b and c to $b=4t^2$ and $c=2t^4(1-p_{j_Ak_A;j_Bk_B}\cos\theta)$. The energy E and the detuning energy $\delta_0$ are both divided by t in the plots shown in FIG. 6B. A first plot 70 shows the energy bands when $\theta=0$, a second plot 72 shows the energy bands when $\theta=\pi/8$, a third plot 74 shows the energy bands when $\theta=\pi/4$, and a fourth plot 76 shows the energy bands when $\theta=\pi/2$. The positive parity response signals 41A in each of the first plot 70, the second plot 72, the third plot 74, and the fourth plot 76 correspond to the parity $p_{j_Ak_A;j_Bk_B}=+1$ and the negative parity response signals 41B correspond to the parity $p_{j_Ak_A;j_Bk_B}=-1$. As shown in the example of FIG. 6B, QPP changes the positive parity response signals 41A and the negative parity response signals 41B relative to those in FIG. 6A. As such, even though there is still a resonance at $N_{g,A}=N_{g,B}=N_g$ and $n_{g,1}=n_{g2}=n_g$ for $N_{tot}=1$, the microwave response signal 57 may be weaker and provide reduced distinguishability between the different parity values, as compared to those of $N_{tot}=0$ at the same point in parameter space.

Figure 7A:
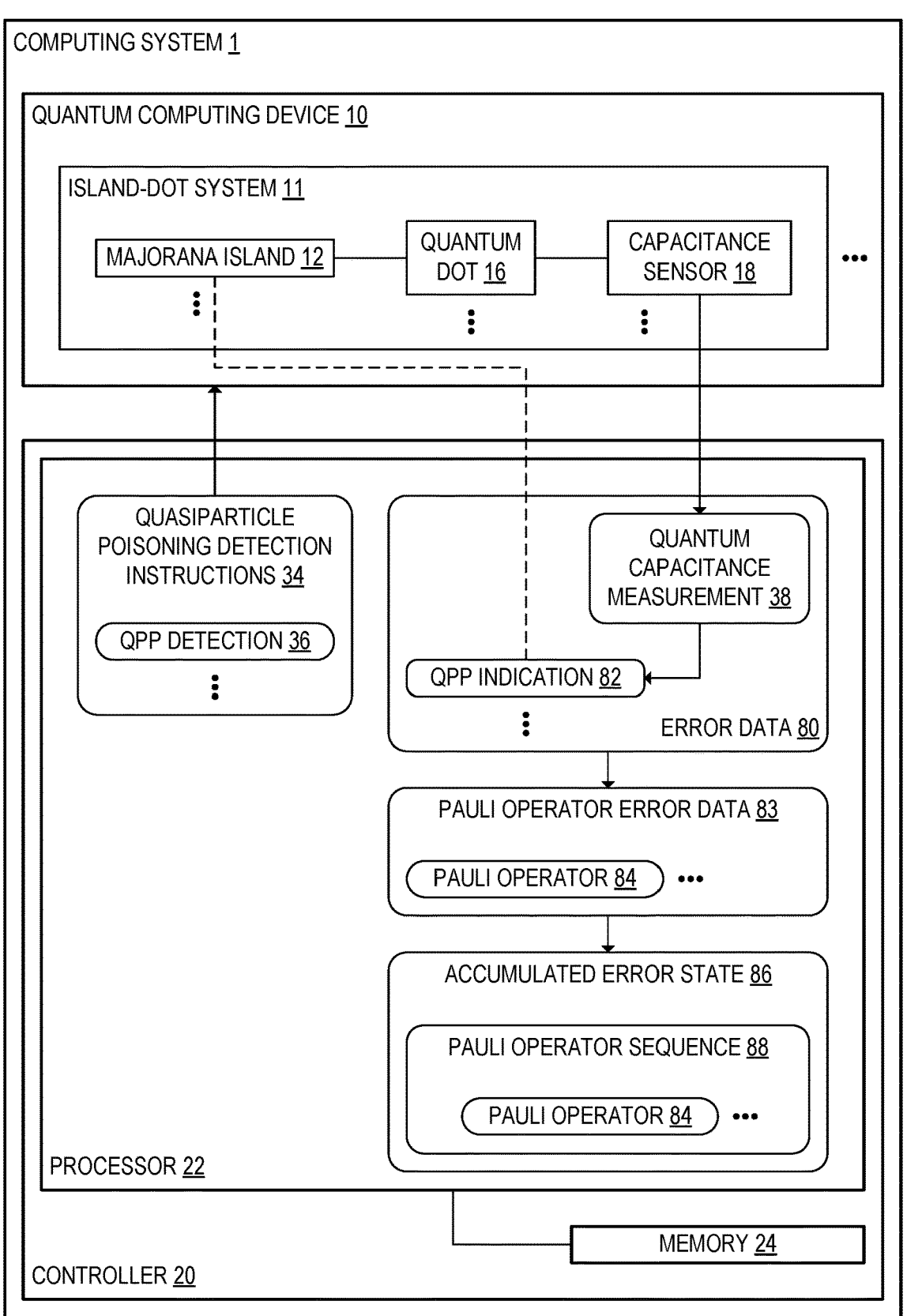
FIG. 7A schematically shows the computing system when quasiparticle poisoning detection is performed at the quantum computing device, according to the example of FIG. 1.

FIG. 7A schematically shows the computing system 1 when QPP detection 36 is performed at the quantum computing device 10. The quantum computing device 10 is configured to perform the QPP detection 36 at the one or more Majorana islands 12 to thereby generate error data 80. The controller 20 is further configured to receive the error data 80 from the quantum computing device 10. The error data 80 includes one or more QPP indications 82 associated with the one or more Majorana islands 12 at which the joint parity measurement 32 is performed. As shown in the example of FIG. 7A, the controller 20 may be configured to compute the one or more QPP indications 82 based at least in part on a plurality of quantum capacitance measurements 38 received from the capacitance sensor 18 when the QPP detection 36 is performed. In such examples, the one or more QPP indications 82 may include one or more indications of the change in fermion number $N_{tot}$ of the island-dot system 11. A QPP indication 82 may, in some examples, include indications of the changes in the fermion numbers $N_{tot}$ of a plurality of island-dot systems 11. In examples in which the capacitance sensor 18 detects that QPP has not occurred at the island-dot system 11, the error data 80 indicates that no intercomponent QPP error is associated with the joint parity measurement 32.

In addition to the one or more QPP indications 82, the error data 80 may further include one or more indications of the one or more joint parity measurements 32 performed prior to the QPP detection 36. The error data 80 may further include indications of which MZMs 14 were used in the one or more joint parity measurements 32. The QPP indications 82 may, in some examples, be expressed in terms of the respective fermion numbers of the one or more Majorana islands 12 before and after each of the joint parity measurements 32.

Based at least in part on the error data 80, the controller 20 is further configured to compute Pauli operator error data 83. The Pauli operator error data 83 may specify a Pauli operator 84 applied to one or more qubits encoded in the one or more Majorana islands 12 by a QPP event indicated in the QPP indication 82. In examples in which no intercomponent QPP error has occurred at the island-dot system 11, as detected by the capacitance sensor 18, the Pauli operator error data 83 may indicate an identity operator associated with the corresponding joint parity measurement 32. Computation of the Pauli operator error data 83 is discussed in further detail below.

Based at least in part on the error data 80 the controller 20 is further configured to update an accumulated error state 86 of the one or more Majorana islands 12 at which the joint parity measurement 32 is performed. The accumulated error state 86 is configured to store respective error data 80, or information computed by further processing the error data 80, for a plurality of joint parity measurements 32. Thus, the accumulated error state 86 tracks intercomponent QPP errors over a plurality of joint parity measurements 32 included in a quantum computation or error correction code.

Figure 7B:
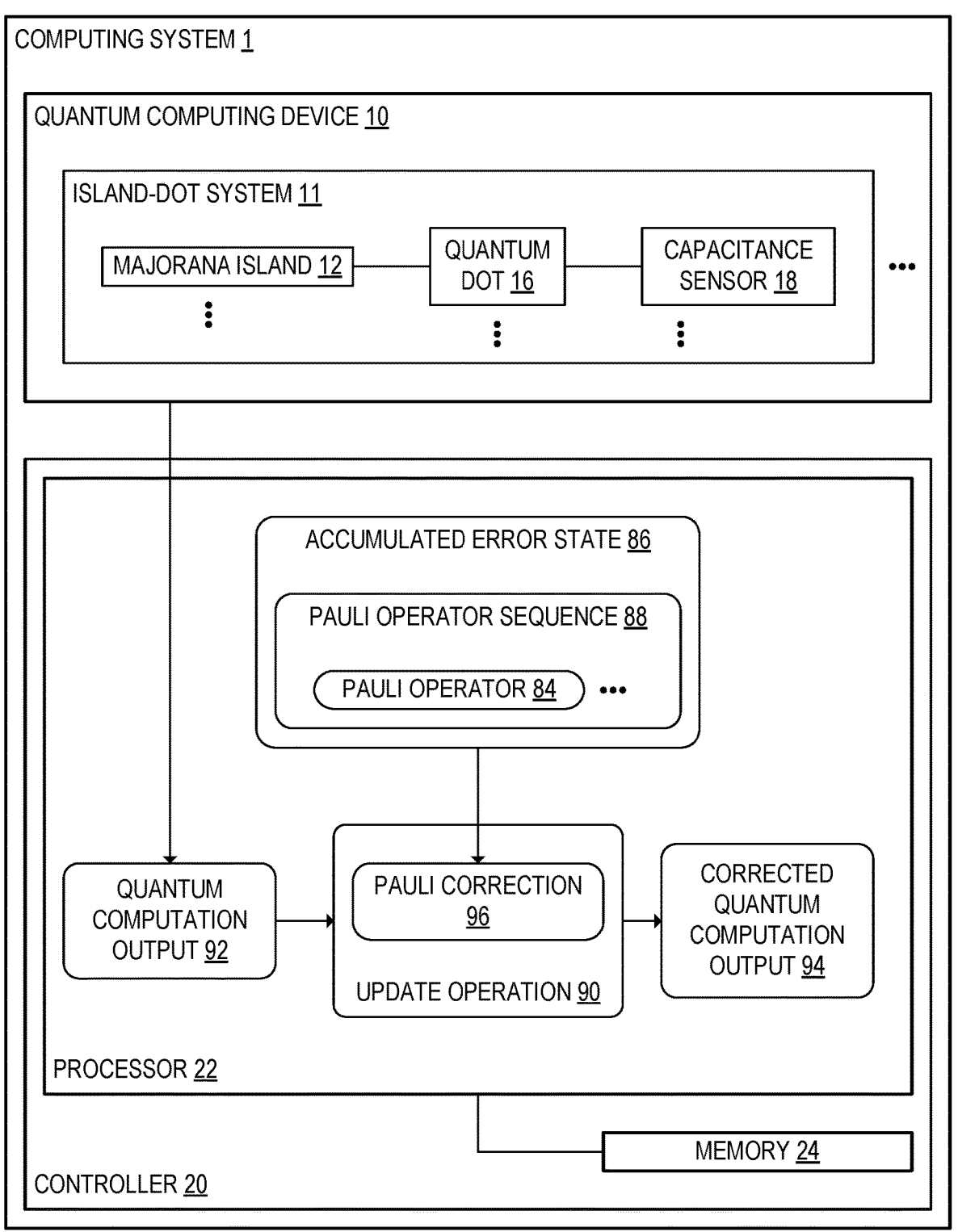
FIG. 7B schematically shows the computing system when the controller is configured to perform an update operation, according to the example of FIG. 7A.

The controller 20 is further configured to perform an update operation 90 based at least in part on the accumulated error state 86, as shown in the example of FIG. 7B. In the example of FIG. 7B, the controller 20 is further configured to receive a quantum computation output 92 from the quantum computing device 10. The update operation 90 shown in this example includes correcting the quantum computation output 92 at the controller 20 based at least in part on the accumulated error state 86 to thereby generate a corrected quantum computation output 94. The controller 20 is configured to apply, to the quantum computation output 92, a Pauli correction 96 that acts as the inverse of the Pauli operator sequence 88 encoded in the accumulated error state 86. Accordingly, the controller 20 is configured to correct the quantum computation output 92 for intercomponent QPP.

Figure 7C:
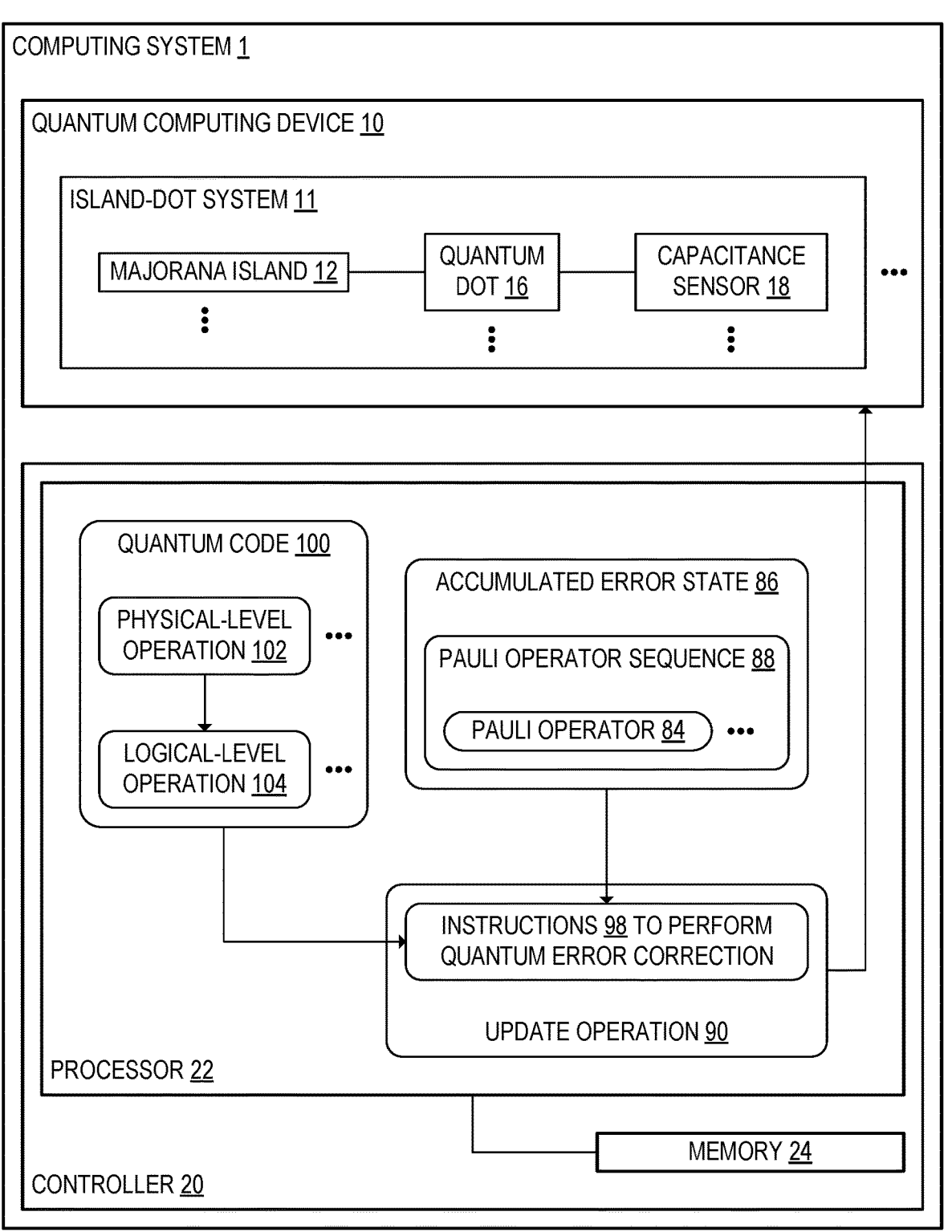
FIG. 7C schematically shows the computing system when the controller is configured to transmit, to the quantum computing device, instructions to perform quantum error correction, according to the example of FIG. 7A.

FIG. 7C shows another example of an update operation 90. In the example of FIG. 7C, the update operation 90 includes transmitting instructions 98 to perform quantum error correction to the quantum computing device 10. The controller 20 is configured to generate the instructions 98 based at least in part on the accumulated error state 86. As shown the example of FIG. 7C, the quantum computing device 10 is configured to implement a quantum code 100 that maps a plurality of sets of physical-level operations 102 performed on physical qubits to respective logical-level operations 104 performed on logical qubits. The controller 20 may be configured to generate the instructions 98 based at least in part on the quantum code 100, such that the quantum error correction accurately maps a modification of the state of the physical qubits to a correction performed on the logical qubits.

Figure 8:
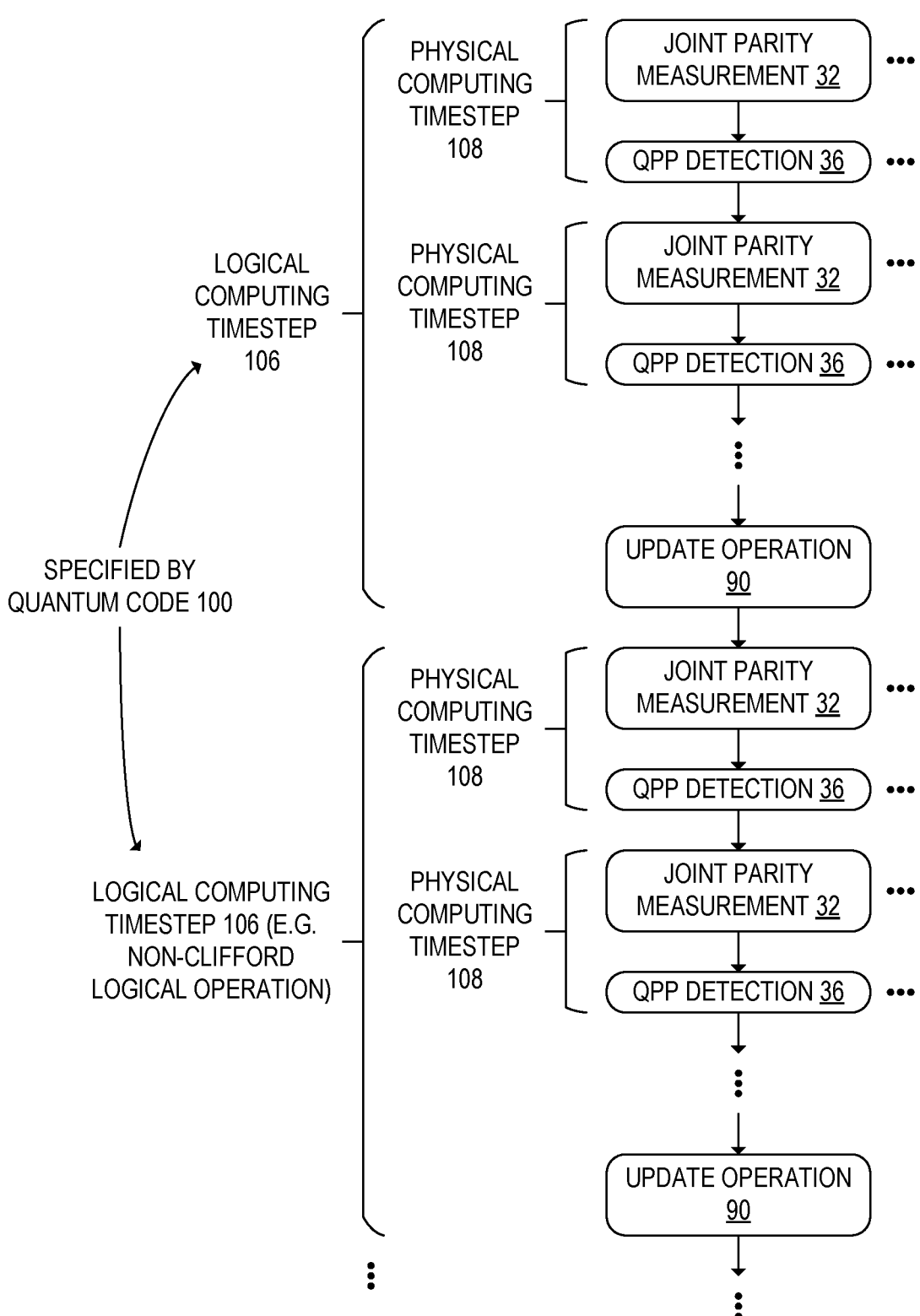
FIG. 8 schematically shows a plurality of logical computing timesteps that each include a respective plurality of physical computing timesteps, according to the example of FIG. 7A.

FIG. 8 schematically shows a plurality of logical computing timesteps 106 and a plurality of physical computing timesteps 108 that may be performed at the computing system 1 in the example of FIGS. 7A-7C. Each of the logical computing timesteps 106 is a timestep in which a logical-level operation 104 specified by the quantum code 100 is performed. During each logical computing timestep 106, the controller 20 is configured to control the quantum computing device 10 to perform a plurality of physical computing timesteps 108. The physical computing timesteps 108 include respective joint parity measurements 32 and quasiparticle poisoning detections 36. Each of the physical computing timesteps 108 is performed at one or more ensembles of physical qubits that each encode a logical qubit. In each of the logical computing timesteps 106, a logical operation on one or more of the logical qubits is constructed using the plurality of joint parity measurements 32 performed at the physical level.

During each of the physical computing timesteps 108, the controller 20 may be further configured to control the quantum computing device 10 to perform a plurality of joint parity measurements 32 in parallel. In addition, the controller 20 may be further configured to control the quantum computing device 10 to perform a corresponding plurality of QPP detections 36 in parallel. Thus, the joint parity measurements 32 and QPP detections 36 may be performed in a time-efficient manner at the ensemble of physical qubits that forms the one or more logical qubits.

During the logical computing timestep 106, the controller 20 is further configured to perform the update operation 90 subsequently to the plurality of physical computing timesteps 108. In some examples in which quantum error correction is performed at the quantum computing device 10, as shown in FIG. 7C, the controller 20 may be configured to perform the update operation 90 subsequently to a physical computing timestep 108 of the plurality of physical computing timesteps 108 that is immediately prior to a non-Clifford logical operation. The non-Clifford logical operation is performed in the second logical computing timestep 106 shown in the example of FIG. 8. Since the order of Pauli gates and other Clifford gates may be interchanged, up to a possible update of the Pauli gates, the quantum error correction may be delayed until any step of the quantum computation prior to the non-Clifford logical operation. In some examples, the correction may include performing a Clifford logical operation subsequent to the non-Clifford logical operation. In an example in which a T-gate non-Clifford logical operation is performed, the correction may include applying a logical Clifford S gate following the T-gate non-Clifford logical operation. By delaying the quantum error correction, the computing system 1 may avoid having to perform update operations 90 to correct for additional QPP events that occur subsequently to the quantum error correction performed in the logical computing timestep 106.

Formalism is provided below that describes the effects of QPP on the quantum states of the Majorana islands 12 and further describes the computation of the Pauli operator sequence 88. This formalism is provided according to examples in which the Majorana islands 12 are Majorana tetrons but may also be applied to Majorana islands 12 that include other numbers of MZMs 14. In the following examples, a two-qubit measurement is performed on two MZMs 14 from each of a first Majorana tetron and a second Majorana tetron, as shown in the example of FIG. 3. The Majorana tetrons are labeled A and B. The corresponding MZMs are labeled as $j_A$, $k_A$, $j_B$, and $k_B$, where $j_A$, $k_A$, $j_B$, $k_B \in \{1,2,3,4\}$, and none of these MZM numbers are repeated on a given Majorana tetron.

The joint parity measurement 32 on the MZMs $j_A$, $k_A$, $j_B$, and $k_B$ is performed by measuring the joint fermion parity operator $-\gamma_{j_A}\gamma_{j_B}\gamma_{k_A}\gamma_{k_B}$ associated with the MZMs 14. The joint fermion parity operator $-\gamma_{j_A}\gamma_{j_B}\gamma_{k_A}\gamma_{k_B}$ corresponds to a two-qubit Pauli operator $Q_{(j_A k_A)}Q_{(j_B k_B)}$ on the pair of qubits encoded by the MZMs. In order to perform the measurement of the joint fermion parity operator $-\gamma_{j_A}\gamma_{j_B}\gamma_{k_A}\gamma_{k_B}$, the MZMs 14 of the Majorana islands are coupled pairwise in a manner that forms the interference loop 55 as a closed, non-self-intersecting measurement loop. The MZMs $\gamma_{j_A}$ and $\gamma_{j_B}$ are coupled to each other through a first coupling path, and $\gamma_{k_A}$ and $\gamma_{k_B}$ are coupled to each other through a second coupling path included in the interference loop 55.

The eigenstates of the two-tetron system discussed above are adiabatically connected to eigenstates of the joint fermion parity operator $-\gamma_{j_A}\gamma_{j_B}\gamma_{k_A}\gamma_{k_B}$. The measurement projects the two-tetron system to an eigenstate, which results in a fermion parity eigenstate after adiabatic decoupling of the tetrons. When the two-tetron system is in an initial state $\rho$, and when no errors occur, a measurement with an outcome s produces the following post-measurement and post-decoupling state:

$$\rho' = \frac{\Pi_s \rho \Pi_s}{Tr(\Pi_s \rho)}$$

In the above equation, $\Pi_s$ is a projection operator given by:

$$\Pi_s^{(j_A k_A; j_B k_B)} = \frac{1}{2}\left(1 - s\gamma_{j_A}\gamma_{k_A}\gamma_{j_B}\gamma_{k_B}\right) = \frac{1}{2}\left(1 + sQ_{(j_A k_A)}Q_{(j_B k_B)}\right)$$

Figures 9A, 9B:
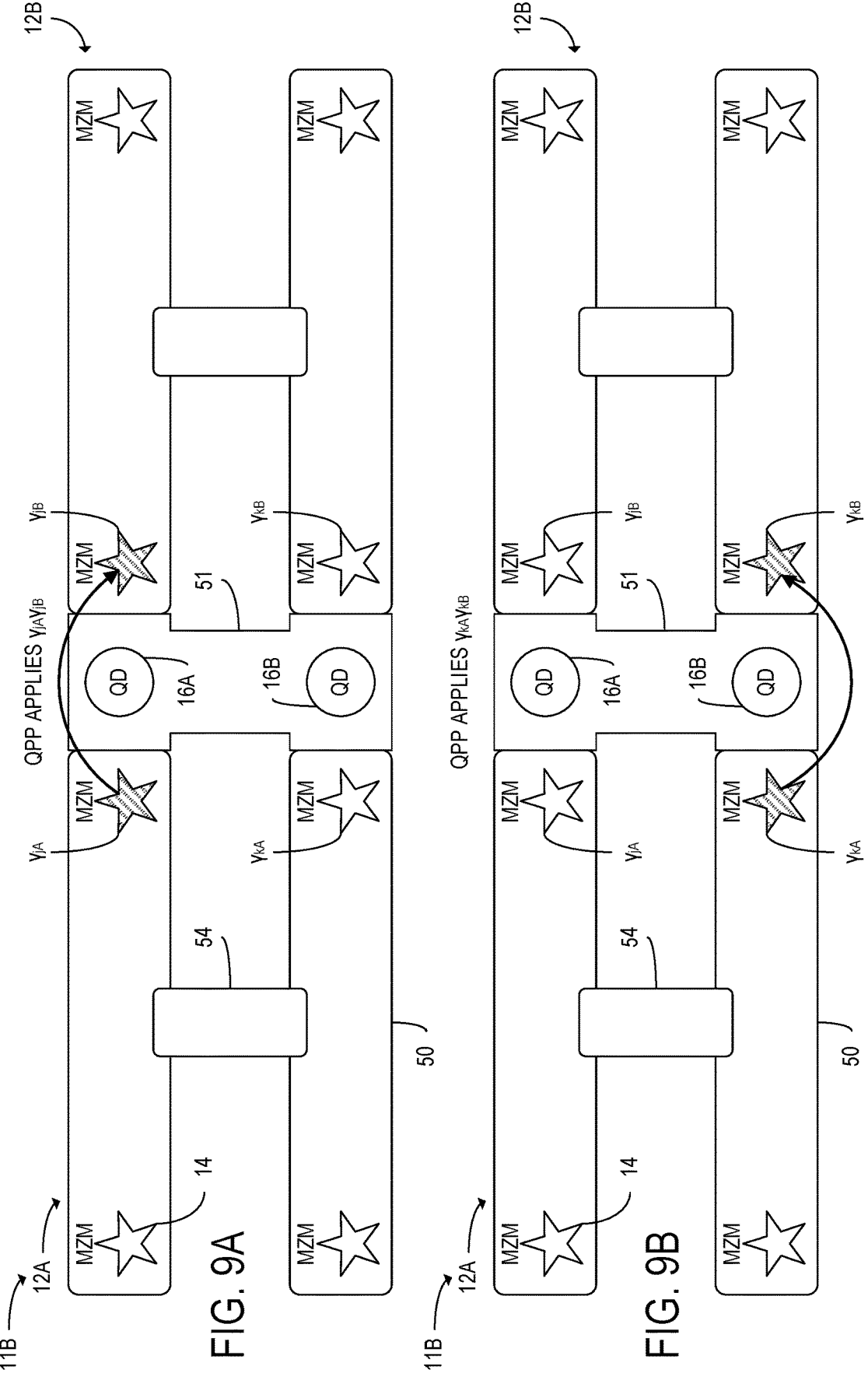
FIGS. 9A-9B show examples of quasiparticle poisoning between Majorana zero modes of the Majorana islands included in the island-dot system, according to the example of FIG. 3.

When the tetrons are decoupled following the measurement of the joint fermion parity operator $-\gamma_{j_A}\gamma_{j_B}\gamma_{k_A}\gamma_{k_B}$, as discussed above, intercomponent quasiparticle poisoning may occur, as depicted in the example of FIGS. 9A-9B. FIGS. 9A-9B show the example island-dot system 11 of FIG. 3 when QPP occurs. In the example of FIG. 9A, a fermion is transferred from MZM $\gamma_{j_A}$ of the first Majorana island 12A to the MZM $\gamma_{j_B}$ of the second Majorana island 12B. In the example of FIG. 9B, a fermion is transferred from MZM $\gamma_{k_A}$ of the first Majorana island 12A to the MZM $\gamma_{k_B}$ of the second Majorana island 12B.

Subsequently to decoupling the Majorana islands 12A and 12B as shown in FIG. 4A, the fermion numbers of the components (e.g., tetrons, QDs, and/or coherent links) of the decoupled system exhibit a thermal distribution with respect to the corresponding energies of the components. A fermion transferred to or from a Majorana tetron may enter or leave the Majorana tetron via one of the MZMs 14 of the tetron that are coupled to a QD 16. Alternatively, the fermion may enter a Majorana island 12 as an above-gap quasiparticle that is approximately equally likely to relax into any of the MZMs 14. Such relaxation costs an energy Δ before measurement and an energy $E_C$ after measurement.

When the fermion number of a Majorana tetron changes by an odd integer as a result of QPP, that change in fermion number has an effect of applying a Pauli operator 84 to the qubit encoded at the tetron. The particular Pauli operator 84 that QPP applies is determined by the particular MZM 14 through which the fermion transfer occurs. The Pauli operator 84 is also correlated with one or more other operations applied to one or more other corresponding components of the quantum computing device 10, which may be one or more tetrons, QDs, and/or coherent links.

Below, the charging energies of the QDs 16 and the coherent links are assumed to be much larger than the charging energies of the tetron islands. Accordingly, changes in the fermion numbers n of the QDs 16 and the coherent links are treated as fixed, whereas the fermion numbers N of the tetron islands may change. With this assumption, the QPP events transfer a fermion from one tetron to the other, and do so between either pair of coupled MZMs. The above description of the effects of QPP may be generalized to cases in which the fermion numbers of any of the components may change, given corresponding sensors configured to measure the fermion numbers of such components. For example, at a coherent link, a QPP detection measurement may be performed to determine whether the fermion number of the coherent link changes as a result of a joint parity measurement 32 or other process performed at the coherent link.

When a fermion enters or leaves a tetron island through the jth MZM, the corresponding Majorana operator $\gamma_j$ is applied to the two-tetron state. This Majorana operator $\gamma_j$ flips the total parity of the tetron island and applies a Pauli operator 84 to the encoded qubit according to $\gamma_j \rightarrow P_j$. The Pauli operators 84 are indicated here as $P_1 = X$, $P_2 = Y$, $P_3 = Z$, and $P_4 = I$. A process that transfers a fermion between MZMs $j_A$ and $j_B$ therefore applies the operator $\gamma_{j_A}\gamma_{j_B}$ to the two-tetron state, as shown in the example of FIG. 9A. Similarly, a process that transfers a fermion between MZMs $k_A$ and $k_B$ applies the operator $\gamma_{k_A}\gamma_{k_B}$, as shown in the example of FIG. 9B. The post-measurement and post-decoupling state of the two-tetron system is accordingly given by:

$$\rho'' = p_0\rho' + p_1\gamma_{j_A}\gamma_{j_B}\rho'\gamma_{j_B}\gamma_{j_A} = p_0\rho' + p_1\gamma_{k_A}\gamma_{k_B}\rho'\gamma_{k_B}\gamma_{k_A}$$

where $p_0$ and $p_1$ are respective probabilities that an even or odd number of fermions are transferred between the tetrons.

The above equation for ρ" may be rewritten in a form that includes terms corresponding to fermion transfer through either of the coupling paths. In addition, the rewritten equation for ρ" may include terms that account for coherence between fermion transfer processes. The post-measurement, post-decoupling state is accordingly given by:

$$\rho'' = \frac{1}{\lambda_0 + \lambda_1}\left(\lambda_{I,I}\rho' + \lambda_{I,jk}\rho'\gamma_{k_B}\gamma_{k_A}\gamma_{j_B}\gamma_{j_A} + \lambda_{jk,I}\gamma_{j_A}\gamma_{j_B}\gamma_{k_A}\gamma_{k_B}\rho' + \right.$$
$$\lambda_{jk,jk}\gamma_{j_A}\gamma_{j_B}\gamma_{k_A}\gamma_{k_B}\rho'\gamma_{k_B}\gamma_{k_A}\gamma_{j_B}\gamma_{j_A} + \lambda_{j,j}\gamma_{j_A}\gamma_{j_B}\rho'\gamma_{j_B}\gamma_{j_A} +$$
$$\left.\lambda_{j,k}\gamma_{j_A}\gamma_{j_B}\rho'\gamma_{k_B}\gamma_{k_A} + \lambda_{k,j}\gamma_{k_A}\gamma_{k_B}\rho'\gamma_{j_B}\gamma_{j_A} + \lambda_{k,k}\gamma_{k_A}\gamma_{k_B}\rho'\gamma_{k_B}\gamma_{k_A}\right)$$

where $$\lambda_0 = \lambda_{I,I} + \lambda_{jk,jk} + 2Re(\lambda_{I,jk})Tr\left(-\gamma_{j_A}\gamma_{k_A}\gamma_{j_B}\gamma_{k_B}\rho'\right)$$
$$\lambda_1 = \lambda_{j,j} + \lambda_{k,k} + 2Re(\lambda_{jk})Tr\left(-\gamma_{j_A}\gamma_{k_A}\gamma_{j_B}\gamma_{k_B}\rho'\right)$$

The first three terms of the rewritten equation for ρ" correspond to even numbers of fermions transferred between the tetron islands, whereas the last three terms correspond to transfer of odd numbers of fermions. Coherence between transfer of even numbers of fermions and odd numbers of fermions does not occur, since even and odd numbers of transferred fermions correspond to different charge sectors of the decoupled tetron islands, which are assumed to rapidly decohere.

In the above equations for $\lambda_0$ and $\lambda_1$, $\lambda_{k,j} = \lambda_{j,k}{}^*$ and $\lambda_{I,jk} = \lambda_{jk,I}{}^*$. In addition, $2|\lambda_{I,jk}| \leq \lambda_{I,I} + \lambda_{jk,jk}$ and $2|\lambda_{j,k}| \leq \lambda_{j,j} + \lambda_{k,k}$ in order for $\lambda$ to be a properly defined superoperator. In the above equations and inequalities, $\lambda_{k,j}$, $\lambda_{I,jk}$, $\lambda_{I,I}$, and $\lambda_{jk,jk}$ are parameters of the superoperator that describes the QPP event. The off-diagonal terms (nonzero $\lambda_{j,k}$ or $\lambda_{I,jk}$) represent coherence between the processes by which fermions are transferred through the two coupling paths. As such, the phase of $\lambda_{j,k}$ and $\lambda_{I,jk}$ may be modulated, for example, by varying the flux that passes through the interference loop 55. The probabilities of even and odd numbers of fermions being transferred are given by:

$$p_0 = \frac{\lambda_0}{\lambda_0 + \lambda_1}$$
$$p_1 = \frac{\lambda_1}{\lambda_0 + \lambda_1}$$

Higher-order terms do not occur in the equations for $p_0$ and $p_1$, since $(\gamma_{j_A}\gamma_{j_B})^2 = -1$.

The rewritten equation for ρ" may be simplified by utilizing the fact that ρ' is a post-measurement state. Thus, the following properties are satisfied:

$$\gamma_{j_A}\gamma_{j_B}\gamma_{k_A}\gamma_{k_B}\Pi_s{}^{(j_Ak_A:j_Bk_B)} = s\Pi_s{}^{(j_Ak_A:j_Bk_B)}$$
$$\gamma_{j_A}\gamma_{j_B}\Pi_s{}^{(j_Ak_A:j_Bk_B)} =$$
$$\gamma_{j_A}\gamma_{j_B}[s(\gamma_{j_A}\gamma_{j_B}\gamma_{k_A}\gamma_{k_B})]\Pi_s{}^{(j_Ak_A:j_Bk_B)} = -s\gamma_{k_A}\gamma_{k_B}\Pi_s{}^{(j_Ak_A:j_Bk_B)}$$

The post-measurement, post-decoupling state ρ" has the above properties when the joint parity measurement 32 successfully returns a joint parity value 39 and hence applies the projector to the quantum state. In examples in which the joint parity measurement 32 is a failed or ambiguous measurement, the above properties may not be satisfied. The above properties allow $\lambda_0$ and $\lambda_1$ to be simplified as follows:

$$\lambda_0 = \lambda_{I,I} + \lambda_{jk,jk} + 2sRe(\lambda_{I,jk})$$

$$\lambda_1 = \lambda_{j,j} + \lambda_{k,k} + 2sRe(\lambda_{j,k})$$

In the above equations for $\lambda_0$ and $\lambda_1$, the contributions of the interference terms depend on the measurement outcome s. In addition, the above equations for $\lambda_0$ and $\lambda_1$ allow for $p_1=0$ when $|\lambda_{jj}|=|\lambda_{kk}|=|\lambda_{jk}|$. This result of $p_1=0$ depends on the measurement outcome, and the opposite measurement outcome maximizes the value of $p_1$ for such parameter values. The post-measurement, post-decoupling state is given as follows in terms of the encoded qubits $\rho_q$ and the island parities $[N_A]_2$ and $[N_B]_2$ prior to measurement (where $[N]_2=N \bmod 2$):

$$\rho'' = \frac{p_0}{Tr(\Pi_s \rho)} \Pi_s^{(j_A k_A ; j_B k_B)} \rho_q \Pi_s^{(j_A k_A ; j_B k_B)} \otimes |[N_A]_2, [N_B]_2\rangle\langle[N_A]_2, [N_B]_2| + $$

$$\frac{p_1}{Tr(\Pi_s \rho)} P_{j_A}^{(A)} P_{j_B}^{(B)} \Pi_s^{(j_A k_A ; j_B k_B)} \rho_q \Pi_s^{(j_A k_A ; j_B k_B)} P_{j_B}^{(B)} $$

$$P_{j_A}^{(A)} \otimes |[N_A+1]_2, [N_B+1]_2\rangle\langle[N_A+1]_2, [N_B+1]_2|$$

As seen from the above equation, for $\rho''$, when the fermion parities of the tetron islands are measured after performing the two-tetron measurement, the QPP error does not decohere the encoded computational state. Since the QPP error does not decohere the qubit state, the error in the qubit state may be tracked and corrected. Specifically, a measurement of the fermion parities of the tetron islands after the two-tetron measurement has potential outcomes corresponding to even and odd changes in fermion number, respectively. When the change in the fermion number is even, the tetron islands have the following state:

$$\rho_0''' = \frac{1}{Tr(\Pi_s \rho)} \Pi_s^{(j_A k_A ; j_B k_B)} \rho_q \Pi_s^{(j_A k_A ; j_B k_B)} \otimes |[N_A]_2, [N_B]_2\rangle\langle[N_A]_2, [N_B]_2|$$

The fermion parity of the tetron islands does not change in such examples. When the change in the fermion number is odd, the tetron islands instead have the following state:

$$\rho_1''' = \frac{1}{Tr(\Pi_s \rho)} P_{j_A}^{(A)} P_{j_B}^{(B)} \Pi_s^{(j_A k_A ; j_B k_B)} \rho_q \Pi_s^{(j_A k_A ; j_B k_B)}$$

$$P_{j_B}^{(B)} P_{j_A}^{(A)} \otimes |[N_A+1]_2, [N_B+1]_2\rangle\langle[N_A+1]_2, [N_B+1]_2|$$

In examples in which the change in the fermion number is odd, the fermion parity of the tetron islands changes.

The above formalism describing the post-measurement, post-decoupling state may be further modified to distinguish between changes in the fermion numbers of the tetron islands even when the parities of the tetron islands do not change. In the following discussion, the total number of fermions transferred from tetron B to tetron A is denoted as v. The post-measurement, post-decoupling state is accordingly given by:

$$\rho'' = \sum_{v\,even} \frac{p_v}{Tr(\Pi_s \rho)} \Pi_s^{(j_A k_A ; j_B k_B)} \rho_q \Pi_s^{(j_A k_A ; j_B k_B)} \otimes |N_A+v, N_B-v\rangle$$

$$\langle N_A+v, N_B-v| + \sum_{v\,odd} \frac{p_v}{Tr(\Pi_s \rho)} P_{j_A}^{(A)} P_{j_B}^{(B)} \Pi_s^{(j_A k_A ; j_B k_B)} \rho_q$$

$$\Pi_s^{(j_A k_A ; j_B k_B)} P_{j_B}^{(B)} P_{j_A}^{(A)} \otimes |N_A+v, N_B-v\rangle\langle N_A+v, N_B-v|$$

Measuring the fermion number of the tetron islands accordingly results in the following state:

$$\rho_v''' = \frac{1}{Tr(\Pi_s \rho)} \Pi_s^{(j_A k_A ; j_B k_B)} \rho_q \Pi_s^{(j_A k_A ; j_B k_B)} \otimes |N_A+v, N_B-v\rangle$$

$$\langle N_A+v, N_B-v|$$

when v is even, and $$\rho_v''' = \frac{1}{Tr(\Pi_s \rho)} P_{j_A}^{(A)} P_{j_B}^{(B)} \Pi_s^{(j_A k_A ; j_B k_B)}$$

$$\rho_q \Pi_s^{(j_A k_A ; j_B k_B)} P_{j_B}^{(B)} P_{j_A}^{(A)} \otimes |N_A+v, N_B-v\rangle\langle N_A+v, N_B-v|$$

when v is odd.

In examples in which the fermion parity does not change when the tetron islands are decoupled, the resulting state is the ideal post-measurement state, as shown in the above equations for $$\rho_v'''.$$

When the fermion parity changes, the resulting state of the two-tetron system is equal to the ideal state modified by a known Pauli operator 84. The value of the Pauli operator 84 is determined by the specific two-tetron measurement that was performed, as discussed in further detail below. In either case, the fermion numbers of the tetron islands are given by $$N_A' = N_A + v \text{ and } N_B' = N_B + v.$$

Thus, the QPP error to the encoded computational state may be corrected by applying the inverse of the Pauli operator 84.

In some examples, as discussed above with reference to FIG. 8, the accumulated error state 86 is tracked over a plurality of physical computing timesteps 108, and the update operation 90 is applied subsequently to a plurality of joint parity measurements 32. In such examples, as shown in FIG. 8, the controller 20 is further configured to control the quantum computing device 10 to perform QPP detection 36 subsequently to each of the plurality of joint parity measurements 32. The controller 20 is further configured to generate the Pauli operator sequence 88 based at least in part on the respective values of the changes in the fermion numbers $N_{tot}$ measured during the QPP detections 36. Accordingly, the controller 20 is configured to iteratively construct the Pauli operator sequence 88 over the plurality of physical computing timesteps 108.

The plurality of QPP detections 36 may be performed without the controller 20 transmitting active feedback instructions to the quantum computing device 10 subsequently to each of the joint parity measurements 32. By not requiring active feedback to track and correct QPP errors, the computing system 1 may utilize a simpler control architecture to control the quantum computing device 10.

When performing the Pauli operator tracking in examples in which the update operation 90 is delayed until after a plurality of physical computing timesteps 108, the controller 20 is configured to utilize the fact that a Pauli operator P may be passed through a Pauli projector $$\Pi_s^{(Q)} = \frac{1}{2}(1 + sQ).$$

The projector label in the above equation is flipped when the Pauli operators P and Q anti-commute. Accordingly, the following equation holds:

$$\Pi_s^{(Q)} P = P\Pi_{\pm s}^{(Q)}$$

As discussed above, the update operation 90 may be delayed until a physical computing timestep 108 immediately prior to a non-Clifford logical operation.

A generalization of the above discussion of two-tetron measurements to measurements of N-Majorana-island systems is provided below. The N-Majorana-island measurement is performed on two MZMs 14 from each of the Majorana islands 12 at which the measurement is performed. The N Majorana islands 12 are labeled herein as $J \in \mathbb{Z}_N$, and the N junctions between the Majorana islands 12 are labeled as $j \in \mathbb{Z}_N$. The 2N MZMs 14 on which the measurement is performed are labeled as $j_1$, such that a pair of MZMs 14 linked by the jth coupling path are labeled $j_J$ and $j_{J+1}$. With the above conventions, the following joint fermion parity operator is measured:

$$\prod_{j=1}^{N} i\gamma_{jJ}\gamma_{jJ+1}$$

As in the example of the two-tetron measurement discussed above, in the N-Majorana-island measurement, the MZMs 14 included in different Majorana islands 12 are coupled pairwise in a manner that forms a non-self-intersecting interference loop 55 using coupling paths that include quantum dots 16.

Figure 10A:
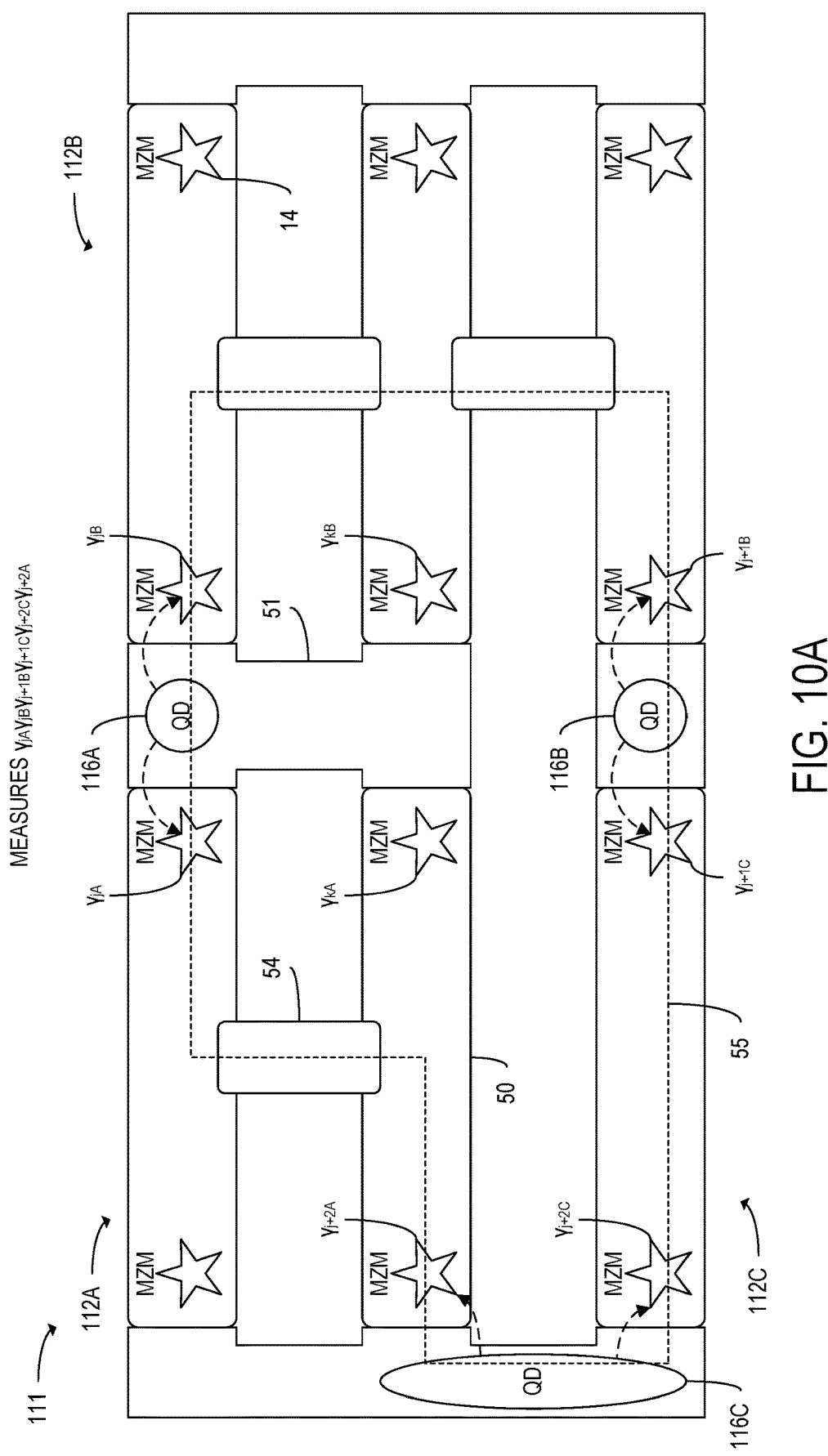
FIGS. 10A-10C show examples of quasiparticle poisoning between Majorana zero modes of the Majorana islands included in another island-dot system, according to the example of FIG. 1.

FIG. 10A shows an example island-dot system 111 that includes a Majorana tetron 112A, a Majorana hexon 112B, and a coherent link 112C. The island-dot system 111 of FIG. 10A is shown when a three-Majorana-island measurement of an operator $\gamma_{j_A}\gamma_{j_B}\gamma_{j+1_B}\gamma_{j+1_C}\gamma_{j+2_C}\gamma_{j+2_A}$ is performed. In the example of FIG. 10A, the Majorana tetron 112A is coupled to the Majorana hexon 112B via a first QD 116A, the Majorana hexon 112B is coupled to the coherent link 112C via a second QD 116B, and the coherent link 112C is coupled to the Majorana tetron via a third QD 116C to thereby form the interference loop 55.

In the N-Majorana-island measurement example, the projection operator is given by:

$$\Pi_s^{\vec{?}} = \frac{1}{2}\left(1 - s\prod_{j=1}^{N} i\gamma_{jJ}\gamma_{jJ+1}\right)$$

A fermion transfer between a Majorana island J and a Majorana island J+V applies one of the following operators:

$$\gamma_{J_J}\gamma_{J_{J+1}} \gamma_{j+1_{J+1}} \gamma_{j+1_{J+2}} \cdots \gamma_{j+v-1_{J+V-1}}\gamma_{j+v-1_{J+V}}$$

$$\text{or } \gamma_{j-1_J}\gamma_{j-1_{J-1}} \gamma_{j-2_{J-1}} \gamma_{j-2_{J-2}} \cdots \gamma_{j+V_{J+V+1}}\gamma_{j+V_{J+V}}$$

The path along which the fermion travels from the Majorana island J to the Majorana island J+V determines which of the above operators is applied by the QPP event. The fermion transfer also updates classical integer values that track the fermion numbers of the Majorana island J and the Majorana island J+V, as discussed in further detail below. The above operators are equivalent, up to a difference of sign, after the projection operator is applied to the state of the N-Majorana-island system.

Figure 10B:
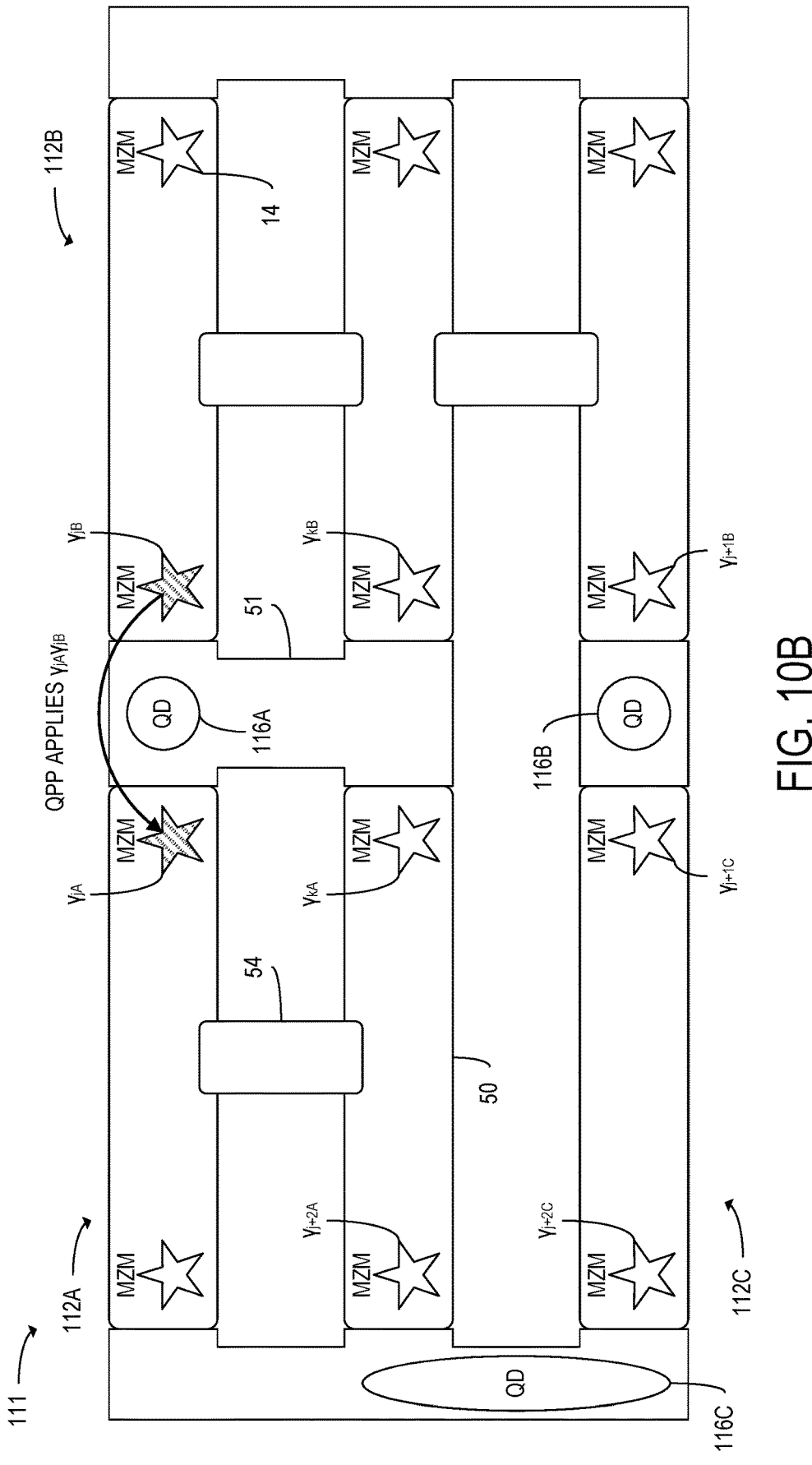
Figure 10C:
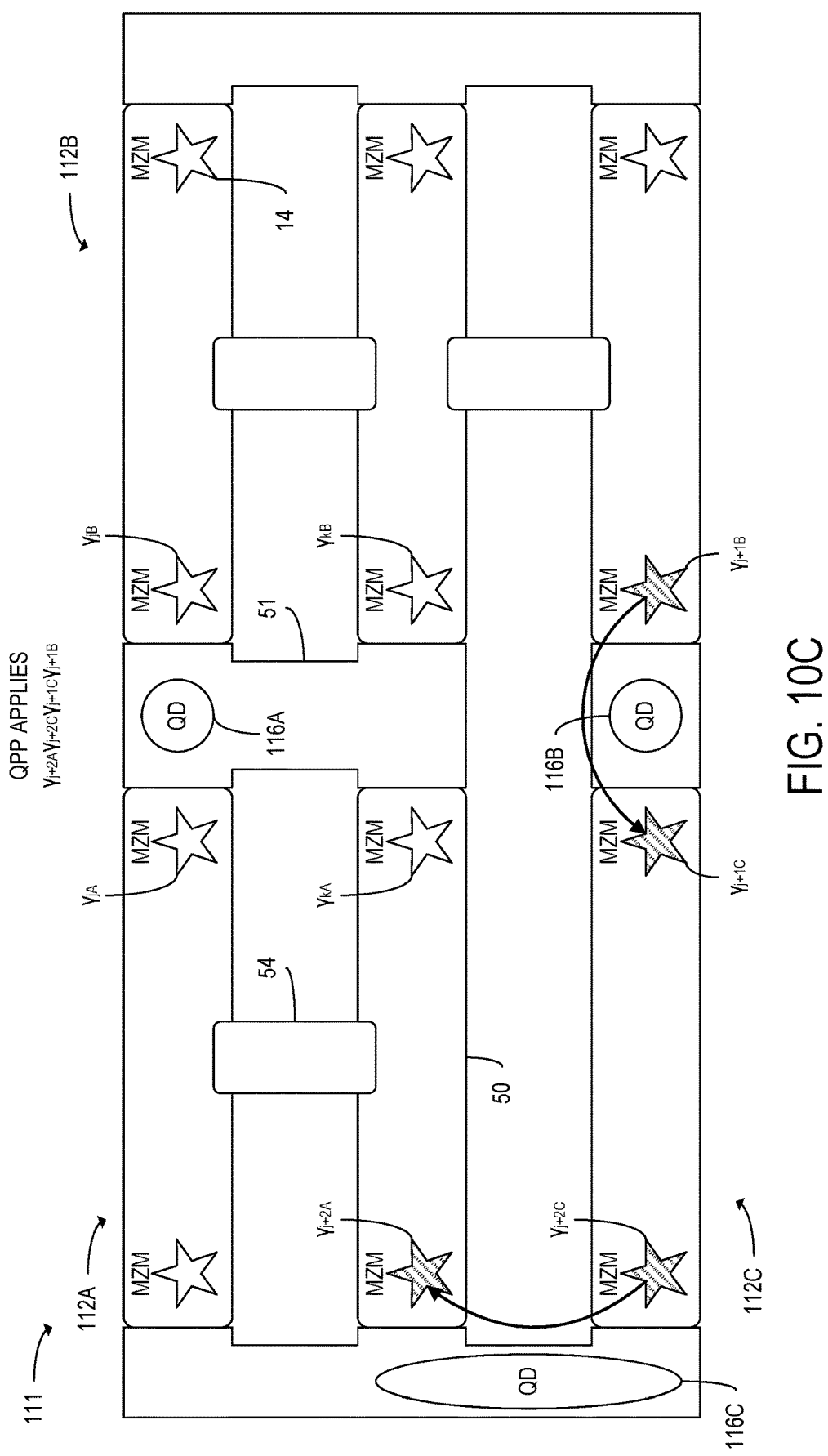

FIGS. 10B-10C show the island-dot system 111 of FIG. 10A in examples in which QPP occurs. In the example of FIG. 10B, QPP occurs between the MZMs $\gamma_{j_A}$ and $\gamma_{j_B}$, which applies the operator $\gamma_{j_A}\gamma_{j_B}$. In the example of FIG. 10C, QPP occurs between the MZMs $\gamma_{j+2_C}$ and $\gamma_{j+2_A}$ and between the MZMs $\gamma_{j+1_B}$ and $\gamma_{j+1_C}$. These two QPP events apply the operator $\gamma_{j+2_A}\gamma_{j+2_C}\gamma_{j+1_C}\gamma_{j+1_B}$ to the island-dot system 111.

The post-measurement, post-decoupling state of an N-Majorana-island system is given by:

$$\rho'' = p_0\rho' +$$

$$p_1\gamma_{J_J}\gamma_{J_{J+1}} \cdots \gamma_{j+v-1_{J+V-1}}\gamma_{j+v-1_{J+V}} \rho' \gamma_{j+V_{J+V}}\gamma_{j+v-1_{J+V-1}} \cdots \gamma_{J_{J+1}}\gamma_{J_J}$$

As in the two-tetron QPP example, $p_0$ is the probability that an even number of fermions are transferred between islands J and J+V, and $p_1$ is the probability that an odd number of fermions are transferred.

The following discussion extends the above description of the effects of QPP to examples in which QD poisoning occurs. In such examples, the Majorana operator corresponding to intercomponent QPP is no longer guaranteed to involve an even number of MZMs 14. Fermion transfer may occur between a Majorana island 12 and a QD 16, or between a pair of QDs 16. In examples in which fermion transfer occurs between a Majorana island J and a QD k that forms the kth coupling junction between Majorana islands K and K+1, the fermion transfer applies one of the following operators:

$$\gamma_{J_J}\gamma_{J_{J+1}} \gamma_{j+1_{J+1}} \gamma_{j+1_{J+2}} \cdots \gamma_{k_K}$$

$$\text{or } \gamma_{j-1_J}\gamma_{j-1_{J-1}} \gamma_{j-2_{J-1}} \gamma_{j-2_{J-2}} \cdots \gamma_{k_{K+1}}$$

The above operators are equivalent, up to a difference of sign, after the projection operator is applied to the state of the N-Majorana-island system. The path along which the fermion travels during the QPP event determines which of the above operators the QPP event applies.

QPP may also result in a fermion transfer between QDs k and k+V that form the kth and k+Vth coupling junctions between Majorana islands K and K+V. In such examples, the corresponding operator applied by the fermion transfer is one of the following operators:

$$\gamma_{k_{K+1}} \gamma_{k+1_{K+1}} \gamma_{k+1_{K+2}} \cdots \gamma_{k+V_{K+V}}$$

$$\text{or } \gamma_{k_K} \gamma_{k-1_K} \gamma_{k-1_{K-1}} \cdots \gamma_{k+V_{K+V+1}}$$

The above operators are equivalent, up to a difference of sign, after the projection operator is applied to the state of the N-Majorana-island system.

Figure 11A:
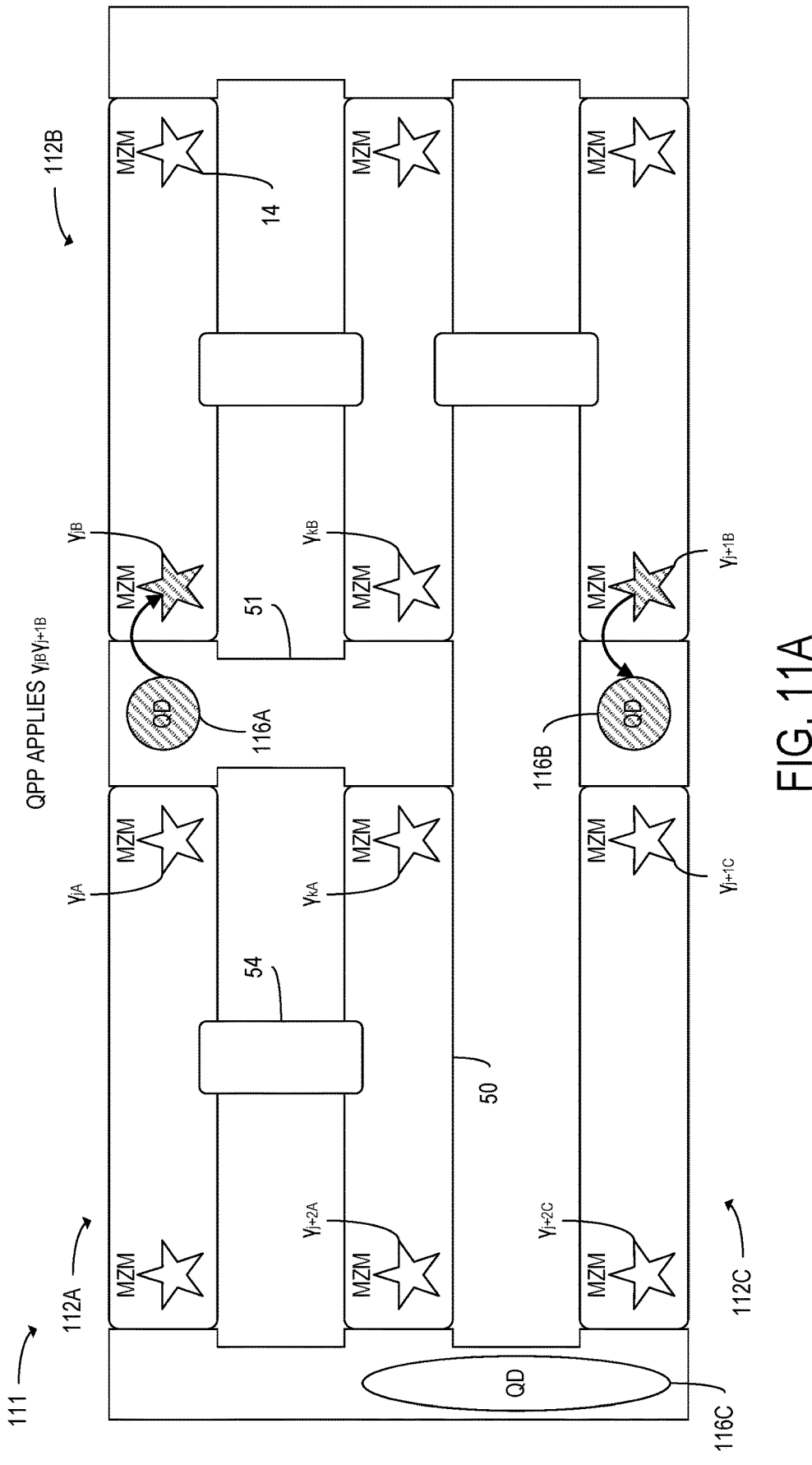
FIGS. 11A-11D show examples of quasiparticle poisoning between Majorana zero modes and quantum dots of included in the island-dot system of FIGS. 10A-10C.
Figure 11B:
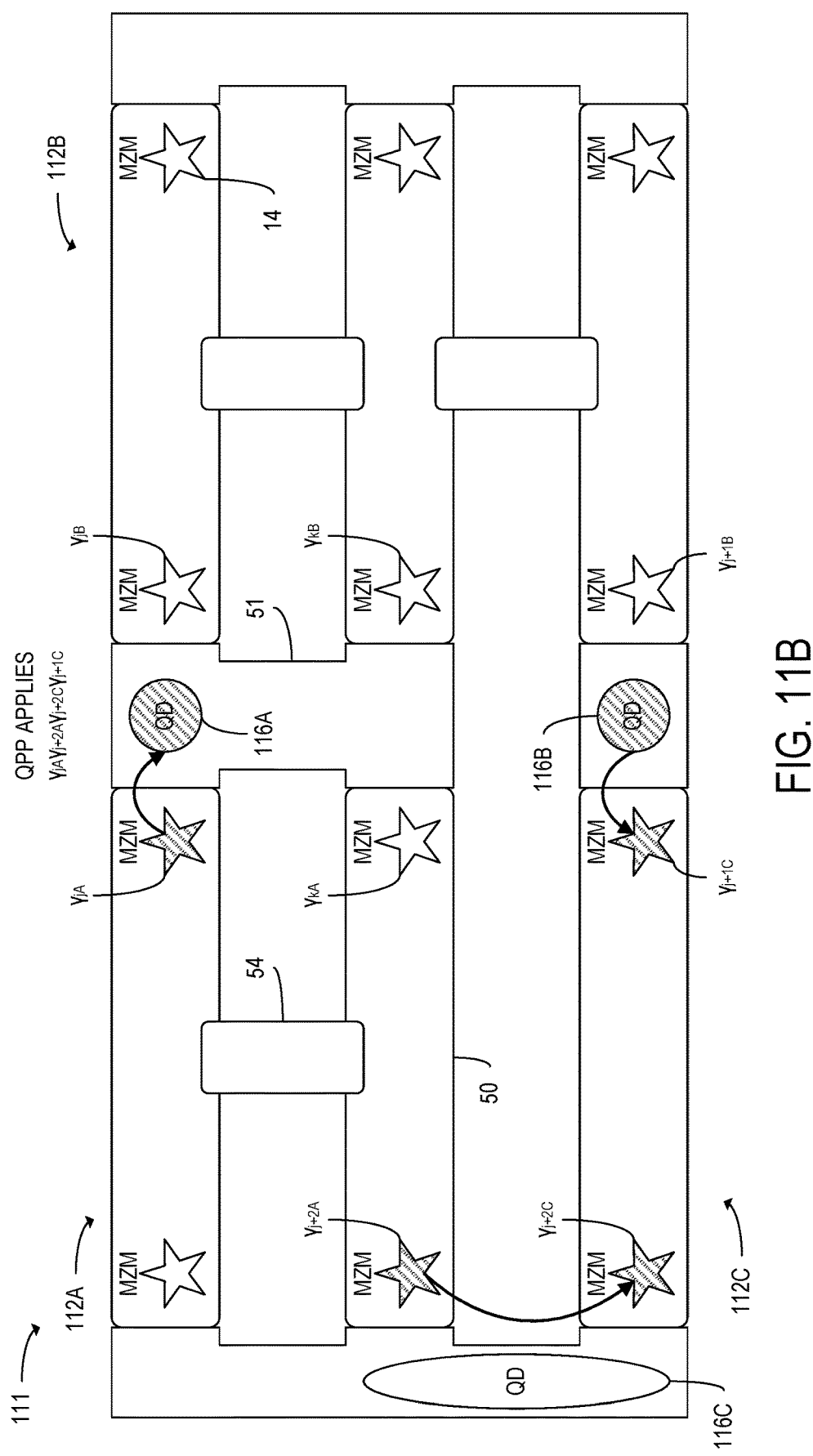

FIGS. 11A-11B show examples of QPP between QDs 16 at the island-dot system 111 of FIG. 10A. In these examples, a fermion is transferred from the first QD 116A to the second QD 116B. In the example of FIG. 11A, QPP occurs between the first QD 116A and the MZM $\gamma_{j_B}$, as well as between the MZM $\gamma_{j+1_B}$ and the second QD 116B. This QPP applies the operator $\gamma_{j_B} \gamma_{j+1_B}$ to the quantum state of the island-dot system 111. In the example of FIG. 11B, QPP occurs between the MZM $\gamma_{j_A}$ and the first QD 116A, between the second QD 116B and the MZM $\gamma_{j+1_C}$, and between the MZM $\gamma_{j+2_A}$ and the MZM $\gamma_{j+2_C}$. This QPP applies the operator $\gamma_{j_A} \gamma_{j+2_A} \gamma_{j+2_C} \gamma_{j+1_C}$.

Figure 11C:
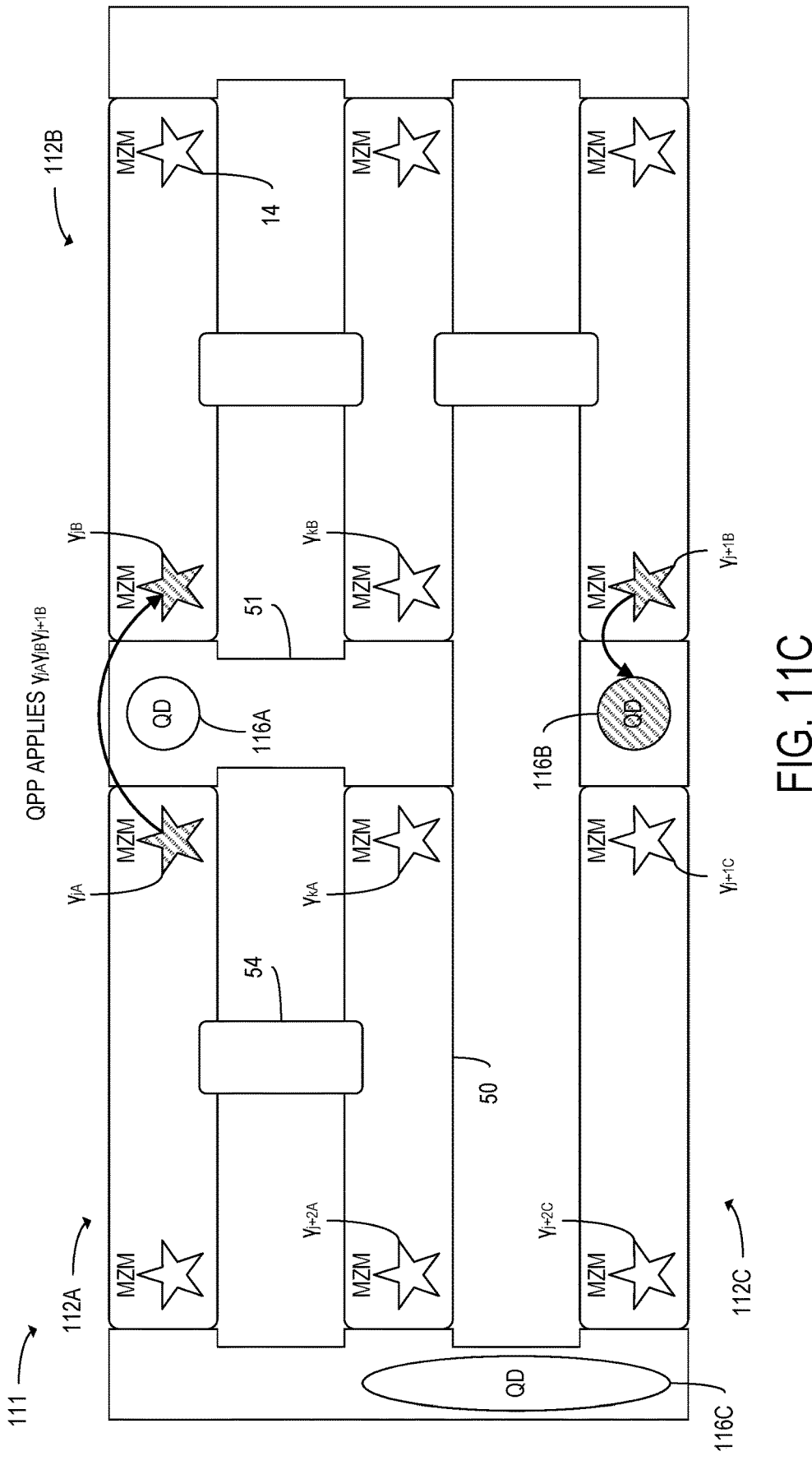
Figure 11D:
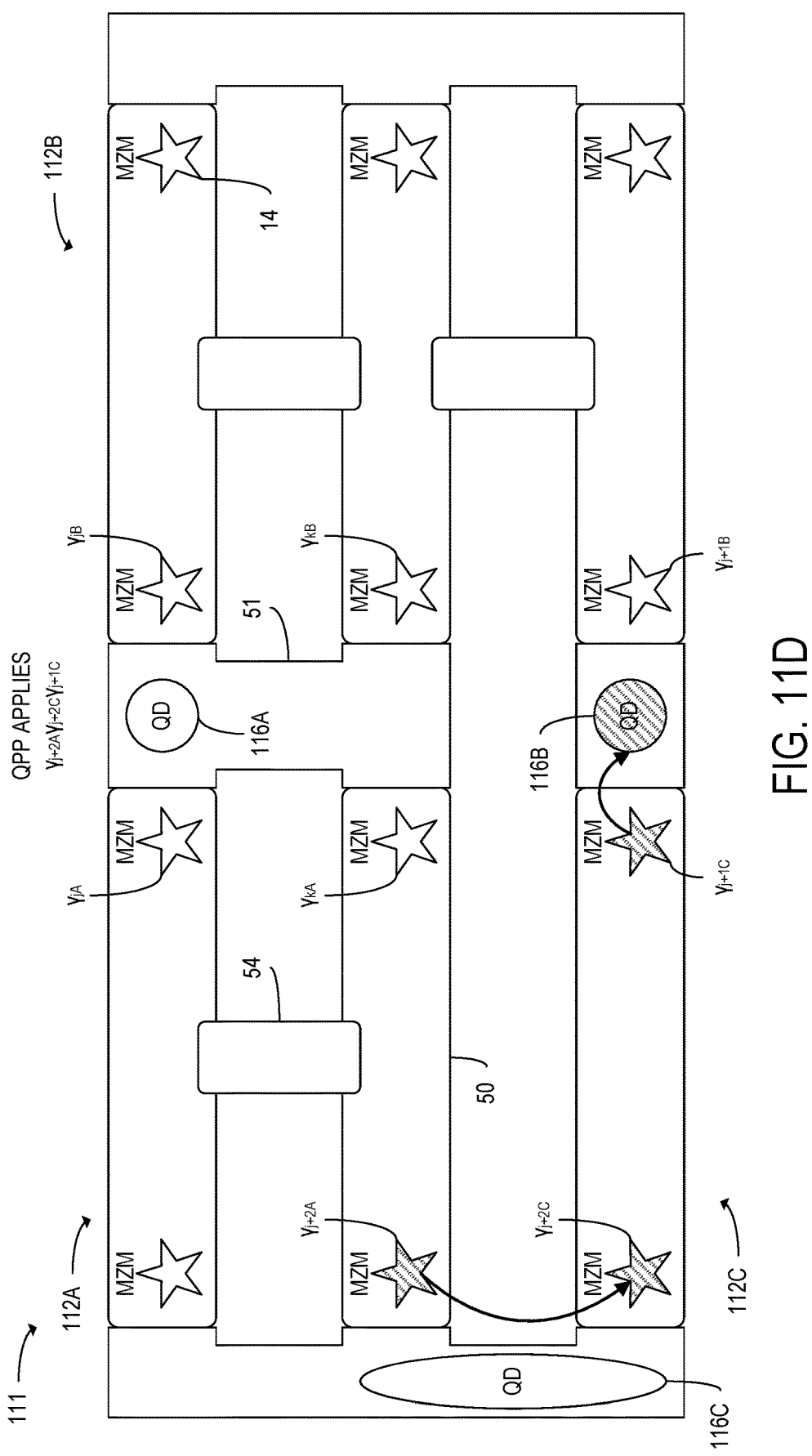

FIGS. 11C-11D show examples of QPP between a Majorana island 12 and a QD 16 at the island-dot system 111 of FIG. 10A. A fermion is transferred from the Majorana tetron 112A to the second QD 116B in the examples of FIGS. 11C-11D. In the example of FIG. 11C, QPP occurs between the MZM $\gamma_{j_A}$ and the MZM $\gamma_{j_B}$, as well as between the MZM $\gamma_{j+1_B}$ and the second QD 116B. This QPP applies the operator $\gamma_{j_A} \gamma_{j_B} \gamma_{j+1_B}$. In the example of FIG. 11D, QPP occurs between the MZM $\gamma_{j+2_A}$ and the MZM $\gamma_{j+2_C}$, as well as between the MZM $\gamma_{j+1_C}$ and the second QD 116B. This QPP applies the operator $\gamma_{j+2_A} \gamma_{j+2_C} \gamma_{j+1_C}$.

Mappings between the Majorana operators associated with the MZMs 14 of a Majorana tetron to the Pauli operators 84 are provided below. These mappings are as follows when the fermion parity of the Majorana island 12 is a qubit degree of freedom:

$$\gamma_1 = -X_q X_p$$

$$\gamma_2 = Y_q X_p$$

$$\gamma_3 = -Z_q X_p$$

$$\gamma_4 = I_q Y_p$$

In the above equations, the label q corresponds to an encoded topological qubit and the label p corresponds to the island fermion parity.

When the Majorana island 12 is in an idle configuration, interactions between the Majorana island 12 and its environment quickly decohere the even and odd fermion parity subspaces (the +1 and −1 eigenspaces of $Z_p$). Thus, the Majorana island 12 typically does not exhibit coherent superpositions of states with different island parities. The eigenvalue of $Z_p$ may therefore be treated as a classical variable. The $X_p$ and $Y_p$ operators may be treated as island parity flipping operators with no significant distinction between them.

The joint fermion parity operator $-\gamma_1 \gamma_2 \gamma_3 \gamma_4$ may be expressed in terms of Pauli operators 84 as follows:

$$-\gamma_1 \gamma_2 \gamma_3 \gamma_4 = -(-X_q X_p)(Y_q X_p)(-Z_q X_p)(I_q Y_p) = I_q Z_p$$

Pairs of Majorana operators map to Pauli operators 84 of the encoded qubit according to:

$$i\gamma_1 \gamma_2 = i(-X_q X_p)(Y_q X_p) = Z_q I_p$$

$$i\gamma_1 \gamma_3 = i(-X_q X_p)(-Z_q X_p) = Y_q I_p$$

$$i\gamma_1 \gamma_4 = i(-X_q X_p)(I_q Y_p) = X_q Z_p$$

$$i\gamma_2 \gamma_3 = i(Y_q X_p)(-Z_q X_p) = X_q I_p$$

$$i\gamma_2 \gamma_4 = i(Y_q X_p)(I_q Y_p) = -Y_q Z_p$$

$$i\gamma_3 \gamma_4 = i(-Z_q X_p)(I_q Y_p) = Z_q Z_p$$

Accordingly, when the fermion parity of the Majorana island 12 is even:

$$X_q = i\gamma_2 \gamma_3 = i\gamma_1 \gamma_4$$

$$Y_q = i\gamma_1 \gamma_3 = -i\gamma_2 \gamma_4$$

$$Z_q = i\gamma_1 \gamma_2 = i\gamma_3 \gamma_4$$

When the fermion parity of the Majorana island 12 is odd:

$$X_q = i\gamma_2 \gamma_3 = -i\gamma_1 \gamma_4$$

$$Y_q = i\gamma_1 \gamma_3 = i\gamma_2 \gamma_4$$

$$Z_q = i\gamma_1 \gamma_2 = -i\gamma_3 \gamma_4$$

In examples in which Majorana operators of a multi-tetron system are mapped to Pauli operators 84, Jordan-Wigner strings may be used to ensure that the Majorana operators anticommute with each other. For an arbitrary labeling of the Majorana tetrons with integers n=1, . . . , N, the Majorana operators of the nth tetron may be written as follows:

$$\gamma_1^{(n)} = -X_q^{(n)} X_p^{(n)} \prod_{m<n} Z_p^{(m)}$$

$$\gamma_2^{(n)} = Y_q^{(n)} X_p^{(n)} \prod_{m<n} Z_p^{(m)}$$

$$\gamma_3^{(n)} = -Z_q^{(n)} X_p^{(n)} \prod_{m<n} Z_p^{(m)}$$

$$\gamma_4^{(n)} = I_q^{(n)} Y_p^{(n)} \prod_{m<n} Z_p^{(m)}$$

Since the Jordan-Wigner operators have the form $$\prod_{m<n} Z_p^{(m)},$$

and since the p qubits are treated as classical variables, the Jordan-Wigner operators only change the signs of the Majorana operators.

Using the above relationships between QPP events and joint parity measurements 32, and between joint parity measurements 32 and Pauli operators 84, the controller 20 is configured to compute the Pauli operator sequence 88. Thus, the controller 20 is configured to determine the update operation 90 based at least in part on whatever changes in the fermion numbers are detected as having occurred after each of the joint parity measurements 32.

Figure 12A:
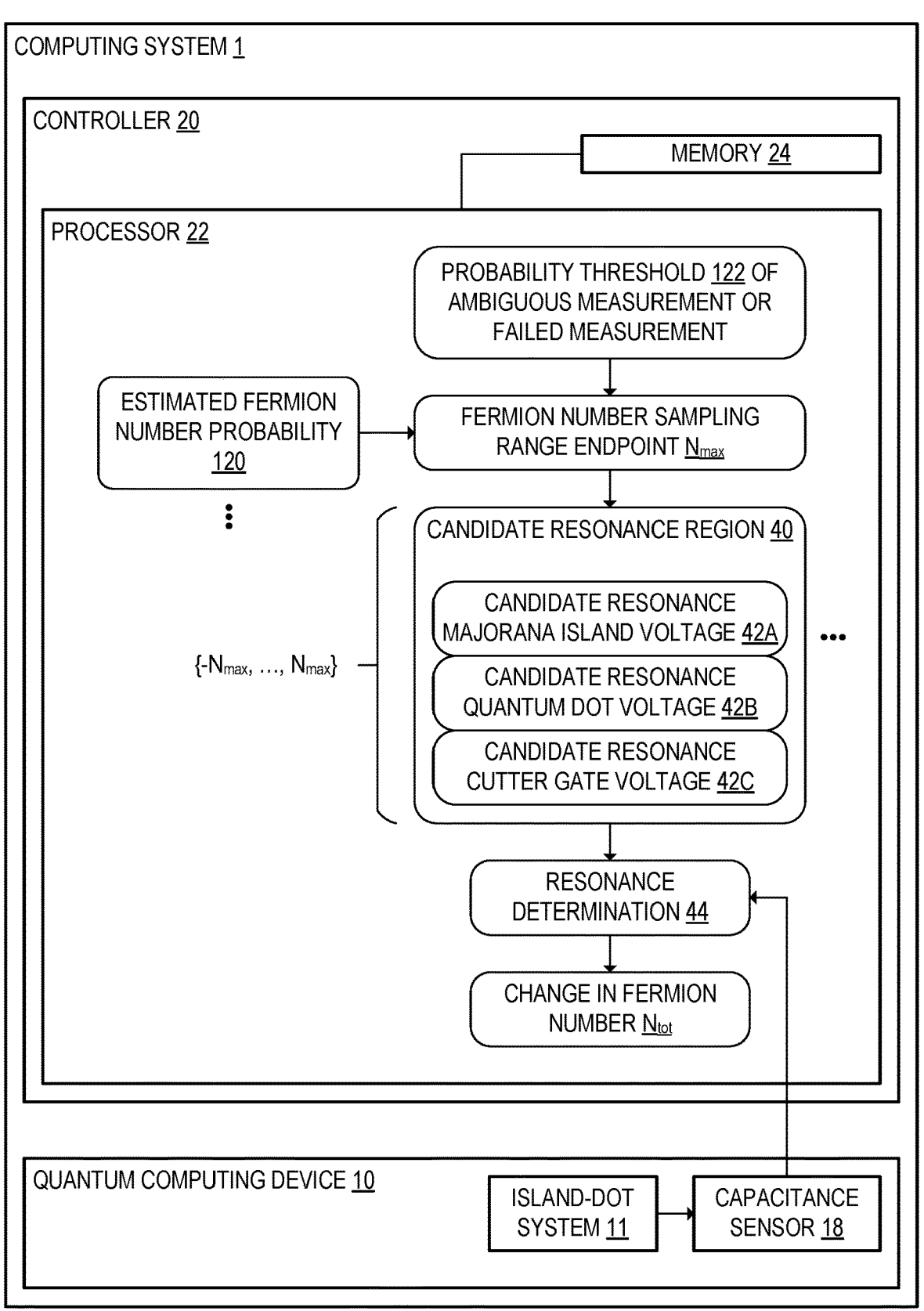
FIG. 12A schematically shows the computing system when the controller is configured to compute a plurality of estimated fermion number probabilities of different values of the change in the fermion number, according to the example of FIG. 1.

FIG. 12A schematically shows the computing system 1 in an example in which the controller 20 is further configured to compute a plurality of estimated fermion number probabilities 120 corresponding to the plurality of candidate values of the change in the fermion number $N_{tot}$. In addition, the controller 20 is further configured to receive a probability threshold 122 of an ambiguous measurement or a failed measurement. An ambiguous measurement is a measurement for which the joint parity value 39 of the two or more MZMs 14 is ambiguous at each of the candidate resonance regions 40. For example, the controller 20 may be configured to determine that a joint parity measurement 32 is an ambiguous measurement when the values of the microwave response signal 57 received at each of the candidate resonance regions 40 are within predetermined confidence intervals associated with both the positive parity response curve 41A and the negative parity response curve 41B. A failed measurement is a measurement that is either an ambiguous measurement or a measurement of an island-dot system 11 at which QD poisoning has occurred. The probability threshold 122 may, for example, be a parameter set via user input.

The controller 20, in the example of FIG. 12A, is further configured to select the number of candidate resonance regions 40 based at least in part on the estimated fermion number probabilities 120 and the probability threshold 122. For example, the controller 20 may be configured to select a fermion number sampling range endpoint $N_{max}$, and the controller 20 may be further configured to test for changes in the fermion number included in the set $\{-N_{max}, -N_{max}+1, \ldots N_{max}\}$. Thus, the number of candidate resonance regions 40 may be equal to $2N_{max}+1$.

Figure 12B:
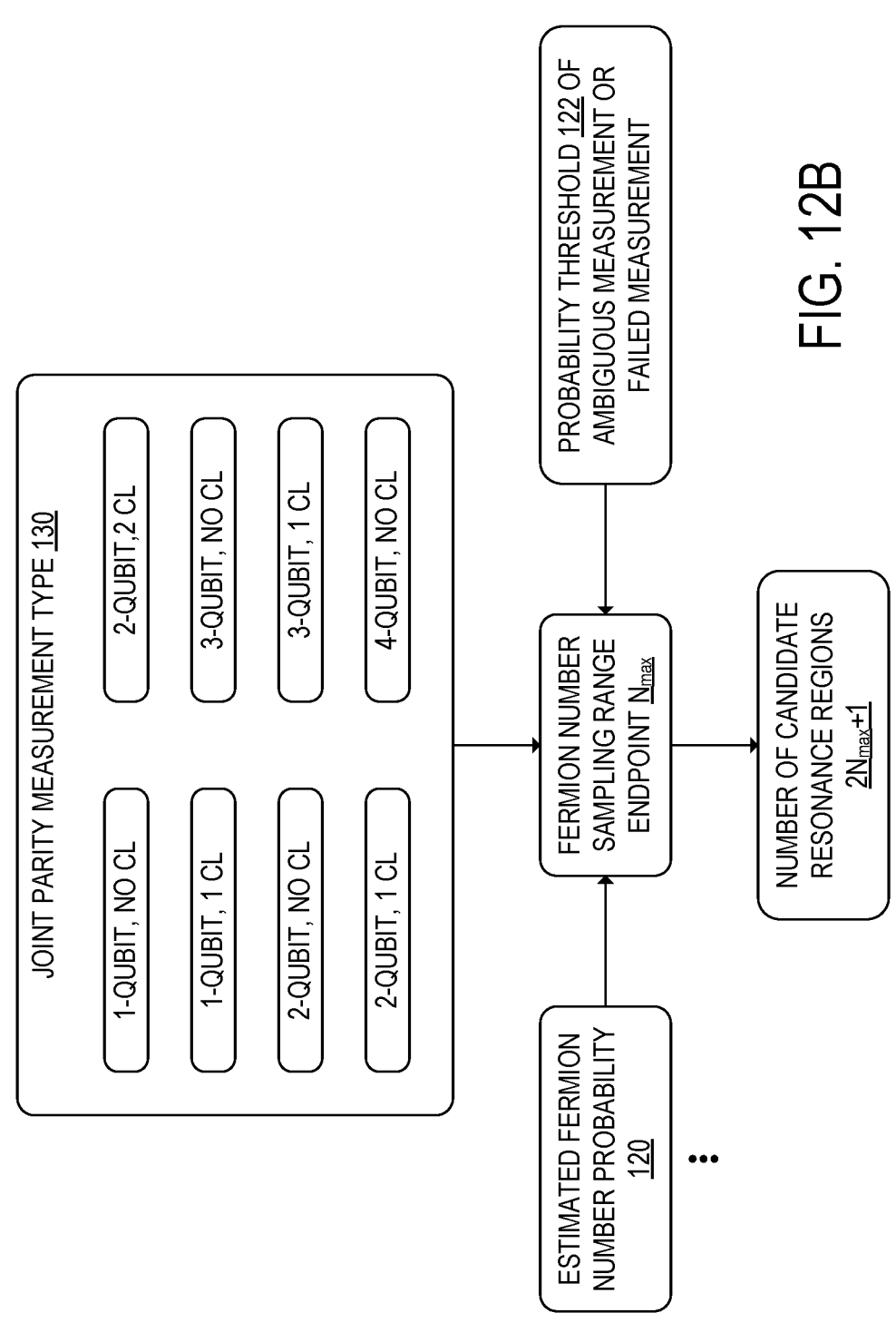
FIG. 12B schematically shows computation of a plurality of candidate resonance regions corresponding to a plurality of joint parity measurement types, according to the example of FIG. 12A.

In some examples, as shown in FIG. 12B, the controller 20 may be further configured to compute a plurality of numbers $2N_{max}+1$ of candidate resonance regions 40 corresponding to a respective plurality of joint parity measurement types 130. Accordingly, the different joint parity measurement types 130 may have different values of $N_{max}$. For example, the plurality of joint parity measurement types 130 may include a one-qubit measurement that does not utilize a coherent link, a one-qubit measurement that utilizes a coherent link, a two-qubit measurement that does not utilize a coherent link, a two-qubit measurement that utilizes a coherent link, a two-qubit measurement that utilizes two coherent links, a three-qubit measurement that does not utilize a coherent link, a three-qubit measurement that utilizes a coherent link, and a four-qubit measurement that does not utilize a coherent link. Each of the values of $N_{max}$ may be computed based at least in part on the estimated fermion number probabilities 120 and the probability threshold 122 of an ambiguous of failed measurement.

When a joint parity measurement 32 is performed subsequently to computing the value of $N_{max}$ for the different joint parity measurement types 130, the controller 20 may be further configured to select the number of candidate resonance regions 40 searched during the joint parity measurement 32. The controller 20 selects the number of candidate resonance regions 40 from among the plurality of numbers $2N_{max}+1$ computed for the different joint parity measurement types 130 as specified by the joint parity measurement type 130 of the joint parity measurement 32.

Computation of the estimated fermion number probabilities 120, as well as probabilities of an ambiguous measurement or a failed measurement, is discussed in additional detail below. Using these probabilities, the processor 22 may be configured to select the value of $N_{max}$ such that the probability of an ambiguous measurement or a failed measurement is below the probability threshold 122. The probability of an ambiguous measurement is given by:

$$p_{amb} = 1 - \sum_{N_{tot} \in \mathcal{I}_{N_{max}}} p_{N_{tot}}$$

In the above equation, $p_{N_{tot}}$ is the probability of the occurrence of a specific integer value of $N_{tot}$, and $\mathcal{I}_{N_{max}} = \{-N_{max}, -N_{max}+1, \ldots N_{max}\}$.

In examples in which the joint parity measurement 32 is a two-MZM measurement that utilizes one Majorana island 12 and one QD 16, a regime with $\varepsilon_C \gg E_C$ is first considered. In this regime, the probability of QD poisoning is treated as negligible. The probability $p_N$ of the Majorana island 12 having a given value of the change in fermion number N may be modeled as a Gibbs distribution:

$$p_N = \frac{e^{-\beta E_C(N-N_g)^2}}{\sum_{M=-\infty}^{\infty} e^{-\beta E_C(M-N_g)^2}}$$

In the above equation, $\beta = 1/k_B T$. The above Gibbs distribution may, for example, provide an accurate model of the probabilities $p_N$ for a plurality of Majorana tetrons implementing a quantum error correction code or quantum computation over a long duration without the use of active feedback to correct for QPP.

The joint parity measurements 32 may be modeled as starting with the Majorana island 12 in an unpoisoned state. In such examples, each of the two-qubit measurements ends with the two Majorana islands 12 used in the measurement having an N-poisoned state. The probability of the two Majorana islands 12 ending the measurement in the N-poisoned state may be approximated as:

$$p_N \approx \frac{e^{-2\beta E_C(N-N_g)^2}}{\sum_{M=-\infty}^{\infty} e^{-2\beta E_C(M-N_g)^2}}$$

The above equation for $p_N$ is equivalent to the equation for $p_N$ in the one-qubit case, except with $\beta$ replaced by $2\beta$.

The following table shows values of $p_{amb}$ computed for various values of $N_{max}$ and $\beta E_C$ in the one-qubit case when $N_g = 0$.

| $\log_{10}(p_{amb})$ | $\beta E_c = 3$ | $\beta E_c = 4$ | $\beta E_c = 5$ | $\beta E_c = 6$ | $\beta E_c = 7$ |
|---|---|---|---|---|---|
| $N_{max} = 0$ | −1.04 | −1.45 | −1.88 | −2.31 | −2.74 |
| $N_{max} = 1$ | −4.95 | −6.66 | −8.39 | −10.1 | −11.9 |
| $N_{max} = 2$ | −11.5 | −15.3 | −19.2 | −23.2 | −27.1 |
| $N_{max} = 3$ | −20.6 | −27.5 | −34.4 | −41.4 | −48.3 |
| $N_{max} = 4$ | −32.3 | −43.1 | −54.0 | −64.8 | −75.7 |

The probability of a failed measurement is considered below in an example in which the probability of QD poisoning is non-negligible. In this example, the following Hamiltonian may be used to model the Majorana island 12 and the QD 16:

$$H(N, n) = E_C(N - N_g)^2 + \varepsilon_C(n - n_g)^2$$

The probability $p_{N_{tot}}$ of measuring a change in fermion number $N_{tot}$ is given by the following Gibbs distribution:

$$p_{N_{tot}} = \frac{\sum_{n \in \mathbb{Z}} e^{-\beta H(N_{tot}-n,n)}}{\sum_{N,n \in \mathbb{Z}} e^{-\beta H(N,n)}}$$

Using the above equation for $p_{N_{tot}}$, the ambiguous measurement probability $p_{amb}$ may be computed as in the case in which the QD poisoning probability is negligible.

To compute the probability $p_{fail}$ of a failed measurement that may be either an ambiguous measurement or a measurement in which QD poisoning occurs, the additional constraint n=0 may be used. Thus, when QD poisoning occurs, resulting in n≠0, the measurement is treated as a failed measurement. The equation for $p_{N_{tot}}$ may accordingly be modified as follows:

$$p'_{N_{tot}} = \frac{e^{-\beta H(N_{tot},0)}}{\sum_{N,n \in \mathbb{Z}} e^{-\beta H(N,n)}}$$

Accordingly, $p_{fail}$ may be computed as:

$$p_{fail} = 1 - \sum_{N_{tot} \in \mathcal{J}_{N_{max}}} p'_{N_{tot}}$$

The probability of an ambiguous measurement at a two-Majorana-island system is considered below in an example in which the probability of QD poisoning is negligible. In this example, Majorana islands labeled A and B may be modeled with the following Hamiltonian:

$$H = E_{C,A}(N_A - N_{g,A})^2 + E_{C,B}(N_B - N_{g,B})^2$$

A Gibbs distribution may be used to approximate the probabilities of configurations of the Majorana islands 12 with different fermion numbers when the Majorana islands 12 are decoupled. When the Majorana islands 12 are decoupled, $N_{g,A}$ and $N_{g,B}$ have idle values of approximately zero. The partition function for a fixed value of $N_{tot}$ is given by:

$$Z_{N_{tot}} = \sum_{\substack{N_A, N_B \in \mathbb{Z} \\ N_A + N_B = N_{tot}}} e^{-\beta H(N_A, N_B)}$$

The total partition function is given by:

$$Z = \sum_{N_{tot} \in \mathbb{Z}} Z_{N_{tot}} = e^{-\beta\left(E_{C,A} N_{g,A}^2 + E_{C,B} N_{g,B}^2\right)} \vartheta(i\lambda_A, -i\lambda_A N_{g,A}) \vartheta(i\lambda_B, -i\lambda_B N_{g,B})$$

In the above equation, $$\lambda_A = \beta E_{C,A} / \pi$$

$$\lambda_B = \beta E_{C,B} / \pi$$

and $\vartheta$ is the Jacobi theta function, $$\vartheta(z, \tau) = \sum_{n \in \mathbb{Z}} e^{i\pi\tau n^2 + i2\pi nz}$$

From the above Gibbs distribution, the estimated probabilities $p_{N_{tot}}$ may be computed as:

$$p_{N_{tot}} = \frac{Z_{N_{tot}}}{Z}$$

When $N_{g,A}=N_{g,B}=0$, corresponding to the idle configuration of the Majorana islands 12, the probability $p_{amb}$ of an ambiguous measurement outcome may be computed. The following table lists values of $p_{amb}$ corresponding to various values of $N_{max}$ when $E_{C,A}=E_{C,B}=E_C$. These values of $E_{C,A}$ and $E_{C,B}$ correspond to a two-qubit Pauli measurement performed on two Majorana tetrons and no coherent links.

| $\log_{10}(p_{amb})$ | $\beta E_c = 3$ | $\beta E_c = 4$ | $\beta E_c = 5$ | $\beta E_c = 6$ | $\beta E_c = 7$ |
|---|---|---|---|---|---|
| $N_{max} = 0$ | −0.773 | −1.16 | −1.58 | −2.01 | −2.44 |
| $N_{max} = 1$ | −2.38 | −3.20 | −4.05 | −4.91 | −5.78 |
| $N_{max} = 2$ | −5.99 | −8.12 | −10.3 | −12.4 | −14.6 |
| $N_{max} = 3$ | −10.2 | −13.6 | −17.1 | −20.5 | −24.0 |
| $N_{max} = 4$ | −16.4 | −22.0 | −27.6 | −33.3 | −38.9 |
| $N_{max} = 5$ | −23.2 | −31.0 | −38.8 | −46.6 | −54.4 |

The following table lists values of $p_{amb}$ corresponding to various values of $N_{max}$ when $$E_{C,A} = \frac{1}{2}E_{C,B} = E_C.$$

These values of $E_{C,A}$ and $E_{C,B}$ correspond to a single-qubit Pauli measurement of one Majorana tetron and one coherent link.

| $\log_{10}(p_{amb})$ | $\beta E_c = 3$ | $\beta E_c = 4$ | $\beta E_c = 5$ | $\beta E_c = 6$ | $\beta E_c = 7$ |
|---|---|---|---|---|---|
| $N_{max} = 0$ | −1.02 | −1.44 | −1.87 | −2.31 | −2.74 |
| $N_{max} = 1$ | −3.63 | −4.92 | −6.22 | −7.52 | −8.82 |
| $N_{max} = 2$ | −7.56 | −10.1 | −12.7 | −15.3 | −17.9 |
| $N_{max} = 3$ | −14.1 | −18.8 | −23.6 | −28.4 | −33.1 |
| $N_{max} = 4$ | −21.9 | −29.2 | −36.6 | −44.0 | −51.4 |
| $N_{max} = 5$ | −31.0 | −41.4 | −51.8 | −62.2 | −72.7 |

The probability of a failed measurement is considered below for a two-Majorana-island system in an example in which the probability of QD poisoning is non-negligible. In this example, the two-Majorana-island system may be modeled with the following Hamiltonian:

$$H =$$

$$E_{C,A}(N_A - N_{g,A})^2 + E_{C,B}(N_B - N_{g,B})^2 + \varepsilon_{C,1}(n_1 - n_{g,1})^2 + \varepsilon_{C,2}(n_2 - n_{g,2})^2$$

The partition function for a fixed value of $N_{tot}$ is given by:

$$Z_{N_{tot}} = \sum_{\substack{N_A, N_B, n_1 \in \mathbb{Z} \\ N_A + N_B + n_1 + n_2 = N_{tot}}} e^{-\beta H(N_A, N_B, n_1, n_2)}$$

In addition, the total partition function is given by:

$$Z = \sum_{N_{tot} \in \mathbb{Z}} Z_{N_{tot}}$$

The probabilities $p_{N_{tot}}$ may be computed as in the case in which the QD poisoning probability is negligible. In addition, the ambiguous measurement probability $p_{amb}$ may be computed from the probabilities $p_{N_{tot}}$ as discussed above.

In order to compute a more general probability of measurement failure $p_{fail}$, the additional constraint $n_1 = n_2 = 0$ may be introduced, corresponding to no change in the fermion numbers of the QDs 16. The resulting partition function for a fixed value of $N_{tot}$ is given by:

$$Z_{N_{tot}, n_1, n_2} = \sum_{\substack{N_A, N_B, n_1, n_2 \in \mathbb{Z} \\ N_A + N_B + n_1 + n_2 = N_{tot}}} e^{-\beta H(N_A, N_B, n_1, n_2)}$$

The total partition function is accordingly given by:

$$Z = \sum_{N_{tot}, n_1, n_2 \in \mathbb{Z}} Z_{N_{tot}, n_1, n_2}$$

In addition, the equation for $p_{N_{tot}}$ may be modified as follows:

$$p'_{N_{tot}} = \frac{Z_{N_{tot}, 0, 0}}{Z}$$

The failure probability $p_{fail}$ may be computed from $$p'_{N_{tot}}$$

as discussed above in the one-Majorana-island example.

Figure 13A:
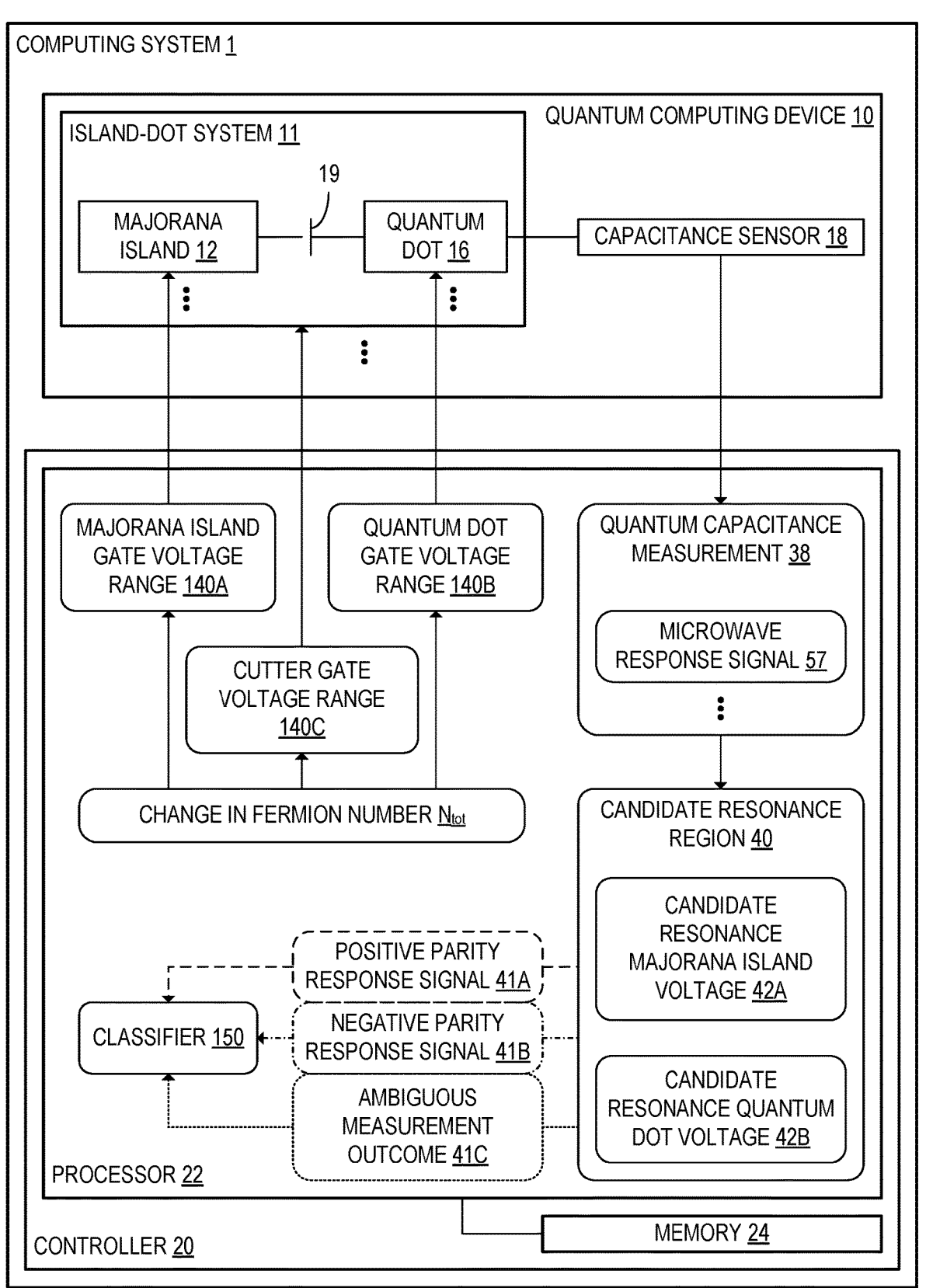
FIG. 13A schematically shows the computing system during a calibration phase in which the controller is configured to estimate the plurality of candidate resonance regions, according to the example of FIG. 5.

FIG. 13A schematically shows the computing system 1 during a calibration phase for a given joint parity measurement 32 in which the controller 20 is configured to estimate the plurality of candidate resonance regions 40 and calibrate a classifier 150 to classify parity response signals. The calibration phase may include a first stage and a second stage. In the first stage, the controller 20 may be configured to locate each candidate resonance region 40 for $N_{tot} \in \{-N\_max, \ldots, N\_max\}$ at least in part by tuning the quantum dot gate voltages $n_g$ and Majorana island gate voltages $N_g$ of the one or more QDs 16 and the one or more Majorana islands 12 used in the joint parity measurement 32. The controller 20 may be configured to tune the Majorana island gate voltages $N_g$, the quantum dot gate voltages $n_g$, and the cutter gate voltages $n_{cg}$ to values located within a Majorana island gate voltage range 140A, a quantum dot gate voltage range 140B, and a cutter gate voltage range 140C, which are the ranges of voltages over which the controller 20 searches for the candidate resonance regions 40.

The second stage may include, for each value of the total fermion number $N_{tot} \in \{-N_{max}, N_{max}\}$, extracting the positive parity response curve 41A and the negative parity response curve 41B at each candidate resonance region 40. The positive parity response curve 41A and the negative parity response curve 41B may then be used as the expected response signals with which the classifier of the joint parity measurement 32 is calibrated. Extracting these response signals may further include tuning cutter gate voltages to increase the measurement visibility.

Figure 13B:
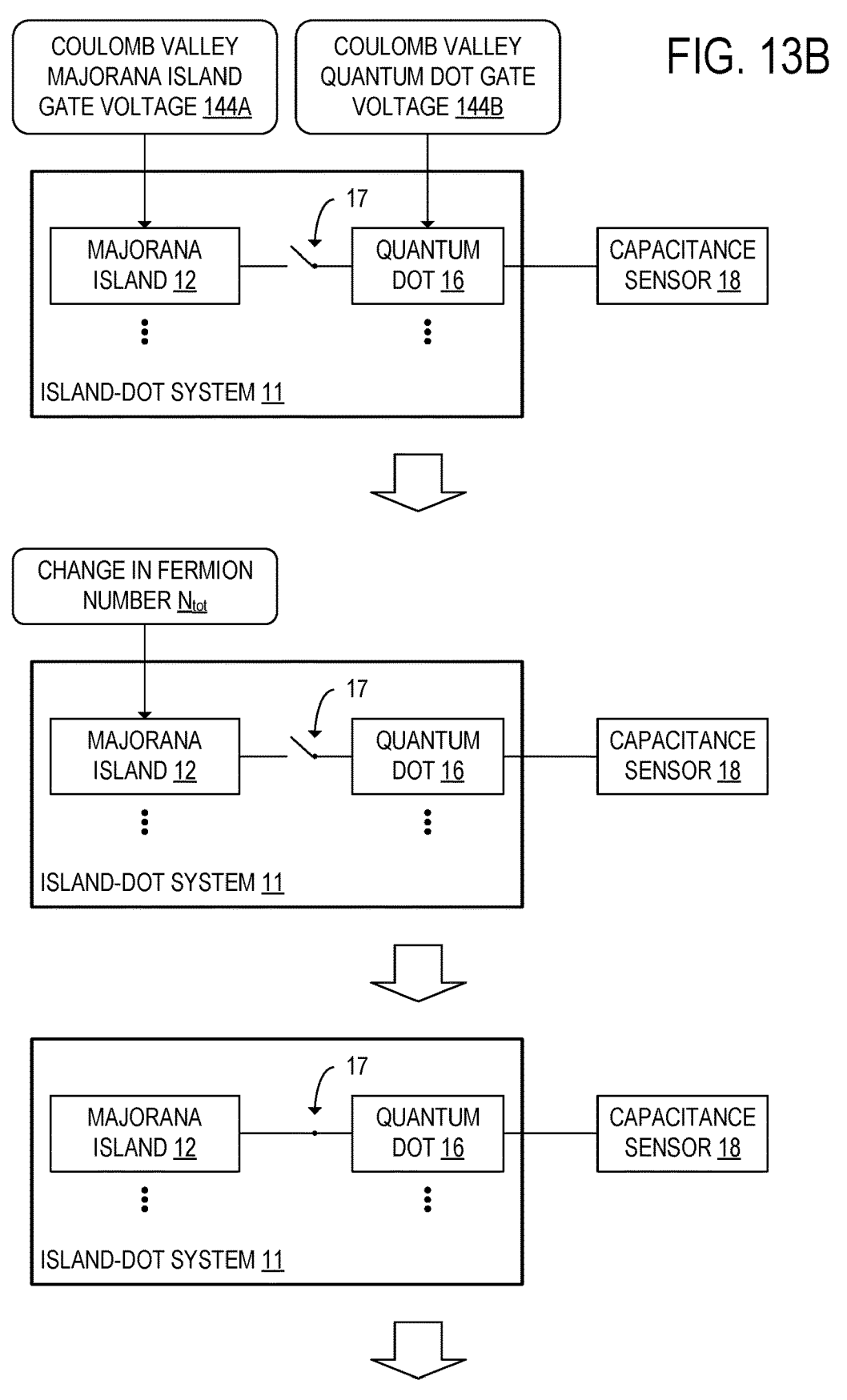
FIGS. 13B-13D schematically show the island-dot system during the calibration phase, according to the example of FIG. 13A.
Figure 13C:
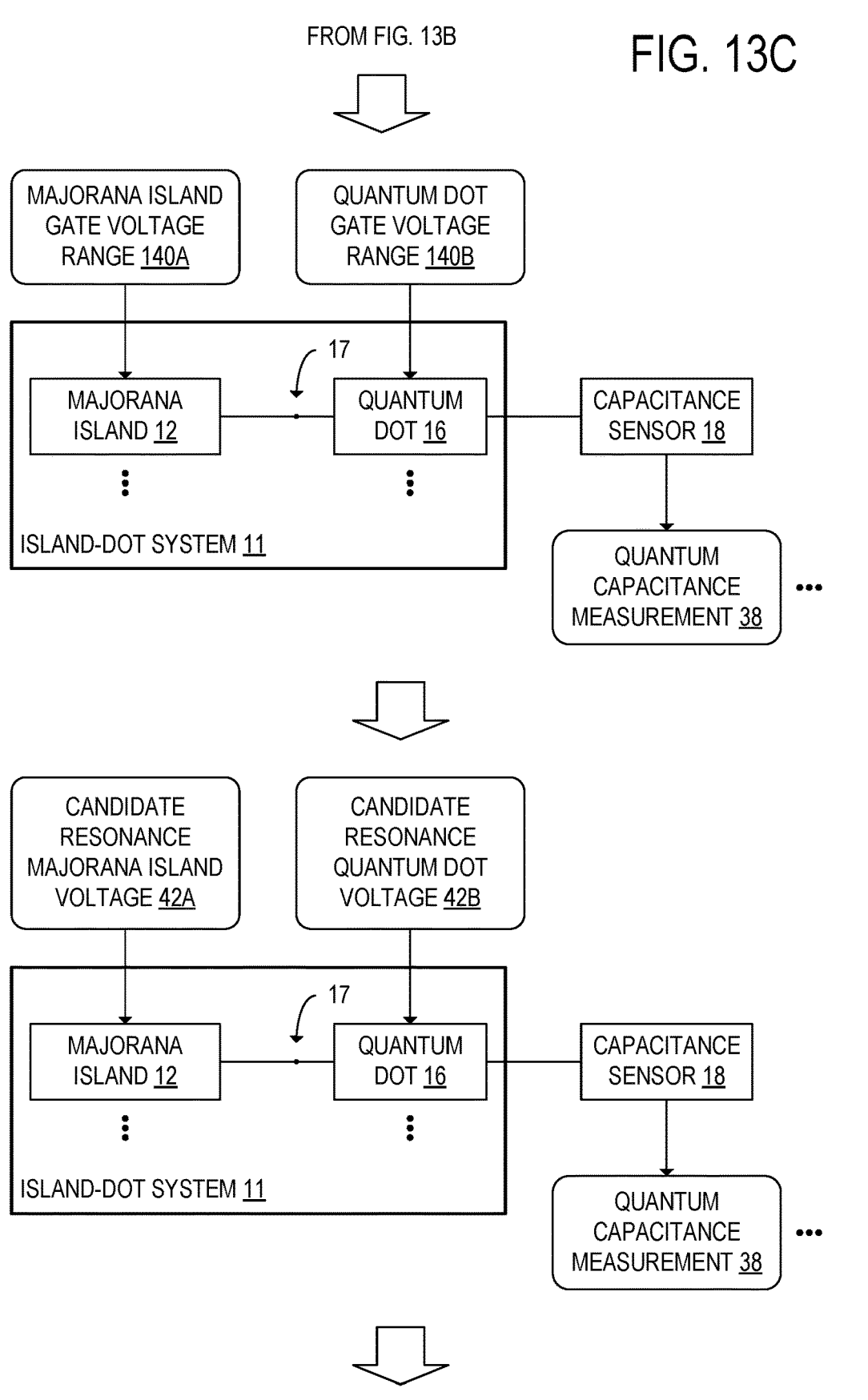
Figure 13D:
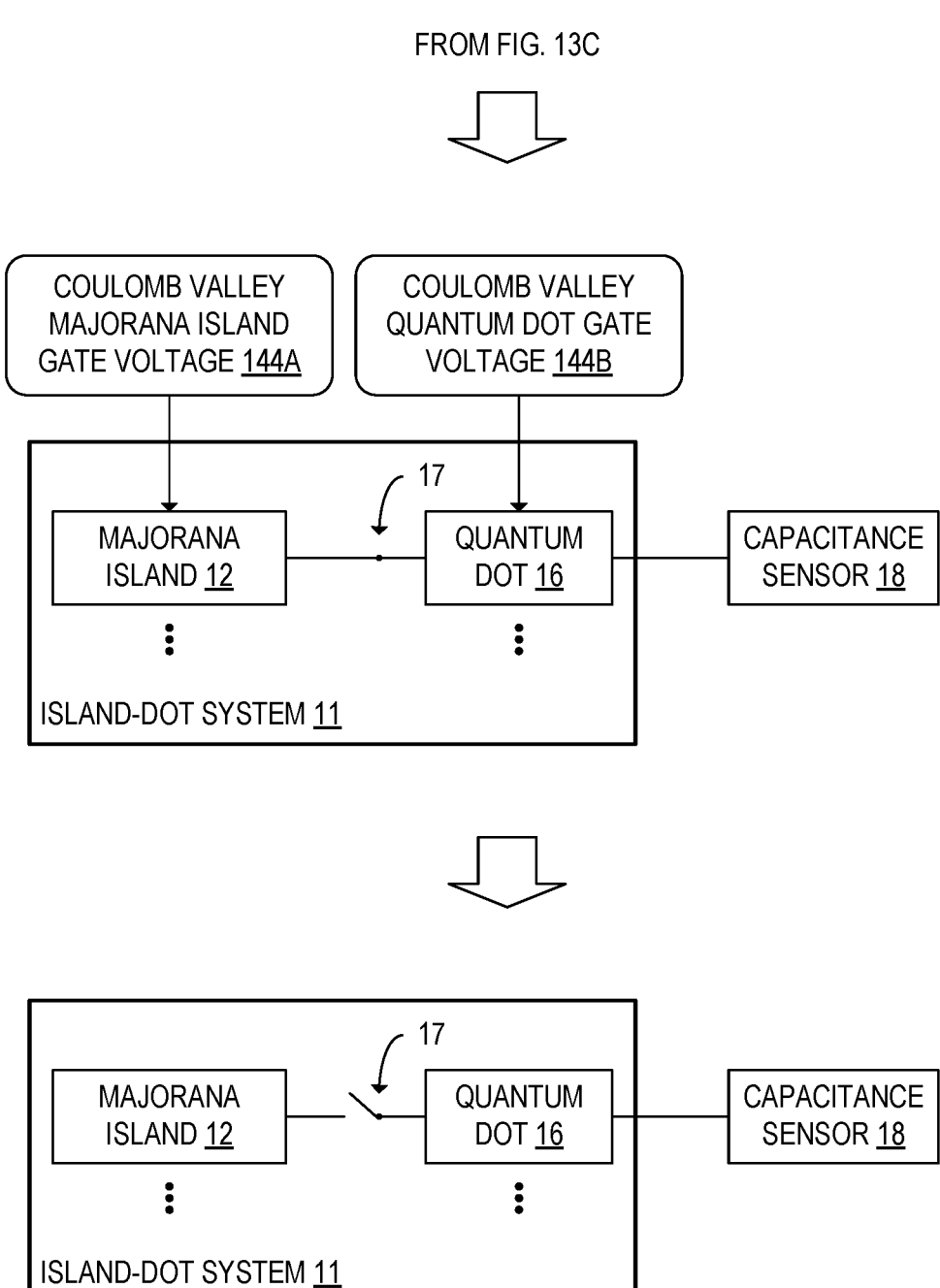

FIGS. 13B-13D show the island-dot system 11 during the calibration phase in additional detail, according to one example. The calibration steps shown in FIGS. 13B-13D may be performed for each of the plurality of values of the changes in the fermion number $N_{tot} \in \{-N_{max}, N_{max}\}$ such that the classifier 150 is configured to determine a positive parity response signal 41A and a negative parity response signal 41B at each candidate resonance region 40. As shown in FIG. 13B, the controller 20 may be configured to control the quantum computing device 10 to initialize the one or more Majorana island gate voltages $N_g$ and the one or more quantum dot gate voltages $n_g$ at respective Coulomb valley voltages. The one or more Majorana island gate voltages $N_g$ are each set to a Coulomb valley Majorana island gate voltage 144A and the one or more quantum dot gate voltages $n_g$ are each set to a Coulomb valley quantum dot gate voltage 144B.

The calibration phase may further include setting the change in the fermion number $N_{tot}$ of the island-dot system 11 to the value for which the controller 20 is currently configured to identify the candidate resonance region 40. The change in the fermion number $N_{tot}$ may be set by transferring fermions onto or off the Majorana island 12 via the fermion reservoir 58. The controller 20 may be further configured to electrically couple the two or more MZMs 14 and the one or more QDs 16. In the example of FIG. 13B, the two or more MZMs 14 and the one or more QDs 16 are electrically coupled by closing the switch 17.

As depicted in FIG. 13C, the controller 20 may be further configured to control the quantum computing device 10 to search over the Majorana island gate voltage range 140A, the quantum dot gate voltage range 140B, and the cutter gate voltage range 140C. The search may be performed using the capacitance sensor 18 by iteratively adjusting the Majorana island gate voltage $N_g$ of the one or more Majorana islands 12, the quantum dot gate voltage $n_g$ of the one or more QDs 16, and the cutter gate voltage $n_{cg}$ of the one or more cutter gates 19 based at least in part on quantum capacitance measurements 38. For example, the controller 20 may be configured to use a hill-climbing search algorithm with respect to the Majorana island gate voltage $N_g$, the quantum dot gate voltage $n_g$, and the cutter gate voltage $n_{cg}$ to approximate a parameter-space location of the candidate resonance region 40. During the search, the one or more Majorana islands 12 may each be set to the same Majorana island gate voltage $N_g$, the one or more QDs 16 may each be set to the same quantum dot gate voltage $n_g$, and the one or more cutter gates 19 may each be set to the same cutter gate voltage $n_{cg}$. The controller 20 may be further configured to control the quantum computing device 10 to output a plurality of quantum capacitance measurements 38 of the island-dot system 11 in ranges that include the candidate resonance gate voltages 42A, 42B, and 42C. The controller 20 may be further configured to compute the positive parity response signal 41A, the negative parity response signal 41B, and the ambiguous measurement outcome 41C from the plurality of quantum capacitance measurements 38 to thereby calibrate the classifier 150.

As shown in FIG. 13D, subsequently to identifying the candidate resonance region 40 and outputting the quantum capacitance measurements 38 at the candidate resonance region 40, the controller 20 may be further configured to control the quantum computing device 10 to reset the one or more Majorana island gate voltages $N_g$ and the one or more quantum dot gate voltages $n_g$ to the respective Coulomb valley voltages 144A and 144B. In addition, the controller 20 may be further configured to control the quantum computing device 10 to electrically decouple the two or more MZMs 14 and the one or more QDs 16. Accordingly, the controller 20 may prepare the island-dot system 11 for identification of one or more additional candidate resonance regions 40.

The calibration phase may include identifying respective candidate resonance regions 40 for each of a plurality of $N_{tot}$ values, as discussed above. At each of the values of the change in the fermion number $N_{tot}$, the controller 20 may be further configured to control the quantum computing device 10 to output a respective plurality of quantum capacitance measurements 38 of the island-dot system 11 at each of the candidate resonance values 42A, 42B, and 42C of the Majorana island gate voltage $N_g$, the quantum dot gate voltage $n_g$, and the cutter gate voltage $n_{cg}$, including values of the gate voltages $N_g$ and $n_g$ that correspond to other candidate resonance regions 40. Thus, the controller 20 may be configured to identify a plurality of off-resonance values of the quantum capacitance for each of the (parity, $N_{tot}$) pairs.

FIG. 14A shows a flowchart of a method 200 for use with a computing system that includes a quantum computing device and a controller. The quantum computing device is a topological quantum computing device that includes a plurality of Majorana islands at which a plurality of MZMs are instantiated. Each Majorana island of the plurality of Majorana islands may be a coherent link, a Majorana tetron, or a Majorana hexon. The quantum computing device further includes a plurality of quantum dots located proximate to the plurality of Majorana islands, as well as a plurality of capacitance sensors configured to perform quantum capacitance measurements of the Majorana islands and quantum dots. The controller is a classical computing device including a processor and memory. Using the method 200 of FIG. 14A, joint parity measurements of MZMs may be performed even in the presence of QPP.

At step 202, the method 200 includes controlling the quantum computing device to perform a joint parity measurement of two or more MZMs of the plurality of MZMs located in the one or more Majorana islands. Step 202 is performed at the controller for an island-dot system that includes one or more Majorana islands of the plurality of Majorana islands and one or more quantum dots of the plurality of quantum dots.

The flowchart depicted in FIG. 14A further shows additional steps that are performed at the controller when the joint parity measurement is performed. At step 204, step 202 includes electrically coupling the two or more MZMs via the one or more quantum dots. Accordingly, a measurement loop that includes the two or more MZMs and the one or more quantum dots may be formed.

Steps 206 and 208 are performed at each of a plurality of candidate resonance regions corresponding to a plurality of values of a change in a fermion number of the island-dot system. The candidate resonance regions are regions of a parameter space defined in terms of Majorana island gate voltage and QD gate voltage. The candidate resonance regions may further include adjusting one or more cutter gate voltages identified during calibration to increase the measurement visibility. The change in the fermion number is a total number of fermions (e.g., electrons) that move between Majorana islands and/or QDs included in the island-dot system during the QPP event. For example, the one or more candidate resonance regions may correspond to a set of values of the change in the fermion number of the island-dot system selected from the group consisting of {−3, −2, −1, 0, 1, 2, 3}, {−2, −1, 0, 1, 2}, and {−1, 0, 1}.

At step 206, step 202 further includes setting one or more corresponding Majorana island gate voltages of the one or more Majorana islands and one or more corresponding quantum dot gate voltages of the one or more QDs to respective candidate resonance values. The candidate resonance values are values of the Majorana island gate voltage and QD gate voltage located within the candidate resonance region.

At step 208, step 202 further includes, via a capacitance sensor of the plurality of capacitance sensors, detecting a microwave response signal measured at the island-dot system. The response signal is measured at step 208 by collecting one or more quantum capacitance measurements of the island-dot system via a capacitance sensor of the plurality of capacitance sensors that is located proximate to the island-dot system. In some examples, the quantum capacitance may be measured at ranges of values of the Majorana island gate voltage and the quantum dot gate voltage located within the candidate resonance region.

At step 210, the step 202 further includes decoupling the two or more MZMs from the one or more quantum dots subsequently to detecting whether resonance occurs. After the microwave response signal is measured at each of the plurality of candidate resonance regions, step 202 further includes, at step 212, outputting a joint parity value of the two or more MZMs based at least in part on the microwave response signal. The joint parity value is a positive parity value, a negative parity value, or an ambiguous measurement outcome. Step 212 may include, at step 214, classifying the microwave response signal as a positive parity response signal, a negative parity response signal, or an ambiguous measurement outcome. The positive parity response signal and the negative parity response signal may be estimated during a calibration phase for different values of the change in the fermion number. By measuring the joint fermion parity of the one or more Majorana islands, the quantum computing device performs a step of a quantum computation or error correction code.

Figure 14B:
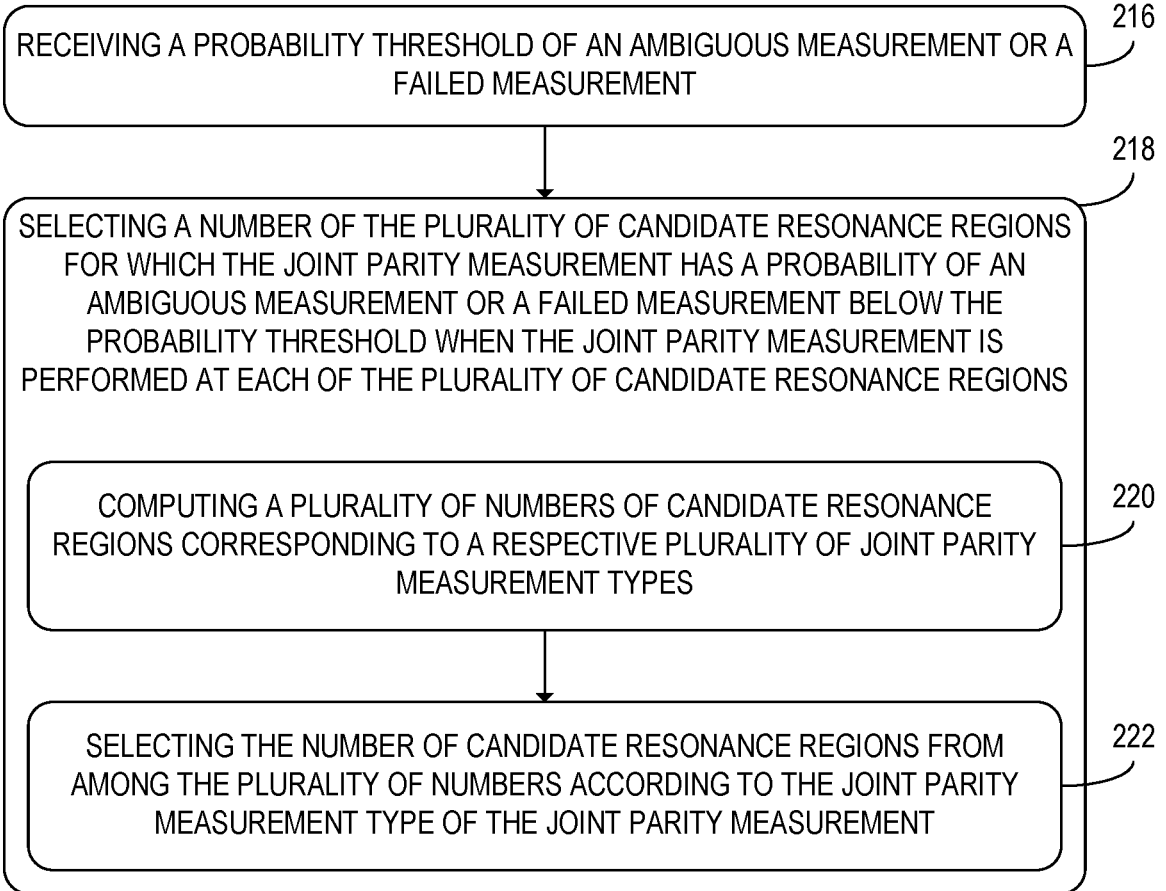
FIG. 14B shows additional steps of the method of FIG. 14A that may be performed in some examples to select a number of the plurality of candidate resonance regions.

FIG. 14B shows additional steps that may be performed in some examples in which the method 200 of FIG. 14A is performed. The steps of FIG. 14B may be performed prior to step 202. At step 216, the method 200 may further include receiving a probability threshold of an ambiguous measurement or a failed measurement. For example, the controller may receive the probability threshold via user input. At step 218, the method 200 may further include selecting a number of the plurality of candidate resonance regions. The number of candidate resonance regions may be selected such that the joint parity measurement has a probability of an ambiguous measurement or a failed measurement below the probability threshold when the joint parity measurement is performed at each of the plurality of candidate resonance regions.

When performing step 218, the method 200 may further include, at step 220, computing a plurality of numbers of candidate resonance regions corresponding to a respective plurality of joint parity measurement types. At step 222, step 218 may further include selecting the number of candidate resonance regions from among the plurality of numbers according to the joint parity measurement type of the joint parity measurement. The plurality of joint parity measurement types may, for example, include a one-qubit measurement that does not utilize a coherent link, a one-qubit measurement that utilizes a coherent link, a two-qubit measurement that does not utilize a coherent link, a two-qubit measurement that utilizes a coherent link, a two-qubit measurement that utilizes two coherent links, a three-qubit measurement that does not utilize a coherent link, a three-qubit measurement that utilizes a coherent link, and a four-qubit measurement that does not utilize a coherent link. Respective numbers of candidate resonance regions may also be computed for other measurement types in some examples.

Figure 14C:
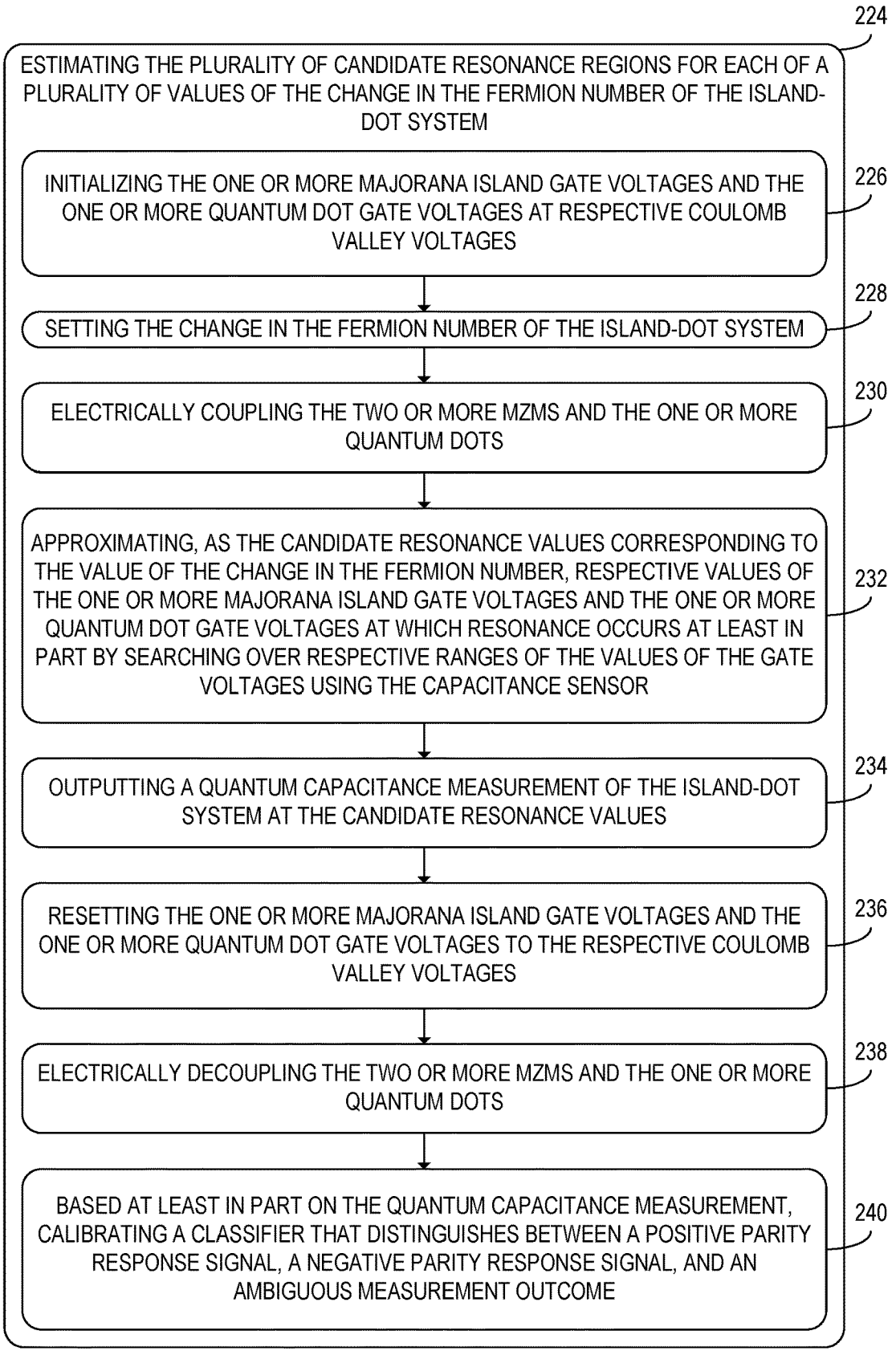
FIG. 14C shows additional steps of the method of FIG. 14A that may be performed in some examples during a calibration phase.

FIG. 14C shows additional steps of the method 200 that may be performed in some examples during a calibration phase. The calibration phase may be performed prior to step 202. At step 224, as shown in FIG. 14C, the method 200 may further include estimating the plurality of candidate resonance regions for each of the plurality of values of the change in the fermion number of the island-dot system. In addition, the calibration phase may further include identifying a positive parity response signal and a negative parity response signal that correspond to a positive fermionic parity and a negative fermionic parity, respectively.

At step 226, step 224 may include initializing the one or more Majorana island gate voltages of the one or more Majorana islands and the one or more QD gate voltages of the one or more QDs at respective Coulomb valley voltages. Subsequently to setting the one or more Majorana island gate voltages and the one or more QD gate voltages to the Coulomb valley voltages, step 224 may further include, at step 228, setting the change in the fermion number of the island-dot system to the value of the change in the fermion number for which the controller is identifying the candidate resonance region. At step 230, step 224 may further include electrically coupling the two or more MZMs and the one or more QDs.

At step 232, the method 200 may further include approximating, as the candidate resonance values corresponding to the value of the change in the fermion number, respective values of the one or more Majorana island gate voltages and the one or more quantum dot gate voltages at which resonance occurs. The candidate resonance Majorana island gate voltage and the candidate resonance QD gate voltage may be approximated at least in part by searching over respective ranges of the values of the gate voltages using the capacitance sensor.

At step 234, step 224 may further include outputting a quantum capacitance measurement of the island-dot system at the candidate resonance values. In some examples, step 234 may include outputting a plurality of quantum capacitance measurements in ranges of the Majorana island gate voltage and the quantum dot gate voltage that are located in the candidate resonance region.

At step 236, step 224 may further include resetting the one or more Majorana island gate voltages and the one or more QD gate voltages to the respective Coulomb valley voltages. At step 238, step 224 may further include electrically decoupling the two or more MZMs and the one or more QDs. Thus, the island-dot system may be prepared for calibration at another combination of a parity value and a change in fermion number.

At step 240, step 224 may further include calibrating a classifier that distinguishes between a positive parity response signal, a negative parity response signal, and an ambiguous measurement outcome. The classifier may be calibrated based at least in part on the quantum capacitance measurement obtained for a respective candidate resonance region. Thus, the classifier may be calibrated to identify joint fermionic parities at each of the candidate resonance regions.

Figure 15A:
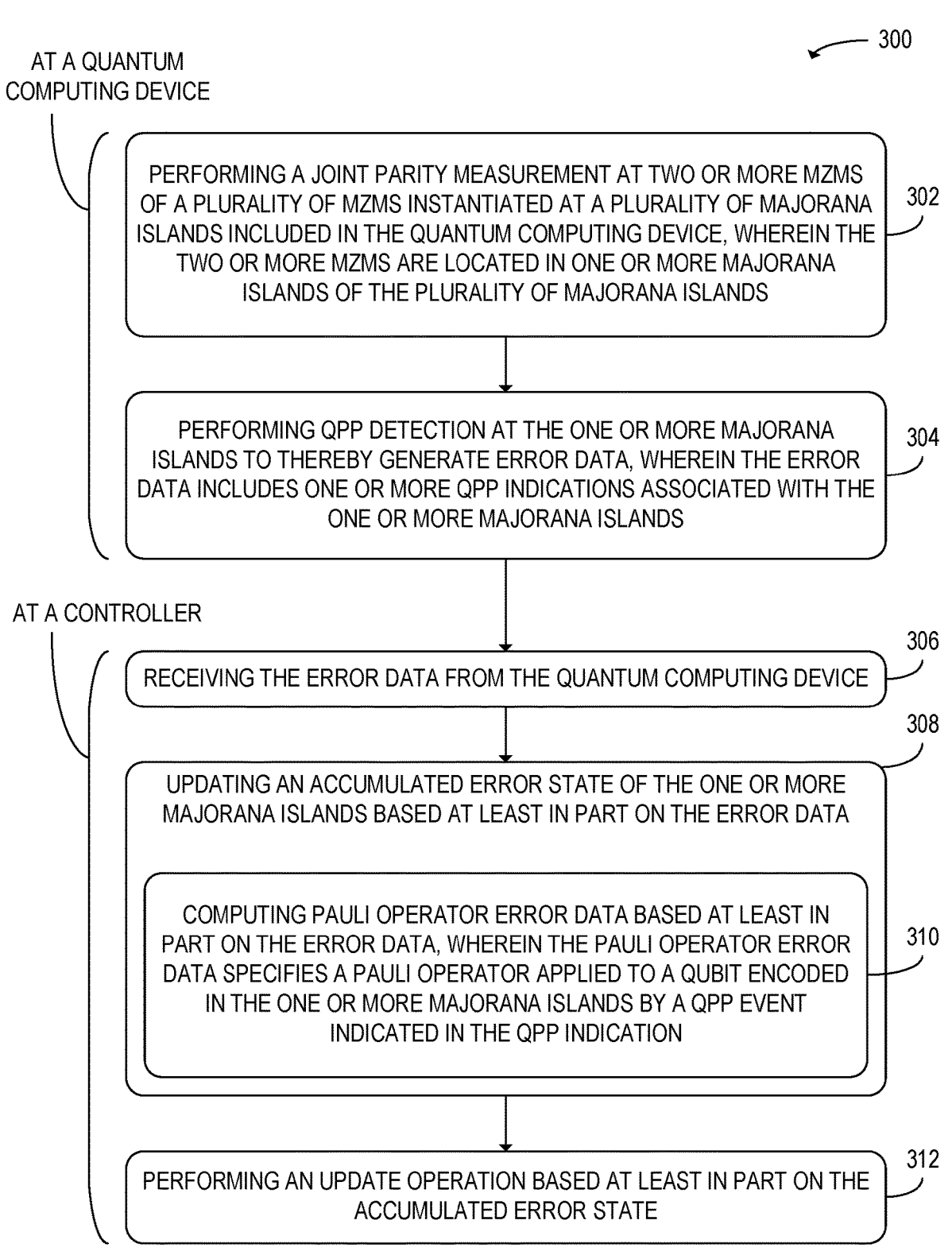
FIG. 15A shows a flowchart of a method that may be used with the computing system to correct for a quasiparticle poisoning error that occurs during a joint parity measurement, according to the example of FIG. 1.

FIG. 15A shows a flowchart of another method 300 that may be used with the computing system that includes the quantum computing device and the controller. Steps 302 and 304, as shown in the example of FIG. 15A, are performed at the quantum computing device. At step 302, the method 300 includes performing a joint parity measurement at two or more MZMs of the plurality of MZMs instantiated at the plurality of Majorana islands included in the quantum computing device. The two or more MZMs are located in one or more Majorana islands of the plurality of Majorana islands. In some examples, the steps of the method 200 of FIG. 14A may be performed when performing step 302.

At step 304, the method 300 may further include performing QPP detection at the one or more Majorana islands to thereby generate error data. Similarly to the joint parity measurement, the QPP detection may be performed using a QD and a capacitance sensor located proximate to the Majorana island. The error data includes one or more QPP indications associated with the one or more Majorana islands, with each of the QPP indications specifying whether QPP occurred at that Majorana island during the joint parity measurement. Each QPP indication may further include a change in one or more respective fermion parities of the one or more Majorana islands at which the joint parity measurement is performed.

Steps 306, 308, 310, and 312 are performed at the controller. At step 306, the method 300 further includes receiving the error data from the quantum computing device. At step 308, the method 300 further includes updating an accumulated error state of the one or more Majorana islands based at least in part on the error data. The accumulated error state may track QPP errors over the plurality of physical timesteps.

In some examples, step 308 may include, at step 310, computing Pauli operator error data based at least in part on the error data. The Pauli operator error data may specify a Pauli operator applied to a qubit encoded in the one or more Majorana islands by a QPP event indicated in the QPP indication. In such examples, the accumulated error state may include a Pauli operator sequence of a plurality of Pauli operators respectively associated with a plurality of joint parity measurements.

At step 312, the method 300 further includes performing an update operation based at least in part on the accumulated error state. As discussed below, the update operation may be a controller-side update operation or a quantum-computing-device-side update operation or an error state tracking operation. The computing system is accordingly configured to adjust for the effects of QPP on a quantum computation or error correction code.

FIG. 15B shows additional steps of the method 300 that may be performed in some examples. At step 314, the method 300 may further include performing a plurality of physical computing timesteps at the quantum computing device during a logical computing timestep. The logical computing timestep may be specified by a quantum code that maps sets of physical-level operations performed on physical qubits to corresponding logical operations performed on logical qubits. The physical computing timesteps may each include a respective joint parity measurement and a respective quasiparticle poisoning detection. By performing the plurality of physical computing timesteps, the quantum computing device may implement a logical-qubit-level gate using a plurality of physical-qubit-level operations.

At step 316, the method 300 may further include performing the update operation at the controller during the logical computing timestep subsequently to the plurality of physical computing timesteps. Accordingly, in the example of FIG. 15B, the update operation is a controller-side update operation. At step 318, step 316 may include, at the controller, receiving a quantum computation output from the quantum computing device subsequently to the plurality of physical computing timesteps. In examples in which step 318 is performed, step 316 may further include, at step 320, correcting the quantum computation output based at least in part on the accumulated error state when performing the update operation. Thus, the update operation may be performed at the end of the logical computing timestep.

FIG. 15C shows additional steps of the method 300 that may be performed in examples in which the update operation is a quantum-computing-device-side update operation. At step 322, the method 300 may further include, at the controller, generating instructions to perform quantum error correction based at least in part on the accumulated error state. At step 324, the method 300 may further include transmitting the instructions to the quantum computing device.

At step 326, the method 300 may further include receiving the instructions at the quantum computing device. The method may further include, at step 328, performing quantum error correction at the one or more Majorana islands based at least in part on the instructions. In some examples, the quantum error correction may be performed subsequently to a physical computing timestep of the plurality of physical computing timesteps that is immediately prior to a non-Clifford logical operation. In such examples, the quantum computing device may avoid having to perform multiple Pauli error correction operations in examples in which multiple QPP events occur during a logical computing timestep.

In some embodiments, the methods and processes described herein may be tied to a computing system of one or more computing devices. In particular, such methods and processes may be implemented as a computer-application program or service, an application-programming interface (API), a library, and/or other computer-program product.

Figure 16:
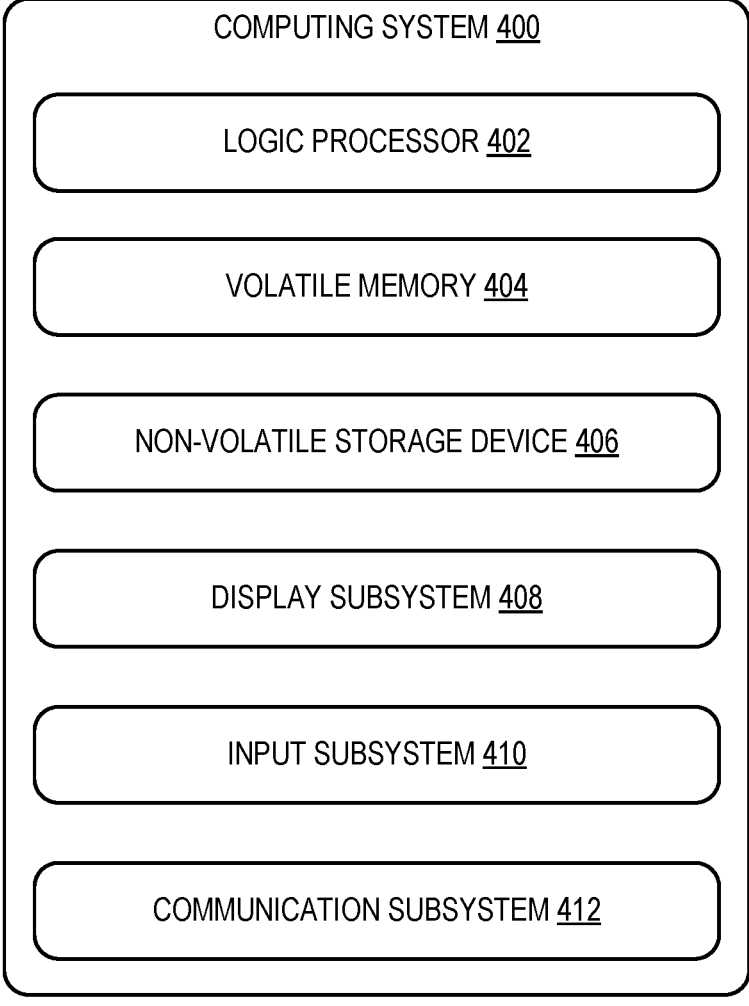
FIG. 16 shows a schematic view of an example computing environment in which the computing system of FIG. 1 may be instantiated.

FIG. 16 schematically shows a non-limiting embodiment of a computing system 400 that can enact one or more of the methods and processes described above. Computing system 400 is shown in simplified form. Computing system 400 may embody the computing system 1 described above and illustrated in FIG. 1. Components of computing system 400 may be included in one or more personal computers, server computers, tablet computers, home-entertainment computers, network computing devices, video game devices, mobile computing devices, mobile communication devices (e.g., smart phone), and/or other computing devices, and wearable computing devices such as smart wristwatches and head mounted augmented reality devices.

Computing system 400 includes a logic processor 402 volatile memory 404, and a non-volatile storage device 406. Computing system 400 may optionally include a display subsystem 408, input subsystem 410, communication subsystem 412, and/or other components not shown in FIG. 16.

Logic processor 402 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 402 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 406 includes one or more physical devices configured to hold instructions executable by the logic processors to implement the methods and processes described herein. When such methods and processes are implemented, the state of non-volatile storage device 406 may be transformed—e.g., to hold different data.

Non-volatile storage device 406 may include physical devices that are removable and/or built-in. Non-volatile storage device 406 may include optical memory, semiconductor memory, and/or magnetic memory, or other mass storage device technology. Non-volatile storage device 406 may include nonvolatile, dynamic, static, read/write, read-only, sequential-access, location-addressable, file-addressable, and/or content-addressable devices. It will be appreciated that non-volatile storage device 406 is configured to hold instructions even when power is cut to the non-volatile storage device 406.

Volatile memory 404 may include physical devices that include random access memory. Volatile memory 404 is typically utilized by logic processor 402 to temporarily store information during processing of software instructions. It will be appreciated that volatile memory 404 typically does not continue to store instructions when power is cut to the volatile memory 404.

Aspects of logic processor 402, volatile memory 404, and non-volatile storage device 406 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 400 typically implemented in software by a processor to perform a particular function using portions of volatile memory, which function involves transformative processing that specially configures the processor to perform the function. Thus, a module, program, or engine may be instantiated via logic processor 402 executing instructions held by non-volatile storage device 406, using portions of volatile memory 404. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 408 may be used to present a visual representation of data held by non-volatile storage device 406. The visual representation may take the form of a graphical user interface (GUI). As the herein described methods and processes change the data held by the non-volatile storage device, and thus transform the state of the non-volatile storage device, the state of display subsystem 408 may likewise be transformed to visually represent changes in the underlying data. Display subsystem 408 may include one or more display devices utilizing virtually any type of technology. Such display devices may be combined with logic processor 402, volatile memory 404, and/or non-volatile storage device 406 in a shared enclosure, or such display devices may be peripheral display devices.

When included, input subsystem 410 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 412 may be configured to communicatively couple various computing devices described herein with each other, and with other devices. Communication subsystem 412 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 400 to send and/or receive messages to and/or from other devices via a network such as the Internet.

The following paragraphs discuss several aspects of the present disclosure. According to one aspect of the present disclosure, a computing system is provided, including a quantum computing device that includes a plurality of Majorana islands at which a plurality of Majorana zero modes (MZMs) are instantiated. The quantum computing device further includes a plurality of quantum dots located proximate to the plurality of Majorana islands. The quantum computing device further includes a plurality of capacitance sensors. The computing system further includes a controller configured to, for an island-dot system including one or more Majorana islands of the plurality of Majorana islands and one or more quantum dots of the plurality of quantum dots, control the quantum computing device to perform a joint parity measurement of two or more MZMs of the plurality of MZMs located in the one or more Majorana islands. Performing the joint parity measurement includes, at each of a plurality of candidate resonance regions corresponding to a plurality of values of a change in a fermion number of the island-dot system, setting one or more corresponding Majorana island gate voltages of the one or more Majorana islands and one or more corresponding quantum dot gate voltages of the one or more quantum dots to respective candidate resonance values located within the candidate resonance region. Performing the joint parity measurement further includes, at each of the candidate resonance regions, via a capacitance sensor of the plurality of capacitance sensors, detecting a microwave response signal measured at the island-dot system. Performing the joint parity measurement further includes, based at least in part on the microwave response signal, outputting a joint parity value of the two or more MZMs. The above features may have the technical effect of performing a joint parity measurement that has sufficient measurement visibility even in the presence of quasiparticle poisoning.

According to this aspect, each Majorana island of the plurality of Majorana islands may be a coherent link, a Majorana tetron, or a Majorana hexon. The above features may have the technical effect of allowing a classical bit or a qubit to be instantiated at each Majorana island.

According to this aspect, performing the joint parity measurement may further include, at each of the plurality of candidate resonance regions, electrically coupling the two or more MZMs via the one or more quantum dots. Subsequently to detecting the microwave response signal, performing the joint parity measurement may further include decoupling the two or more MZMs from the one or more quantum dots. The above features may have the technical effect of electrically isolating the MZMs from the quantum dots subsequently to the joint parity measurement.

According to this aspect, the controller may be configured to determine the joint parity value of the two or more MZMs at least in part by classifying the microwave response signal to a positive parity response signal, a negative parity response, signal or an ambiguous response signal. The above features may have the technical effect of indicating, in the output, the joint parity value and whether sufficient measurement visibility was attained.

According to this aspect, the one or more candidate resonance regions may correspond to a set of values of the change in the fermion number of the island-dot system selected from the group consisting of: $\{-3, -2, -1, 0, 1, 2, 3\}$; $\{-2, -1, 0, 1, 2\}$; and $\{-1, 0, 1\}$. The above features may have the technical effect of checking for distinguishable parity values at the candidate resonance regions that correspond to the highest-probability fermion numbers.

According to this aspect, the controller is further configured to receive a probability threshold of an ambiguous measurement or a failed measurement. The controller may be further configured to select a number of the plurality of candidate resonance regions for which the joint parity measurement has a probability of an ambiguous measurement or a failed measurement below the probability threshold when the joint parity measurement is performed at each of the plurality of candidate resonance regions. The above features may have the technical effect of allowing a user to set the number of candidate resonance regions according to a target rate of ambiguous or failed measurements.

According to this aspect, the controller may be further configured to compute a plurality of numbers of candidate resonance regions corresponding to a respective plurality of joint parity measurement types. The controller may be further configured to select the number of candidate resonance regions from among the plurality of numbers according to the joint parity measurement type of the joint parity measurement. The above features may have the technical effect of allowing the quantum computing device to check for sufficient measurement visibility at different numbers of candidate resonance regions for types of joint parity measurements that have different failed or ambiguous measurement probabilities.

According to this aspect, the plurality of joint parity measurement types may include a one-qubit measurement that does not utilize a coherent link, a one-qubit measurement that utilizes a coherent link, a two-qubit measurement that does not utilize a coherent link, a two-qubit measurement that utilizes a coherent link, a two-qubit measurement that utilizes two coherent links, a three-qubit measurement that does not utilize a coherent link, a three-qubit measurement that utilizes a coherent link, and a four-qubit measurement that does not utilize a coherent link. The above features may have the technical effect of allowing the quantum computing device to check for sufficient measurement visibility at different numbers of candidate resonance regions for types of joint parity measurements that have different failed or ambiguous measurement probabilities.

According to this aspect, the controller may be further configured to estimate the plurality of candidate resonance regions during a calibration phase at least in part by, for each of the plurality of values of the change in the fermion number of the island-dot system, controlling the quantum computing device to set the change in the fermion number of the island-dot system and electrically couple the two or more MZMs and the one or more quantum dots. For each of the values of the change in the fermion number, the controller may be further configured to control the quantum computing device to approximate, as the candidate resonance values corresponding to the value of the change in the fermion number, respective values of the one or more Majorana island gate voltages and the one or more quantum dot gate voltages at which resonance occurs at least in part by searching over respective ranges of the values of the gate voltages using the capacitance sensor. For each of the values of the change in the fermion number, the controller may be further configured to control the quantum computing device to output a quantum capacitance measurement of the island-dot system at the candidate resonance values. The above features may have the technical effect of calibrating the quantum capacitance measurements by identifying the candidate resonance regions.

According to this aspect, for each of the plurality of values of the change in the fermion number, the controller may be further configured to estimate the plurality of candidate resonance regions at least in part by controlling the quantum computing device to initialize the one or more Majorana island gate voltages and the one or more quantum dot gate voltages at respective Coulomb valley voltages prior to setting the change in the fermion number to the value. Subsequently to outputting the quantum capacitance measurement, the controller may be further configured to control the quantum computing device to reset the one or more Majorana island gate voltages and the one or more quantum dot gate voltages to the respective Coulomb valley voltages. The controller may be further configured to control the quantum computing device to electrically decouple the two or more MZMs and the one or more quantum dots. The above features may have the technical effect of preparing the quantum computing device for calibration at another candidate resonance region.

According to this aspect, at each of the values of the change in the fermion number, the controller may be further configured to control the quantum computing device to output a respective quantum capacitance measurement of the island-dot system at each of the candidate resonance values of the Majorana island gate voltage and the quantum dot gate voltage. The above features may have the technical effect of obtaining quantum capacitance measurements at each candidate resonance region for each of the values of the change in the fermion number during the calibration phase.

According to another aspect of the present disclosure, a method for use with a computing system including a quantum computing device and a controller is provided. The quantum computing device includes a plurality of Majorana islands. A plurality of Majorana zero modes (MZMs) are instantiated at each of the Majorana islands. The quantum computing device further includes a plurality of quantum dots located proximate to the plurality of Majorana islands and further includes a plurality of capacitance sensors. The method comprises, at the controller, for an island-dot system including one or more Majorana islands of the plurality of Majorana islands and one or more quantum dots of the plurality of quantum dots, controlling the quantum computing device to perform a joint parity measurement of two or more MZMs of the plurality of MZMs located in the one or more Majorana islands. Performing the joint parity measurement includes, at each of a plurality of candidate resonance regions corresponding to a plurality of values of a change in a fermion number of the island-dot system, setting one or more corresponding Majorana island gate voltages of the one or more Majorana islands and one or more corresponding quantum dot gate voltages of the one or more quantum dots to respective candidate resonance values located within the candidate resonance region. At each of the plurality of candidate resonance regions, performing the joint parity measurement further includes, via a capacitance sensor of the plurality of capacitance sensors, detecting a microwave response signal measured at the island-dot system. Performing the joint parity measurement further includes, based at least in part on the microwave response signal, outputting a joint parity value of the two or more MZMs. The above features may have the technical effect of performing a joint parity measurement that has sufficient measurement visibility even in the presence of quasiparticle poisoning.

According to this aspect, each Majorana island of the plurality of Majorana islands may be a coherent link, a Majorana tetron, or a Majorana hexon. The above features may have the technical effect of allowing a classical bit or a qubit to be instantiated at each Majorana island.

According to this aspect, performing the joint parity measurement may further include, at each of the plurality of candidate resonance regions, electrically coupling the two or more MZMs via the one or more quantum dots. Subsequently to detecting the microwave response signal, performing the joint parity measurement may further include decoupling the two or more MZMs from the one or more quantum dots. The above features may have the technical effect of electrically isolating the MZMs from the quantum dots subsequently to the joint parity measurement.

According to this aspect, performing the joint parity measurement may further include classifying the microwave response signal to a positive parity response signal, a negative parity response signal, or an ambiguous response signal. The above features may have the technical effect of indicating, in the output, the joint parity value and whether sufficient measurement visibility was attained.

According to this aspect, the one or more candidate resonance regions correspond to a set of values of the change in the fermion number of the island-dot system selected from the group consisting of: $\{-3, -2, -1, 0, 1, 2, 3\}$; $\{-2, -1, 0, 1, 2\}$; and $\{-1, 0, 1\}$. The above features may have the technical effect of checking for distinguishable parity values at the candidate resonance regions that correspond to the highest-probability fermion numbers.

According to this aspect, the method may further include receiving a probability threshold of an ambiguous measurement or a failed measurement. The method may further include selecting a number of the plurality of candidate resonance regions for which the joint parity measurement has a probability of an ambiguous measurement or a failed measurement below the probability threshold when the joint parity measurement is performed at each of the plurality of candidate resonance regions. The above features may have the technical effect of allowing a user to set the number of candidate resonance regions according to a target rate of ambiguous or failed measurements.

According to this aspect, the method may further include, at the controller, computing a plurality of numbers of candidate resonance regions corresponding to a respective plurality of joint parity measurement types. The method may further include selecting the number of candidate resonance regions from among the plurality of numbers according to the joint parity measurement type of the joint parity measurement. The plurality of joint parity measurement types may include a one-qubit measurement that does not utilize a coherent link, a one-qubit measurement that utilizes a coherent link, a two-qubit measurement that does not utilize a coherent link, a two-qubit measurement that utilizes a coherent link, a two-qubit measurement that utilizes two coherent links, a three-qubit measurement that does not utilize a coherent link, a three-qubit measurement that utilizes a coherent link, and a four-qubit measurement that does not utilize a coherent link.

According to this aspect, the method may further include estimating the plurality of candidate resonance regions during a calibration phase at least in part by, for each of the plurality of values of the change in the fermion number of the island-dot system, setting the change in the fermion number of the island-dot system. The calibration phase may further include, for each of the values of the change in the fermion number, electrically coupling the two or more MZMs and the one or more quantum dots. The calibration phase may further include approximating, as the candidate resonance values corresponding to the value of the change in the fermion number, respective values of the one or more Majorana island gate voltages and the one or more quantum dot gate voltages at which resonance occurs at least in part by searching over respective ranges of the values of the gate voltages using the capacitance sensor. The calibration phase may further include, for each of the values of the change in the fermion number, outputting a quantum capacitance measurement of the island-dot system at the candidate resonance values.

According to another aspect of the present disclosure, a computing system is provided, including a quantum computing device. The quantum computing device includes a plurality of Majorana islands at which a plurality of Majorana zero modes (MZMs) are instantiated. The quantum computing device further includes a plurality of quantum dots located proximate to the plurality of Majorana islands and further includes a plurality of capacitance sensors. The computing system further includes a controller configured to, for an island-dot system including one or more Majorana islands of the plurality of Majorana islands and one or more quantum dots of the plurality of quantum dots, control the quantum computing device to perform a joint parity measurement of two or more MZMs of the plurality of MZMs located in the one or more Majorana islands. Performing the joint parity measurement includes, at each of a plurality of candidate resonance regions corresponding to a plurality of values of a change in a fermion number of the island-dot system and further corresponding to a respective plurality of joint parity measurement types, electrically coupling the two or more MZMs via the one or more quantum dots. Performing the joint parity measurement further includes setting one or more corresponding Majorana island gate voltages of the one or more Majorana islands and one or more corresponding quantum dot gate voltages of the one or more quantum dots to respective candidate resonance values located within the candidate resonance region. Via a capacitance sensor of the plurality of capacitance sensors, performing the joint parity measurement further includes detecting a microwave response signal measured at the island-dot system. Subsequently to detecting the microwave response signal, performing the joint parity measurement further includes decoupling the two or more MZMs from the one or more quantum dots. Based at least in part on the microwave response signal, performing the joint parity measurement further includes outputting a joint parity value of the two or more MZMs. The above features may have the technical effect of performing a joint parity measurement that has sufficient measurement visibility even in the presence of quasiparticle poisoning.

According to another aspect of the present disclosure, a computing system is provided, including a quantum computing device. The quantum computing device includes a plurality of Majorana islands at which a plurality of Majorana zero modes (MZMs) are instantiated. The computing system further includes a controller configured to control the quantum computing device to perform a joint parity measurement at two or more MZMs of the plurality of MZMs. The two or more MZMs are located in one or more Majorana islands of the plurality of Majorana islands. The controller is further configured to control the quantum computing device to perform quasiparticle poisoning (QPP) detection at the one or more Majorana islands to thereby generate error data. The error data includes one or more QPP indications associated with the one or more Majorana islands. The controller is further configured to receive the error data from the quantum computing device and update an accumulated error state of the one or more Majorana islands based at least in part on the error data. The controller is further configured to perform an update operation based at least in part on the accumulated error state. The above features may have the technical effect of tracking and/or correcting a QPP error that occurs during a joint parity measurement.

According to this aspect, during a logical computing timestep of a quantum code, the controller may be configured to control the quantum computing device to perform a plurality of physical computing timesteps that include respective joint parity measurements and quasiparticle poisoning detections. The above features may have the technical effect of constructing a logical qubit from a plurality of physical qubits that are controlled using joint parity measurements.

According to this aspect, during the logical computing timestep, the controller may be further configured to perform the update operation subsequently to the plurality of physical computing timesteps. The above features may have the technical effect of reducing the number of update operations by delaying an update operation until the error state has been accumulated for multiple physical computing timesteps.

According to this aspect, the controller may be further configured to receive a quantum computation output from the quantum computing device subsequently to a plurality of physical computing timesteps. The update operation may include correcting the quantum computation output at the controller based at least in part on the accumulated error state. The above features may have the technical effect of allowing errors due to QPP to be corrected in classical computation instead of at the quantum computing device.

According to this aspect, the update operation may include transmitting, to the quantum computing device, instructions to perform quantum error correction. The controller may be configured to generate the instructions based at least in part on the accumulated error state. The above features may have the technical effect of correcting the QPP error at the quantum computing device.

According to this aspect, the instructions may include instructions to perform the quantum error correction subsequently to a physical computing timestep of the plurality of physical computing timesteps that is immediately prior to a non-Clifford logical operation. The above features may have the technical effect of performing the quantum error correction immediately prior to a logical operation that does not commute with the operations applied to the quantum state by QPP.

According to this aspect, during each of the physical computing timesteps, the controller may be further configured to control the quantum computing device to perform a plurality of joint parity measurements and a corresponding plurality of quasiparticle poisoning detections in parallel. The above features may have the technical effect of increasing the speed of the quantum computation by concurrently performing joint parity measurements at a plurality of island-dot systems and further performing a plurality of QPP detections at those island-dot systems.

According to this aspect, based at least in part on the error data, the controller may be further configured to compute Pauli operator error data. The Pauli operator error data may specify a Pauli operator applied to a qubit encoded in the one or more Majorana islands by a QPP event indicated in the QPP indication. The above features may have the technical effect of tracking a Pauli operator error applied to the qubit by the QPP event.

According to this aspect, the accumulated error state may include a Pauli operator sequence of a plurality of Pauli operators respectively associated with a plurality of joint parity measurements. The above features may have the technical effect of tracking a Pauli operator error applied to the qubit by the QPP event.

According to this aspect, the QPP indication is an indication of a change in one or more respective fermion parities of the one or more Majorana islands at which the joint parity measurement is performed. The above features may have the technical effect of tracking the change in the fermion parities.

According to another aspect of the present disclosure, a method for use with a computing system including a quantum computing device and a controller is provided. The method includes, at the quantum computing device, performing a joint parity measurement at two or more Majorana zero modes (MZMs) of a plurality of MZMs instantiated at a plurality of Majorana islands included in the quantum computing device. The two or more MZMs are located in one or more Majorana islands of the plurality of Majorana islands. The method further includes performing quasiparticle poisoning (QPP) detection at the one or more Majorana islands to thereby generate error data. The error data includes one or more QPP indications associated with the one or more Majorana islands. The method further includes, at the controller, receiving the error data from the quantum computing device and updating an accumulated error state of the one or more Majorana islands based at least in part on the error data. The method further includes performing an update operation based at least in part on the accumulated error state. The above features may have the technical effect of tracking and/or correcting a QPP error that occurs during a joint parity measurement.

According to this aspect, the method may further include, at the quantum computing device, performing a plurality of physical computing timesteps during a logical computing timestep of a quantum code. The physical computing timesteps may each include a respective joint parity measurement and a respective quasiparticle poisoning detection. The above features may have the technical effect of constructing a logical qubit from a plurality of physical qubits that are controlled using joint parity measurements.

According to this aspect, the method may further include, at the controller, performing the update operation during the logical computing timestep subsequently to the plurality of physical computing timesteps. The above features may have the technical effect of reducing the number of update operations by delaying an update operation until the error state has been accumulated for multiple physical computing timesteps.

According to this aspect, the method may further include, at the controller, receiving a quantum computation output from the quantum computing device subsequently to a plurality of physical computing timesteps. When performing the update operation, the method may further include correcting the quantum computation output based at least in part on the accumulated error state. The above features may have the technical effect of allowing errors due to QPP to be corrected in classical computation instead of at the quantum computing device.

According to this aspect, the method may further include, at the controller, generating instructions to perform quantum error correction based at least in part on the accumulated error state. The method may further include transmitting the instructions to the quantum computing device. At the quantum computing device, the method may further include receiving the instructions. The method may further include performing quantum error correction at the one or more Majorana islands based at least in part on the instructions. The above features may have the technical effect of correcting the QPP error at the quantum computing device.

According to this aspect, the quantum error correction may be performed subsequently to a physical computing timestep of the plurality of physical computing timesteps that is immediately prior to a non-Clifford logical operation. The above features may have the technical effect of performing the quantum error correction immediately prior to a logical operation that does not commute with the operations applied to the quantum state by QPP.

According to this aspect, the method may further include computing Pauli operator error data based at least in part on the error data. The Pauli operator error data may specify a Pauli operator applied to a qubit encoded in the one or more Majorana islands by a QPP event indicated in the QPP indication. The above features may have the technical effect of tracking a Pauli operator error applied to the qubit by the QPP event.

According to this aspect, the accumulated error state may include a Pauli operator sequence of a plurality of Pauli operators respectively associated with a plurality of joint parity measurements. The above features may have the technical effect of tracking a Pauli operator error applied to the qubit by the QPP event.

According to this aspect, the QPP indication may be an indication of a change in one or more respective fermion parities of the one or more Majorana islands at which the joint parity measurement is performed. The above features may have the technical effect of tracking the change in the fermion parities.

According to another aspect of the present disclosure, a computing system is provided, including a controller configured to, in each of a plurality of physical computing timesteps included in a logical computing timestep of a quantum code, receive error data from a quantum computing device. The error data includes a plurality of quasiparticle poisoning (QPP) indications associated with a respective plurality of physical qubits instantiated at the quantum computing device. In each of the physical computing timesteps, the controller is further configured to update an accumulated error state of the plurality of physical qubits based at least in part on the error data. Subsequently to the plurality of physical computing timesteps, the controller is further configured to perform an update operation based at least in part on the accumulated error state. The above features may have the technical effect of tracking and/or correcting a QPP error that occurs during a joint parity measurement.

"And/or" as used herein is defined as the inclusive or V, as specified by the following truth table:

| A | B | A $\vee$ B |
|---|---|---|
| True | True | True |
| True | False | True |
| False | True | True |
| False | False | False |

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A computing system comprising:
a quantum computing device including:
a plurality of Majorana islands at which a plurality of Majorana zero modes (MZMs) are instantiated;
a plurality of quantum dots located proximate to the plurality of Majorana islands; and
a plurality of capacitance sensors; and
a controller configured to, for an island-dot system including one or more Majorana islands of the plurality of Majorana islands and one or more quantum dots of the plurality of quantum dots;

receive a probability threshold of an ambiguous measurement or a failed measurement;
select a number of candidate resonance regions for which a joint parity measurement of two or more MZMs of the plurality of MZMs located in the one or more Majorana islands has a probability of an ambiguous measurement or a failed measurement below the probability threshold when the joint parity measurement is performed at each of a plurality of candidate resonance regions, wherein each of the candidate resonance regions corresponds to a value of a change in a fermion number of the island-dot system; and
control the quantum computing device to perform the joint parity measurement at least in part by:
at each of the candidate resonance regions:
setting one or more corresponding Majorana island gate voltages of the one or more Majorana islands and one or more corresponding quantum dot gate voltages of the one or more quantum dots to respective candidate resonance values located within the candidate resonance region; and
via a capacitance sensor of the plurality of capacitance sensors, detecting a microwave response signal measured at the island-dot system; and
based at least in part on the microwave response signal, outputting a joint parity value of the two or more MZMs.

2. The computing system of claim 1, wherein each Majorana island of the plurality of Majorana islands is a coherent link, a Majorana tetron, or a Majorana hexon.

3. The computing system of claim 1, wherein performing the joint parity measurement further includes, at each of the plurality of candidate resonance regions:
electrically coupling the two or more MZMs via the one or more quantum dots; and
subsequently to detecting the microwave response signal, decoupling the two or more MZMs from the one or more quantum dots.

4. The computing system of claim 1, wherein the controller is configured to determine the joint parity value of the two or more MZMs at least in part by classifying the microwave response signal to a positive parity response signal, a negative parity response, signal or an ambiguous response signal.

5. The computing system of claim 1, wherein the one or more candidate resonance regions correspond to a set of values of the change in the fermion number of the island-dot system selected from the group consisting of:
$\{-3, -2, -1, 0, 1, 2, 3\}$;
$\{-2, -1, 0, 1, 2\}$; and
$\{-1, 0, 1\}$.

6. The computing system of claim 1, wherein the controller is further configured to:
compute a plurality of numbers of candidate resonance regions corresponding to a respective plurality of joint parity measurement types; and
select the number of candidate resonance regions from among the plurality of numbers according to the joint parity measurement type of the joint parity measurement.

7. The computing system of claim 6, wherein the plurality of joint parity measurement types include:
a one-qubit measurement that does not utilize a coherent link;
a one-qubit measurement that utilizes a coherent link;

a two-qubit measurement that does not utilize a coherent link;

a two-qubit measurement that utilizes a coherent link;

a two-qubit measurement that utilizes two coherent links;

a three-qubit measurement that does not utilize a coherent link;

a three-qubit measurement that utilizes a coherent link; and a four-qubit measurement that does not utilize a coherent link.

8. The computing system of claim 1, wherein the controller is further configured to estimate the plurality of candidate resonance regions during a calibration phase at least in part by, for each of the plurality of values of the change in the fermion number of the island-dot system, controlling the quantum computing device to:

set the change in the fermion number of the island-dot system;

electrically couple the two or more MZMs and the one or more quantum dots;

approximate, as the candidate resonance values corresponding to the value of the change in the fermion number, respective values of the one or more Majorana island gate voltages and the one or more quantum dot gate voltages at which resonance occurs at least in part by searching over respective ranges of the values of the gate voltages using the capacitance sensor; and output a quantum capacitance measurement of the island-dot system at the candidate resonance values.

9. The computing system of claim 8, wherein, for each of the plurality of values of the change in the fermion number, the controller is further configured to estimate the plurality of candidate resonance regions at least in part by controlling the quantum computing device to:

initialize the one or more Majorana island gate voltages and the one or more quantum dot gate voltages at respective Coulomb valley voltages prior to setting the change in the fermion number to the value; and subsequently to outputting the quantum capacitance measurement:

reset the one or more Majorana island gate voltages and the one or more quantum dot gate voltages to the respective Coulomb valley voltages; and electrically decouple the two or more MZMs and the one or more quantum dots.

10. The computing system of claim 8, wherein, at each of the values of the change in the fermion number, the controller is further configured to control the quantum computing device to output a respective quantum capacitance measurement of the island-dot system at each of the candidate resonance values of the Majorana island gate voltage and the quantum dot gate voltage.

11. A method for use with a computing system including a quantum computing device and a controller, wherein:

the quantum computing device includes:

a plurality of Majorana islands, wherein a plurality of Majorana zero modes (MZMs) are instantiated at each of the Majorana islands;

a plurality of quantum dots located proximate to the plurality of Majorana islands; and a plurality of capacitance sensors; and the method comprises, at the controller, for an island-dot system including one or more Majorana islands of the plurality of Majorana islands and one or more quantum dots of the plurality of quantum dots:

receiving a probability threshold of an ambiguous measurement or a failed measurement;

selecting a number of candidate resonance regions for which a joint parity measurement of two or more MZMs of the plurality of MZMs located in the one or more Majorana islands has a probability of an ambiguous measurement or a failed measurement below the probability threshold when the joint parity measurement is performed at each of a plurality of candidate resonance regions, wherein each of the candidate resonance regions corresponds to a value of a change in a fermion number of the island-dot system; and controlling the quantum computing device to perform the joint parity measurement at least in part by:

at each of the candidate resonance regions:

setting one or more corresponding Majorana island gate voltages of the one or more Majorana islands and one or more corresponding quantum dot gate voltages of the one or more quantum dots to respective candidate resonance values located within the candidate resonance region; and via a capacitance sensor of the plurality of capacitance sensors, detecting a microwave response signal measured at the island-dot system; and based at least in part on the microwave response signal, outputting a joint parity value of the two or more MZMs.

12. The method of claim 11, wherein each Majorana island of the plurality of Majorana islands is a coherent link, a Majorana tetron, or a Majorana hexon.

13. The method of claim 11, wherein performing the joint parity measurement further includes, at each of the plurality of candidate resonance regions:

electrically coupling the two or more MZMs via the one or more quantum dots; and subsequently to detecting the microwave response signal, decoupling the two or more MZMs from the one or more quantum dots.

14. The method of claim 11, wherein performing the joint parity measurement further includes classifying the microwave response signal to a positive parity response signal, a negative parity response signal, or an ambiguous response signal.

15. The method of claim 11, wherein the one or more candidate resonance regions correspond to a set of values of the change in the fermion number of the island-dot system selected from the group consisting of:

$\{-3, -2, -1, 0, 1, 2, 3\}$;

$\{-2, -1, 0, 1, 2\}$; and $\{-1, 0, 1\}$.

16. The method of claim 11, further comprising, at the controller:

computing a plurality of numbers of candidate resonance regions corresponding to a respective plurality of joint parity measurement types; and selecting the number of candidate resonance regions from among the plurality of numbers according to the joint parity measurement type of the joint parity measurement, wherein the plurality of joint parity measurement types include:

a one-qubit measurement that does not utilize a coherent link;

a one-qubit measurement that utilizes a coherent link;

a two-qubit measurement that does not utilize a coherent link;

a two-qubit measurement that utilizes a coherent link;

a two-qubit measurement that utilizes two coherent links;

a three-qubit measurement that does not utilize a coherent link;

a three-qubit measurement that utilizes a coherent link; and a four-qubit measurement that does not utilize a coherent link.

17. The method of claim 11, further comprising estimating the plurality of candidate resonance regions during a calibration phase at least in part by, for each of the plurality of values of the change in the fermion number of the island-dot system:

setting the change in the fermion number of the island-dot system;

electrically coupling the two or more MZMs and the one or more quantum dots;

approximating, as the candidate resonance values corresponding to the value of the change in the fermion number, respective values of the one or more Majorana island gate voltages and the one or more quantum dot gate voltages at which resonance occurs at least in part by searching over respective ranges of the values of the gate voltages using the capacitance sensor; and outputting a quantum capacitance measurement of the island-dot system at the candidate resonance values.

18. A computing system comprising:

a quantum computing device including:

a plurality of Majorana islands at which a plurality of Majorana zero modes (MZMs) are instantiated;

a plurality of quantum dots located proximate to the plurality of Majorana islands; and a plurality of capacitance sensors; and a controller configured to, for an island-dot system including one or more Majorana islands of the plurality of Majorana islands and one or more quantum dots of the plurality of quantum dots;

receive a probability threshold of an ambiguous measurement or a failed measurement;

select a number of candidate resonance regions for which a joint parity measurement of two or more MZMs of the plurality of MZMs located in the one or more Majorana islands has a probability of an ambiguous measurement or a failed measurement below the probability threshold when the joint parity measurement is performed at each of a plurality of candidate resonance regions, wherein each of the candidate resonance regions corresponds to a value of a change in a fermion number of the island-dot system and further corresponds to a respective joint parity measurement type; and control the quantum computing device to perform the joint parity measurement at least in part by:

at each of the candidate resonance regions:

electrically coupling the two or more MZMs via the one or more quantum dots;

setting one or more corresponding Majorana island gate voltages of the one or more Majorana islands and one or more corresponding quantum dot gate voltages of the one or more quantum dots to respective candidate resonance values located within the candidate resonance region;

via a capacitance sensor of the plurality of capacitance sensors, detecting a microwave response signal measured at the island-dot system; and subsequently to detecting the microwave response signal, decoupling the two or more MZMs from the one or more quantum dots; and based at least in part on the microwave response signal, outputting a joint parity value of the two or more MZMs.

* * * * *